(12) United States Patent
Seki et al.

(10) Patent No.: US 6,259,629 B1
(45) Date of Patent: *Jul. 10, 2001

(54) NONVOLATILE SEMICONDUCTOR MEMORY DEVICE

(75) Inventors: Koichi Seki, Hino; Takeshi Wada, Akishima; Tadashi Muto, Iruma; Kazuyoshi Shoji; Yasurou Kubota, both of Akishima; Hitoshi Kume, Musashino, all of (JP)

(73) Assignees: Hitachi, Ltd.; Hitachi ULSI Engineering Corp., both of Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/425,041

(22) Filed: Oct. 19, 1999

Related U.S. Application Data

(63) Continuation of application No. 08/720,060, filed on Sep. 27, 1996, now Pat. No. 6,016,273, which is a continuation of application No. 08/456,797, filed on Jun. 1, 1995, now Pat. No. 5,781,476, which is a continuation of application No. 08/249,899, filed on May 26, 1994, now Pat. No. 5,844,842, which is a continuation-in-part of application No. 08/144,500, filed on Nov. 2, 1993, now abandoned, which is a continuation of application No. 07/474,994, filed on Feb. 5, 1990, now abandoned, which is a continuation-in-part of application No. 07/888,447, filed on May 28, 1992, now abandoned, which is a continuation of application No. 07/567,391, filed on Aug. 14, 1990, now abandoned.

(30) Foreign Application Priority Data

| Feb. 6, 1989 | (JP) | 1-27271 |
| Aug. 15, 1989 | (JP) | 1-210262 |
| Sep. 20, 1989 | (JP) | 1-243603 |
| Dec. 8, 1989 | (JP) | 1-317477 |
| Jan. 25, 1990 | (JP) | 2-13614 |

(51) Int. Cl.[7] .................................................. G11C 11/34
(52) U.S. Cl. ............................... 365/185.22; 365/185.18
(58) Field of Search ........................ 365/185.24, 185.29, 365/185.22, 185.18; 257/316, 336

(56) References Cited

U.S. PATENT DOCUMENTS 4,203,158  5/1980  Frohman-Bentchkowsky et al. ........... 365/185

(List continued on next page.)

FOREIGN PATENT DOCUMENTS 2028615   3/1980   (GB).

(List continued on next page.)

OTHER PUBLICATIONS

S. Haddad et al., "Degradations Due to Hole Trapping in Flash Memory Cells", IEEE Electron Device Letters, vol. 10, No. 3, pp. 117–119, Mar. 1989.

(List continued on next page.)

*Primary Examiner*—A. Zarabian
(74) *Attorney, Agent, or Firm*—Antonelli, Terry, Stout & Kraus, LLP

(57) ABSTRACT

Within an EEPROM having a memory array in which the electrically erasable nonvolatile storage elements are arranged in a matrix form, an erasing control circuit is included, which performs at least the read out operation one time on the corresponding memory cells after an erasing operation is performed in connection therewith in accordance with externally supplied erasing operation instructions. The erasing operation is automatically performed by the internal erasing control circuit while the EEPROM is electrically isolated from the microprocessor in response to instructions from the microprocessor. The control by the microprocessor requires only a slightly short period of time during which the erasing commencement is instructed while the EEPROM remains in the system during the erasing operation. In one aspect of the present invention, a Vcc power source is applied to a source region or a drain region of each nonvolatile semiconductor memory cell, and an erasure voltage having a polarity opposite to that of the Vcc power source is applied to a control gate electrode. The erasure voltage is supplied to a voltage conversion circuit provided within the nonvolatile memory device. Accordingly, erasure operation can be realized by the Vcc single power source. Further, substantial terminals of the collective erasure operation are individually controlled for every memory element or every collective memory element in response to the individual erasure speed of each memory element.

12 Claims, 56 Drawing Sheets

U.S. PATENT DOCUMENTS

| | | | |
|---|---|---|---|
| 4,266,283 | 5/1981 | Perlegos et al. | 365/185.02 |
| 4,279,024 | 7/1981 | Schrenk | 365/203 |
| 4,291,388 | 9/1981 | Ecker | 364/900 |
| 4,376,947 | 3/1983 | Chin et al. | 257/336 |
| 4,412,309 | 10/1983 | Kuo | 365/184 |
| 4,437,174 | 3/1984 | Masuoka | 365/218 |
| 4,460,982 | 7/1984 | Gee et al. | 365/185.19 |
| 4,661,833 | 4/1987 | Mizutani | 365/185 |
| 4,698,750 | 10/1987 | Wilkie et al. | 365/185.04 |
| 4,698,787 | 10/1987 | Mukherjee et al. | 365/185 |
| 4,742,492 | 5/1988 | Smayling et al. | 365/218 |
| 4,758,986 | 7/1988 | Kuo | 365/185 |
| 4,763,305 | 8/1988 | Kuo | 365/200 |
| 4,797,856 | 1/1989 | Lee et al. | 365/185 |
| 4,805,151 | 2/1989 | Terada et al. | 365/189 |
| 4,811,294 | 3/1989 | Kobayashi et al. | 365/185.22 |
| 4,878,203 | 10/1989 | Arakawa | 365/185 |
| 4,888,734 | 12/1989 | Lee et al. | 365/185 |
| 4,924,437 | 5/1990 | Paterson et al. | 365/185 |
| 4,939,690 | 7/1990 | Momodomi et al. | 365/185 |
| 4,949,309 | 8/1990 | Rao | 365/218 |
| 4,958,317 | 9/1990 | Terada et al. | 365/185 |
| 4,958,321 | 9/1990 | Chang | 365/185 |
| 4,998,220 | 3/1991 | Eitan et al. | 365/185 |
| 5,032,881 | 7/1991 | Sardo et al. | 365/185 |
| 5,034,922 | 7/1991 | Burgess | 365/189.07 |
| 5,043,940 | 8/1991 | Harari et al. | 365/168 |
| 5,053,990 | 10/1991 | Kreifels et al. | 364/900 |
| 5,077,691 | 12/1991 | Haddad et al. | 365/185.23 |
| 5,155,701 | 10/1992 | Komori et al. | 365/185.23 |
| 5,175,840 | 12/1992 | Sawase et al. | 395/425 |
| 5,222,046 | 6/1993 | Kreifels et al. | 365/185.22 |
| 5,602,987 | 2/1997 | Harari et al. | 365/200 X |

FOREIGN PATENT DOCUMENTS

| | | |
|---|---|---|
| 2029145 | 3/1980 | (GB). |
| 2081458 | 2/1982 | (GB). |
| 55-008696 | 1/1980 | (JP). |
| 55-008697 | 1/1980 | (JP). |
| 57-120297 | 7/1982 | (JP). |
| 62-045182 | 2/1987 | (JP). |
| 62-052798 | 3/1987 | (JP). |
| 62-119796 | 6/1987 | (JP). |
| 62-266798 | 11/1987 | (JP). |
| 62-276878 | 12/1987 | (JP). |
| 64-017299 | 1/1989 | (JP). |
| 2-010596 | 1/1990 | (JP). |
| 3-102879 | 4/1991 | (JP). |
| 63-291297 | 11/1998 | (JP). |

OTHER PUBLICATIONS

G. Samachisa et al., "A 128K Flash EEPROM Using Double–Polysilicon Technology", IEEE Journal of Solid State Circuits, vol. SC–22, No. 5, Oct. 1987, pp. 676–683.

K. Komori et al., "A High Performance Memory Cell Technology For Mega Bit EPROMs", pp. 627–630, IEEE–IEDM 1985.

K. Seki et al., "An 80–ns 1–Mb Flash Memory Unit With On–Chip Erase/Erase–Verify Controller", IEEE Journal SSC, vol. 25, No. 5, Oct. 1990, pp. 1147–1152.

Kume et al., "A Flash Erase EEPROM Cell With An Asymmetric Source and Drain Structure", pp. 560–563, IEEE–IEDM 1987.

V. Kynett et al., "An In–System Reprogrammable 32K×8 CMOS Flash Memory", IEEE Journal of Solid State Circuits, vol. 23, No. 5, pp. 1157–1163, Oct. 1988.

S. Haddad et al., "An Investigation of Erase–Mode Dependent Hole Trapping in Flash EEPROM Memory Cell", IEEE Electron Device Letters, vol. 11, No. 11, pp. 514–516, Nov. 1990.

*Electronics* Magazine, Nov. 1990, pp. 44–53, "Look Out EPROMs, Here Comes Flash", by Samuel Weber.

Gill et al., "A Novel Sublithographic Tunnel Diode Based 5V–Only Flash Memory", IEEE–IEDM, Dec. 1990, pp. 119–122.

Gill et al., "Process Technology for 5–Volt Only 4 MB Flash EEPROM with 8.6 UM2 Cell", IEEE Symposium on VLSI Technology, Jun. 1990, pp. 125–126.

Gill et al., "A Five–Volt Contactless Array 256K Bit Flash EEPROM Technology," IEEE Intl. Electron Devices Meeting, Dec. 1988, pp. 428–431.

Chang et al., "Corner–Field Induced Drain Leakage in Thin Oxide MOSFETs", IEEE Intl. Electron Devices Meeting, Dec. 1987, pp. 714–717.

Chang et al., Drain–Avalanche and Whole–Trapping Induced Gate Leakage in Thin–Oxide MOS Devices, IEEE Electron Devices Letters, vol. 9, No. 11, Nov. 1988, pp. 588–590.

S. Mukherjee et al., "A Single Transistor EEPROM Cell and its Implementation in a 512K CMOS EEPROM", IEEE Intl. Electron Devices Meeting, 1985, pp. 616–619.

Cernea et al., "A 1Mb Flash EEPROM", IEEE Intl. Solid State Circuits Conference, Feb. 1989, pp. 138–139, 316.

S. Tam et al., "A High Density CMOS 1–T Electrically Erasable Non–Volatile (Flash) Memory Technology", IEEE Electron Devices Society, 1988 Symposium of VLSI Technology Digest of Technical Papers, May 1988, pp. 31–32.

S. D'Arrigo et al., "A 5V–Only 256K Bit CMOS Flash EEPROM", IEEE Solid State Circuits Conference, Feb. 1989, pp. 132–133, 313.

V. Kynett et al., "A 90ns 100K Erase/Program Cycle Megabit Flash Memory", 1989 IEEE Intl. Solid State Circuits Conference, Feb. 1989, pp. 140–141, 317.

Johnson et al., "A 16Kb Electrically Erasable Non–Volatile Memory", IEEE Intl. Solid–State Circuits Conf., pp. 152–153, 271, Feb. 1980.

Samachisa et al., "A 128K Flash EEPROM Using Double Polysilicon Technology", IEEE Intl. Solid–State Circuits Conf., pp. 76–77, 345, Feb.1987.

Electronic Technology, pp. 122–127, and English translation, Jun. 1988.

FIG. 7
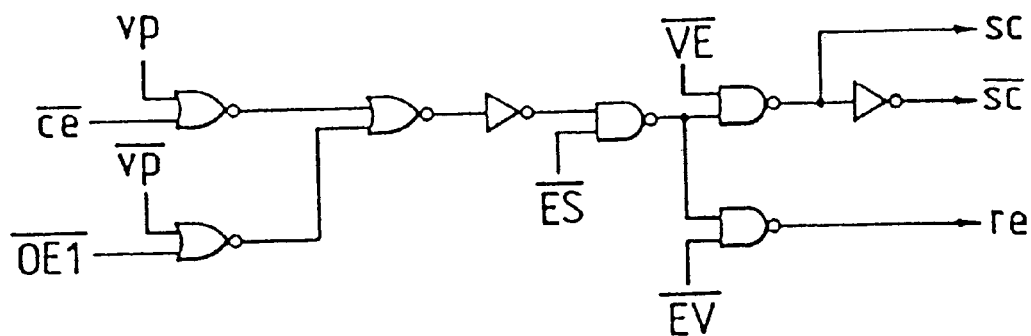
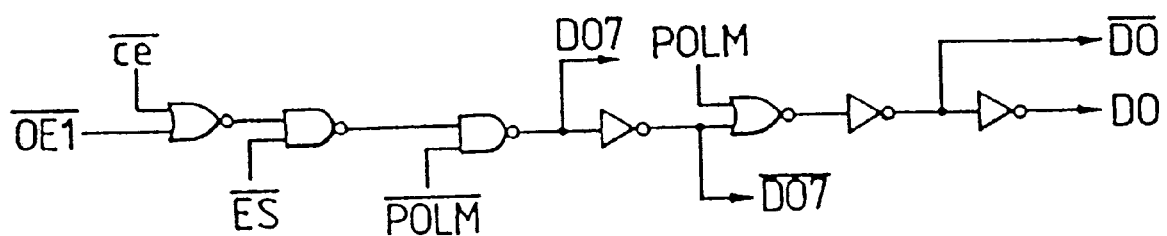
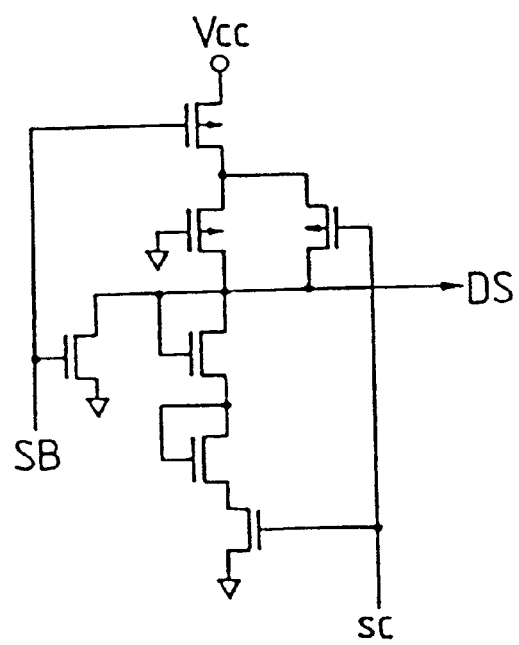

FIG. 9
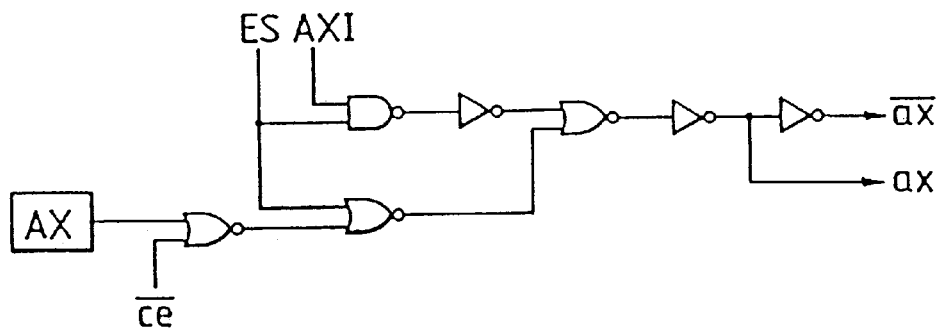
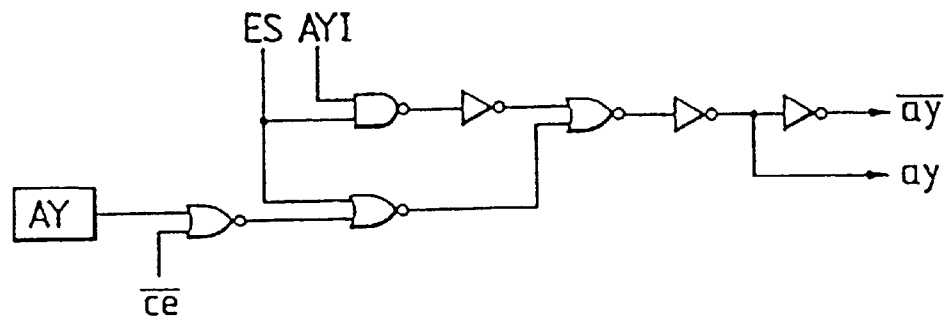
FIG. 10
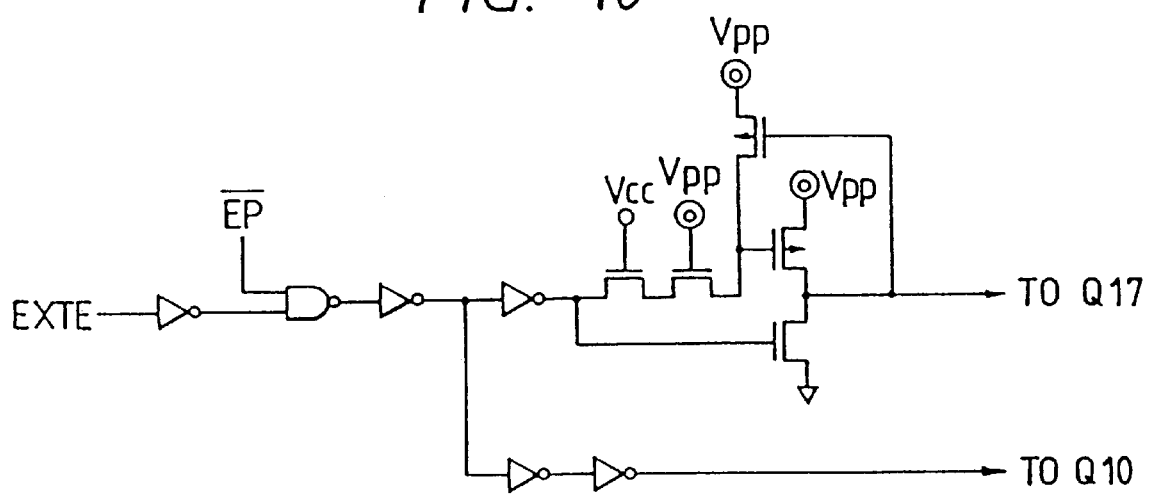

FIG. 32
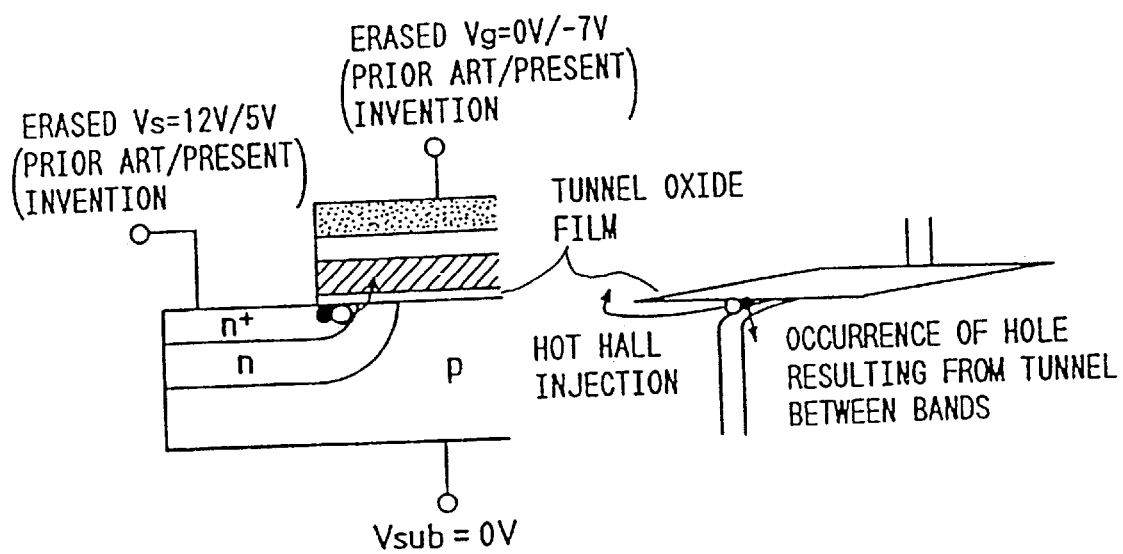
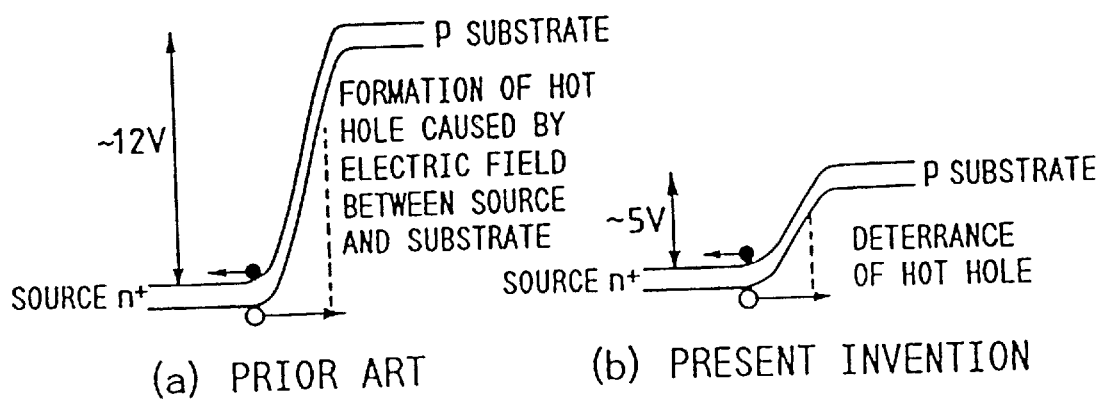
(a) PRIOR ART  (b) PRESENT INVENTION

FIG. 55

| | $\overline{CE}$ | $\overline{OE}$ | $\overline{WE}$ | $\overline{EE}$ | Vpp | I/O |
|---|---|---|---|---|---|---|
| WHEN NOT SELECTED | HIGH | * | * | * | Vcc | HIGH IMPEDANCE |
| READ-OUT | LOW | LOW | HIGH | HIGH | Vcc | DATA OUTPUT |
| OUTPUT DISABLE | LOW | LOW | LOW | LOW | Vcc | HIGH IMPEDANCE |
| | LOW | LOW | LOW | HIGH | Vcc | HIGH IMPEDANCE |
| | LOW | LOW | HIGH | LOW | Vcc | HIGH IMPEDANCE |
| | LOW | HIGH | * | * | Vcc | HIGH IMPEDANCE |
| WRITE | LOW | HIGH | LOW | HIGH | Vpp | DATA INPUT |
| WRITE VERIFY | LOW | LOW | HIGH | HIGH | Vpp | DATA OUTPUT |
| ERASURE | LOW | HIGH | HIGH | LOW | Vpp | HIGH IMPEDANCE |
| WRITE/ERASURE INHIBIT | HIGH | * | * | * | Vpp | HIGH IMPEDANCE |
| | LOW | LOW | LOW | * | Vpp | HIGH IMPEDANCE |
| | LOW | LOW | HIGH | LOW | Vpp | HIGH IMPEDANCE |
| | LOW | HIGH | LOW | LOW | Vpp | HIGH IMPEDANCE |
| | LOW | HIGH | HIGH | HIGH | Vpp | HIGH IMPEDANCE |

* INDICATES THAT EITHER OF HIGH AND LOW WILL DO.

NONVOLATILE SEMICONDUCTOR MEMORY DEVICE

This application is a continuation of application Ser. No. 08/720,060, U.S. Pat. No. 6,016,273, filed Sep. 27, 1996; which is a continuation of application Ser. No. 08/456,797, filed Jun. 1, 1995 (now U.S. Pat. No. 5,781,476); which was a continuation of application Ser. No. 08/249,899, filed May 26, 1994 (now U.S. Pat. No. 5,844,842); and which, in turn, was (1) a continuation-in-part of application Ser. No. 08/144,500, filed Nov. 2, 1993 (now abandoned), which was a continuation of application Ser. No. 07/474,994, filed Feb. 5, 1990 (now abandoned), and was (2) a continuation-in-part application of application Ser. No. 07/888,447, filed May 28, 1992 (now abandoned), which was a continuation application of application Ser. No. 07/567,391, filed Aug. 14, 1990 (now abandoned); and the contents of all of which are incorporated herein by reference.

BACKGROUND OF THE INVENTION

The present invention related to a semiconductor nonvolatile memory device and an information processing system employing such a memory device, to an effective technique for, for example, a batch erasable type EEPROM (electrically erasable and programmable read only memory), and also to a microcomputer system employing such an EEPROM.

As a semiconductor nonvolatile memory device, there are known an erasable programmable read-only memory (referred to as an "EPROM") the stored information on which is erasable by utilizing ultraviolet radiation, and also an electrically erasable and programmable read-only memory (referred to as an "EEPROM") the stored information of which is electrically erasable. An EPROM is suitable for a large-scale memory capacity because areas of memory cells for storing information are relatively small. However, to erase the information stored in EPROM, it is necessary to irradiate ultraviolet rays to the memory cells. To this end, a package having an ultraviolet irradiating window, which is relatively expensive, would be required in order to be able to employ such type of memory cells. Moreover, in order to be able to write or rewrite new information by a programmer, the EPROM must be removed, during write/rewrite operations thereof, from the system to which this EPROM has been actually packaged in, thereby resulting in a problem.

On the other hand, with respect to an EEPROM, the information stored therein is electrically erasable and writable, while the EEPROM remains packaged in a system. However, areas associated with memory cells of the EEPROM type are relatively large. For instance, a typical area of a memory cell in an EEPROM is 1.5 to 2 times, or as much as approximately 2.5 to 5 times, larger than that of an EPROM. Such an EEPROM is described, for example, in "Electronic Technology-June 1988", pages 122–127, issued by K.K. Nikkan Kogyo Shimbun, in which a detailed description is made of a construction of an EEPROM cell of a floating-gate tunnel oxide (FLOTOX), a mechanism of injection of electrons into a floating gate and of release of electrons from the floating gate, and the like.

The EEPROM cell of the FLOTOX type is a memory cell having a two-layer construction provided with a floating gate for holding electrons in the lower layer of a control gate. This mechanism is designed so that a tunnel current called a Fowlor-Nordheim (F-N) is allowed to flow through a region (a tunnel region) of an extremely thin insulating film formed in a portion of an insulating film between the floating gate and a drain region to effect injection of electrons into the floating gate and release of electrons from the floating gate.

In the memory cell of EEPROM of the FLOTOX type, electrons held by the floating gate are released, for example, by applying a GND voltage (0 V) to the control gate and applying a high voltage of 15 V to 20 V to the drain electrode.

As a result of this relatively large size of the memory cells, in general, EEPROM is not suitable when emphasis is in having a large memory capacity.

Semiconductor nonvolatile memory devices that can be considered as being between or intermediate the EPROM and EEPROM, are so-called "electrically batch erasable type EEPROM" devices, or are flash EEPROM devices, which have very recently been developed. These devices are the semiconductor nonvolatile memory devices in which-either all of the memory cells formed in a chip, or a certain memory cell group among the memory cells formed in the chip, are electrically erased. In accordance with the electrically batch erasable type of EEPROM, or the flash EEPROM, the size of memory cells thereof can be formed to be substantially the same as that of EPROM.

Such an electrically batch erasable type EEPROM is described in, for instance, IEEE INTERNATIONAL SOLID-STATE CIRCUIT CONFERENCE in 1980, on pages 152 to 153; IEEE INTERNATIONAL LID-STATE CIRCUIT CONFERENCE in 1987, on pages 76 to 77; and EE, J. SOLID-STATE CIRCUITS, vol. 23 (1988), pages 1157 to 1163.

In FIG. 16, there is represented a schematic sectional view of the electrically batch erasable EEPROM, which has been disclosed in the International Electron Device Meeting held in 1987. The memory cell shown in FIG. 16 is very similar to the memory cell of the normal EPROM. That is to say, this memory cell is constructed in accordance with an insulated gate type field-effect transistor (simply referred to as a "MOSFET" or "transistor"), however, having a double layer gate structure. In the structure of FIG. 16, reference numeral 8 indicates a P type silicon substrate; reference numeral 11 denotes a P type diffusion layer formed on the silicon substrate 8; reference numeral 10 represents an N type diffusion layer having a low concentration formed on the silicon substrate 8; and reference numeral 9 indicates an N type diffusion layer formed on each of the P type diffusion layer 11 and N type diffusion layer 10. Also, reference numeral 4 represents a floating gate formed on the P type silicon substrate 8 via a thin oxide film 7. Reference numeral 6 denotes a control gate formed on this floating gate 4 via the oxide film; reference numeral 3 indicates a drain electrode; and reference numeral 5 represents a source electrode. In other words, the memory cell shown in FIG. 16 is constructed like a MOSFET but having instead the N-channel type double gate structure. Thus, the information is stored in this transistor, and is held in this transistor in accordance with effecting a change of the threshold voltage thereof.

It should be noted that a transistor (referred to as a "storage transistor") of a memory cell, for storing information, discussed herein is of an N-channel storage transistor unless stated otherwise in the following description.

The information writing operation with respect to the memory cell represented in FIG. 16 is similar to that of EPROM. In other words, the writing operation of EEPROM shown in FIG. 16 is performed by injecting into the floating gate 4 a hot carrier produced adjacent to the drain region 9 connected to the drain electrode 3. The threshold voltage of the storage transistor with respect to the control gate 6 is higher than that of another storage transistor which does not perform the writing operation, while such a writing operation is carried out. In the erasing operation, on the other hand, the control gate 6 is grounded, and the high voltage is applied to the source electrode 5, whereby the high electric field is produced between the floating gate 4 and the source region 9 connected to the source electrode 5. Then, while utilizing the tunneling phenomenon via the thin oxide film 7, the electron which has been stored in the floating gate 4 is drawn via the source region 9 to the source electrode. As a result, the stored information disappears. In other words, the threshold voltage of the storage transistor is lowered with respect to the control gate 6. During the reading operation, in order to prevent a weak writing operation from being undesirably effected to the above-described memory cell, that is, to prevent undesired carriers from being injected into the floating gate, the voltages applied to both the drain electrode 3 and control gate 6 are limited to a relatively lower value. A lower voltage of, for instance, on the order of 5 volts is applied to the control gate 6. A magnitude of a channel current flowing through the storage transistor is detected in accordance with such applied voltages so as to determine whether or not the information stored in the memory cell corresponds to "0" or "1."

In general, during the electrical erasing operation, when the erasing operation is continued for a long time, the threshold voltage of the storage transistor will become different from that of the storage transistor under the thermal balance, namely it may become a negative value. To the contrary, in case of EPROM where the stored information is erased by way of ultraviolet radiation, the threshold voltage of the storage transistor which is varied in accordance with the erasing operation is substantially equal to the threshold voltage which is obtained when this memory-device is manufactured. In other words, the threshold voltage of the storage transistor after the erasing operation may be controlled by the manufacturing conditions and the like of this memory device. However, as previously described, in the case that the stored information is electrically erased, the stored information disappears when the electron stored in the floating gate is drawn to the source electrode. As a consequence, if the erasing operation in connection with such an EEPROM as in FIG. 16 is continued for a relatively long time, a large quantity of electrons are drawn away from the floating gate into the source electrode via the source region as compared with a quantity of electrons which have been injected into the floating gate while the writing operation is carried out. Therefore, when the electrical disappearance or erasings of the stored information is continued for a relatively long time, the threshold voltage of the storage transistor attains a different value from the threshold voltage obtained when the memory device is manufactured. That is to say, when the erasing operation is performed, the threshold voltage of the storage transistor would no longer be equal to the threshold voltage determined by the manufacturing conditions thereof, in contrast to the EPROM.

The Applicants, in accordance with their investigative and research efforts, have measured the variations in the threshold voltage of the storage transistor caused by the electrical erasing operation. In FIG. 8, there is shown a relationship, based on such measured variations, between the threshold voltage of the storage transistor as varied by the length of the erasing operation. In the graphic representation shown in FIG. 8, the abscissa denotes the erase time, whereas the ordinate indicates the threshold voltage of the storage transistor. "$V_o$" indicates that the threshold voltage is substantially equal to zero, "$+V_{ths}$" represents that the threshold voltage is equal to a positive voltage; and "$-V_{ths}$" indicates that the threshold voltage is equal to a negative voltage. Also, "$V_{ths}$" represents a fluctuation in the threshold voltage after the erasing operation, which is caused by fluctuations and the like of the manufacturing conditions. From this figure, it should be understood that if the erasing operation is continued for a relatively long time, the threshold voltage with respect to an N-channel storage transistor, for example, is changed wherein it becomes a negative voltage. Similarly, it should be understood from this figure that different threshold voltage variations of the respective storage transistors may result by the erasing operation because of fluctuations in the manufacturing conditions. In addition, it should be understood from this figure that the fluctuations in the threshold voltage become large in accordance with the erasing time. That is to say, a difference in the threshold voltages of two storage transistors is enhanced or magnified in accordance with an increase in the erase time.

As previously described, when the threshold value of the storage transistor becomes negative, the readout operation becomes adversely influenced. This adverse influence will now be described with reference to FIG. 17. It is now assumed that the information stored is read from the memory cell 12 under the write condition. Reference numeral 17 shown in FIG. 17 indicates a sense amplifier. To bring the memory cell 12 into the selective condition, the selective voltage during the readout operation, for instance the power source voltage Vcc(5V) is applied to the word line 13 connected to the memory cell 12. During this time, the non-selection voltage (for example the ground voltage OV) during the readout operation is supplied to the word lines 15 etc. in order to bring the other memory cells 14 etc. into the non-selective condition. If the memory cell 14, which is connected to the data line 16 as is the memory cell 12 from which the stored information is to be read out, is in the non-selective condition and has developed a negative threshold voltage, even if the voltage of the word line 15, namely the voltage of the control gate of the memory cell becomes zero, since the undesired current (non-selective leak current) flows through the data line 16 via the memory cell 14 which has been brought into the non-selective condition, a delay in a readout time may occur and thus an erroneous reading operation may be induced.

Similarly, there is an adverse influence with respect to a writing operation if the storage transistor within the memory cell has developed a negative threshold voltage. Normally, in the case where the writing operation is performed by utilizing hot carrier transfer, the high voltage ($V_{PP}$) employed for the writing operation, which is externally applied, is applied via a switching MOSFET to the drain region of the storage transistor within the memory cell. The voltage drop in the above-described MOSFET is changed, depending upon the current flowing therethrough. As a consequence, under such a condition that the threshold voltage of the storage transistor becomes negative, the above-described voltage drop across the MOSFET becomes too large so that the voltage applied to the drain of the storage transistor within the memory cell is lowered by the above-described voltage drop. As a result, the time required for the writing operation may be increased.

Consequently, in the above-described EEPROM, a precise control must be implemented in order to control the value of the threshold value after the erasing operation.

In order to effect the electrical erasing operation of the stored information in a conventional EEPROM, for instance, as described on pages 152 to 153 in IEEE International Solid-State Circuit Conference in 1980, the EEPROM therein is constructed of storage transistors and selective transistors for blocking the non-selective leak current. Also, in this EEPROM, the program line is coupled to the control gate of the storage transistor thereof, whereas the selective line is coupled to the gate of the selective transistor. That is to say, both the storage transistor and selective transistor of each memory cell thereof are coupled to independent lines, respectively.

In FIG. 18, there is shown a sectional view of the memory cell of the electrical batch erasing type EEPROM which has been described on pages 76 to 77 in IEEE International Solid-State Circuit Conference in 1987. Although the operation of this memory cell is substantially the same as that of the memory cell shown in FIG. 16, the erasing operation of the stored information is different from that of the memory cell shown in FIG. 16. That is to say, the erasing operation of this EEPROM is carried out by utilizing the tunneling phenomenon effected between the floating gate and drain region. In this memory cell, though there is only one gate electrode to be connected to the word line, substantially two transistors are used to construct the memory cell. In other words, it can be assumed that the memory cell is arranged by the selective transistor and storage transistor in which both the gate electrode and control gate electrode are formed on a body. As previously described, since this memory cell essentially includes the selective transistor, the conventional problem of the nonselective leak current occurring during the readout time has been solved. However, since the writing operation is performed by the hot carrier required for a larger quantity of current, as compared with the writing operation effected by utilizing the tunneling phenomenon, the problem of the above-described adverse influence while the writing operation is executed is still present.

In the conventional EEPROM as described, for instance, on pages 152 to 153 in IEEE International Solid-State Circuit Conference in 1980, a single memory cell is constructed of a storage transistor and a selective transistor which are connected to respectively different word lines. However, in the memory cell of another type of EEPROM, such as of the electrically batch erasing type EEPROM as represented in FIGS. 16 and 18, it is constructed of a single storage transistor connected to a single word line. Such a specific arrangement as may be apparent in connection with the memory cells and the like shown in FIGS. 16 and 18 are herein represented by circuit diagrams. To this end, the representative circuit diagrams of the above-described memory cell are illustrated in FIGS. 19A and 19B. FIG. 19B shows a circuit diagram of the memory cell which has been announced at the IEEE International Solid-State Circuit Conference held in 1980. In the memory cell shown in FIG. 19B, symbols "$W_1$" and "$W_2$" denote different word lines, and symbol "D" represents a data line. Also, symbol "$Q_s$" indicates a selective transistor whereas symbol "$Q_m$" represents a storage transistor. FIG. 19A shows a circuit diagram of the memory cell shown in FIGS. 16 and 18. As is apparent from this circuit diagram, a single memory cell is so constructed that a control gate of a single storage transistor $Q_m$ is connected to a single word line, a drain thereof is connected to a single data line "D," and a source thereof is connected to a single source line "S." While the reading/writing operations are performed, to select a desired single memory cell from a plurality of memory cells of the type according to FIG. 19A, only a single word line and a single data line are required to be selected. This cell which is selected, of course, corresponds to the selected word line "W" and to the selected data line "D." In other words, a single memory cell can be defined by one word line and one data line. It should be noted that in FIG. 19A, the source line "S" is commonly used as the source lines "S" of all of the remaining storage transistors formed on the chip. Alternatively, each source line "S" provided can be commonly used with respect to a predetermined number of memory cells constituting a single memory block.

Since the memory cell shown in FIG. 19A can be arranged by a single storage transistor, the area on the chip required for forming the memory cell can be reduced to a small area substantially equal to that of EPROM. However, in order to realize the electrically batch erasing operation of the stored information, as described above, it is absolutely necessary to be capable of controlling the threshold voltage of the storage transistor after the erasing operation.

To this end, according to prior efforts, the erasing operation is subdivided into a certain number of erasing operations. Then, a confirmation determination is made as to whether or not the erasing operation is sufficient. If the erasing operation performed is determined to be insufficient or inadequate, the erasing operation is again repeated. In accordance with the above-described IEEE, J. Solid-State Circuits vol. 23 (1988), pages 1157 to 1163, there is proposed an algorithm relating to a control of the threshold voltage after such an erasing operation. In accordance with this publication, this algorithm is executed by the microprocessor which is provided separately with the electrically batch erasing type EEPROM. Also, in order to maintain the lower limit voltage "Vcc min" of the operable power source during the normal read out operation, a description given therein requires that the verify voltage be generated in the chip of the EEPROM while implementing the above-described algorithm (erasing verify operation).

In the above-described prior art, since such an algorithm is performed by the microprocessor, a cumbersome operation is required to perform the erasing operation of the stored information while the electrically batch erasing type EEPROM is actually packaged within the system. Furthermore, since a relatively long time is required for erasing the stored information, the microprocessor is necessarily being occupied for the erasing operation of the above-described EEPROM. This causes a serious problem in that the overall system employed must actually be stopped, i.e. be unnecessarily halted.

As the flash EEPROM, a typical memory device is disclosed, for example, in Japanese Patent Application Laid-Open Publication No. 62(1988)-276,878.

The memory cell of the flash EEPROM will be herein called a FAST (Floating Gate Asymmetric Source and Drain Tunnel Oxide) type.

The FAST type memory cell has a construction of a floating gate type field-effect transistor similar to the FAMOS type of EPROM. One bit (one memory cell) can be constituted by one element, and excellent integration is therefore provided.

Writing is effected by injecting into a floating gate electrode a hot electron generated in the vicinity of a drain junction similar to FAMOS. A threshold voltage as viewed from a control gate electrode of the memory cell is increased by writing.

On the other hand, erasure is effected by grounding a control gate electrode, applying a positive high voltage to a source to thereby generate a high electric field between a floating gate electrode and the source, and drawing electrons accumulated on the floating gate electrode into the source utilizing a tunnel phenomenon through a thin gate oxide film. A threshold voltage as viewed from the control gate electrode is lowered by the erasure. Since the memory cell has not selective transistor, presence of negative threshold voltage (over-erasure state) is fatally defective.

Reading is effected by applying a low voltage of the order of 1 V to a drain, applying a voltage of the order of 5 V to a control gate electrode, and utilizing the fact that magnitude of a channel current floating at that time corresponds to "0" and "1" of information. The drain voltage is stepped down to prevent a parasitic weak writing operation.

Since in the aforementioned FAST type memory cell, writing and erasure are effected on the drain side and on the source side, respectively, it is desired that junction profiles are individually optimized so as to suit to respective operations. The above-described prior art has a source/drain asymmetric construction, in which in the drain junction, an electric field concentrated type profile for improving the writing efficiency is used whereas in the source junction, an electric field relaxation type profile capable of applying a high voltage is employed.

In a memory cell for effecting erasure drawing an electron from a floating gate electrode in a tunnel, how to minimize an electrostatic capacity coupling between a region (a source region in this instance) to which an erasure voltage is applied and a floating gate electrode is important in order to case the fineness of cell to be consistent with the lower voltage of erasure operation. In the FAST type memory cell, a superposed region of a floating gate electrode and a source for determining a capacity coupling is formed in a self-matching manner by diffusion of the source to reduce the value thereof.

Chip collective erasure type memories other than the above-described are as follows.

First, V. N. Kynett et al. disclose, in IEEE Int. Solid-State Circuits Conference, Digest of Technical Papers, pp. 140–141, Fe., 1989, a 1 Mb flash EEPROM of the chip collective erasure type which uses a memory cell based on the principle similar to the aforementioned FAST type. A memory cell area is 15.2 $\mu m^2$ (design rule; 1.0 $\mu m$), and a working voltage for writing and erasure is 12 V. The low voltage operation is realized in the fine cell. However, this apparatus requires to external power sources, Vcc (5 V) and Vpp (12 V) for writing. This is because of the fact that a consumption current during rewriting operation is so high that a step-up power source of on-chip cannot be utilized.

Furthermore, S. D'Arrigo et al. disclose, in IEEE Int. Solid-State Circuits Conference, Digest of Technical Papers, pp. 132–133, Feb., 1989, a 256 kbit flash EEPROM of the chip collective erasure type. That is, (1) the tunnel phenomenon of electrons is utilized for writing as well as erasure, and (2) a region in which the gate oxide. film used in the tunnel is thin is limited to a drain high concentration diffusion layer whereby a consumption current for rewriting operation may be reduced. A further feature of this memory is to apply a negative voltage to a control gate electrode in the erasure operation. Thereby, the voltage applied to the drain diffusion layer is stepped down to 5 V or so to increase an allowance with respect to junction pressure. However, in this apparatus, the tunnel region is not self-matched. Further, a selective transistor called a pass gate is contained in the cell, and therefore, this apparatus is inferior to the FAST type in terms of the fineness of cell and the low voltage operation.

SUMMARY OF THE PRESENT INVENTION

Applicants have found that problems noted below involved in connection with the emission of electrons in the memory cell of EEPROM of the FLOTOX type as described above.

That is, one problem is that since a high voltage is applied to a drain electrode during emission of electrons from a floating gate, a high voltage is applied to an $n^+$ diffusion layer forming a drain region and an $n^+/p$ junction portion to degrade the memory cell of the EEPROM.

Because of this, a high pressure-withstanding construction has been heretofore employed for the memory cell of the EEPROM. This poses a further problem in that the high pressure-withstanding construction of the memory cell of the EEPROM impairs the fineness thereof, to increase an area of a semiconductor chip used by the memory cell.

Although the FAST type memory cell as described above is a promising element having various advantages, it has problems as noted below.

A first problem is that a parasitic leak current flows from a source to a semiconductor substrate during erasure operation. This is a leak current peculiar to the FAST type memory cell resulting from the fact that a gate oxide film is thinned over the whole surface of the floating gate electrode. That is, when a high electric field (of the order of 10 MV/cm) necessary for the erasure operation is applied to the gate oxide film, paired electrons and holes caused by the tunnel between bands occur in the source region surface therebelow. Since the holes cannot prevent the outflow toward the substrate, a high leak current flows. It is noted that in the above-described FLOTOX type memory cell, the gate oxide film is thickened at the end of the high concentration diffusion layer, and therefore, the holes will not flow toward the substrate and no leak current occurs.

The presence of the leak current as described above causes a consumption current for the chip collective erasure operation to increase. Therefore, an external power source for erasure operation, other than a Vcc power source (normally, 5 V power source) for reading operation, supplied externally of the chip, is required.

A second problem is that when rewriting is repeated, durability with respect to the program disturb is materially degraded, making it difficult to secure reliability of array operation. The program disturb termed herein is the phenomenon wherein a threshold voltage of the memory cell varies in a word line semi-selective state where a writing high voltage is applied to a control gate alone of the memory cell.

G. Verma et al. reports, in IEEE 1988 Int. Reliability Physics Symposium, pp. 158–166, the degrading phenomenon of durability of the aforesaid program disturb. According to this report, the degradation of the program disturb durability results from the fact that a positive captured charge is formed in the gate oxide film by the erasure operation to accelerate the tunnel injection of electrons, which brings a cause of the program disturb. The formation of the positive captured charge is considered to be resulted from the fact that a hole generated in the tunnel between bands during the erasure operation is formed into a hot hole by obtaining energy from a high electric field between the source and the substrate, and it is injected into and captured by the gate oxide film in an extremely fine amount.

The aforementioned degradation phenomenon of the program disturb durability constitutes a severer restriction in the case where a memory array is divided into some blocks in a direction perpendicular to a word line, and rewriting operation is effected every block. In the case where the division of blocks is not taken into consideration, time for the memory cell exposed to the program disturb may be time of the sum for applying writing one by one to other memory cells on one and the same word line. On the other hand, considering the division of blocks, in the case where writing is applied to a certain block and thereafter rewriting of other blocks is repeated, the time becomes extended by approximately the times of rewriting.

A third problem is that the erasure operation by bit line unit is impossible to carry out in principle. The FAST type memory cell is a 1-element type memory cell which has no switch MOS. Therefore, when an erasure high voltage is applied to a source line, all the memory cells connected to the source line are simultaneously erased. Even if the source line is decoded, the block erasure by source line unit is merely enabled.

FIG. 52 schematically shows a sectional construction of the above-described FAST type memory cell. As previously mentioned, this memory element has a construction of a floating gate type electric field-effect transistor of 1-element/bit similar to the FAMOS type memory element of EPROM, which is excellent in high integration.

As previously mentioned, writing is carried out by injecting a hot carrier generated in the vicinity of a drain 1' junction into a floating gate 2' similar to EPROM. A threshold value as viewed from a control gate 4' of a memory cell is increased by writing. On the other hand, erasure is carried out by grounding the control gate 4', applying a high voltage to a source 3' to thereby generate a high electric field between the floating gate 2' and the source 3', and drawing electrons accumulated on the floating gate 2' into the source 3' utilizing the tunnel phenomenon through a thin oxide film 5'. A threshold value as viewed from the control gate 4' is lowered by the erasure. Reading is effected by applying a low voltage of the order of 1 V so that weak writing is hard to occur in the drain 1', applying a voltage of the order of 5 V to the control gate 4', and corresponding the magnitude of a floating channel current to 0 and 1 of information. In the figure, reference numeral 6' designates a p-type silicon substrate; 7' an n-type diffusion layer; 8' an n-type diffusion layer of low concentration; and 9' a p-type diffusion layer.

Furthermore, as previously mentioned, in the memory element in which the erasure operation is carried out by the tunnel of electron, how to minimize an electrostatic capacity coupling between a region to which erasure voltage is applied (a source region in this instance) and a floating gate electrode comprises a point to cause the fineness of cell to be consistent with the lower voltage of erasure. In the FAST type memory element, a gate oxide film below a floating gate electrode is wholly thinned (into a tunnel oxide film), and a superposed portion of the floating gate electrode and a source region is formed in a self-matching manner by diffusion of said region or the like to decrease the tunnel region of electrons to the limit and reduce the capacity coupling.

In the flash EEPROM using the above-described conventional FAST type memory element, security of controllability of a "1" state threshold voltage (a threshold voltage low level) realized by the electric collective erasure operation constitutes an important task. This is because of the fact that inferiority results from the following reading operation even if the threshold voltage after erasure is too high or too low.

In the case where the threshold voltage after erasure is to high, a current required to read "1" is short, resulting in an occurrence of degradation of the lower limit value of the read-out power source voltage or the read-out speed. That is, naturally, the erasure operation should not be insufficient.

On the other hand, when the threshold voltage after erasure is low to assume a depleted state, a current flows even into a memory element in which a word line is not selected during reading. Therefore, the "0" state where current does not flow originally is impossible to read. Since the FAST type memory element has no selective transistor, it cannot carry out even over-erasure.

As a result, in the flash EEPROM using the FAST type memory element, for applying an erasure voltage to a common source line to simultaneously and collectively erase a number of memory elements, it is required that no;unevenness in erasure characteristic of individual memory elements exists or at least such unevenness is restrained to a minimum.

However, actually, when the collective erasure operation is effected in an LSI level, a large unevenness appears between erasure characteristics, due to the influence of various factors such as unevenness of element construction, unevenness of characteristic of the tunnel oxide film, and the like. How to manage this poses a great problem in design.

A first object of the present invention is to provide a nonvolatile semiconductor memory device of high reliability.

A second object of the present invention is to provide a small-sized nonvolatile semiconductor memory system.

A third object of the present invention is to provide a nonvolatile semiconductor memory device using the aforementioned FAST type memory cell which eliminates the necessity of an external power source exclusively used for erasure operation.

A fourth object of the present invention is to provide a nonvolatile semiconductor memory device using the aforementioned FAST type memory cell, which is hard to be affected by a program disturb and can realize electric erasure per block unit.

A fifth object of the present invention is to provide a nonvolatile semiconductor memory device using the aforementioned FAST type memory cell, which can perform erasure operation per bit unit.

A sixth object of the present invention is to provide a nonvolatile semiconductor memory device using the aforementioned FAST type memory cell, which can perform erasure operation using a single power source (for example, 5V power source) which is used for reading operation and writing operation.

A seventh object of the present invention is to provide a nonvolatile semiconductor memory device using the aforementioned FAST type memory element, in which even if significant unevenness between erasure characteristics of a memory element for carrying out collective erasure operation is present, unevenness of a threshold voltage after erasure can be minimized.

An eighth object of the present invention is to provide a semiconductor nonvolatile memory device capable of essentially performing an electrical erasing operation without lowering the throughput capability of an entire system while actually packaging the semiconductor nonvolatile memory device to the system.

A ninth object of the present invention is to provide an information processing system capable of essentially realizing, i.e., fully implementing, an electrical erasing operation without lowering the throughput capability of the entire system, with EEPROMs packaged with the system.

A tenth object of the present invention is to provide an electrically batch erasing type EEPROM capable of automatically performing an erasing operation, to which an erasing instruction is merely supplied.

The above-described objects and other objects, and also novel features of the present invention will become apparent from the following descriptions and accompanying drawings.

Typical embodiments according to the present invention disclosed, which will be described in greater detail subsequently, will now be simply summarized as follows. That is, with respect to an electrically batch erasing type EEPROM including a memory array in which electrically erasable storage transistors (nonvolatile storage elements) are arranged in a matrix form, an erasing operation is performed in response to an externally supplied erasing instruction. Thereafter, a reading operation is carried out at least one time for the nonvolatile memory elements to which the erasing operation has been executed. Further, an erasing control circuit for controlling a continuation and interruption of the erasing operation in response to the readout information, is built in an EEPROM. Also, an EEPROM having the above-described erasing function is actually packaged with an information processing system including a microprocessor, and an erasing operation is automatically performed by the internal erasing control circuit, which is separated from the microprocessor, in accordance with the erasing instruction derived from the microprocessor.

In accordance with the above-described means, since an EEPROM per se according to the present invention owns the automatic erasing function which includes a reading operation for providing a confirmation as to whether or not the stored information has been erased, during the erasing operation while actually packaging the EEPROM to the system, a time required for controlling the operation of an EEPROM from the microprocessor is equal to a very short period of time from the time the erasing operation is commenced. This causes the load on the microprocessor to be considerably reduced.

A nonvolatile semiconductor memory device provided with an electrically erasable type nonvolatile memory cell composed of a MOSFET having a two-layer gate construction comprising a floating gate and a control gate is provided with a negative voltage generation circuit for applying a negative voltage to the control gate of said MOSFET and a low voltage generation circuit for applying a low voltage to a drain electrode of said MOSFET. Thereby, the aforementioned first and second objects can be achieved. That is, an emission of electrons from the floating gate, a potential of the voltage applied to the control gate is lower than a conventional GND potential. Accordingly, even if a potential of the voltage applied to the drain electrode is lower than the conventional potential through a potential of the voltage applied to the control gate, a potential difference required for emission of electrons can be secured between the floating gate and the drain electrode. That is, in emission of electrons from the floating gate, the voltage applied to the drain electrode can be stepped down as compared with that of prior devices. It is therefore possible to prevent degradation of the memory cell of the EEPROM.

Furthermore, the voltage applied to the drain electrode is stepped down as compared with that of prior devices, whereby the memory cell of the EEPROM is not necessary to have a high pressure withstanding construction. It is therefore possible to decrease the size of the memory cell and to miniaturize the nonvolatile semiconductor memory device.

For achieving the third and sixth objects, it is designed so that in carrying out the collective erasure operation by the nonvolatile semiconductor memory device using the FAST type memory cell, a voltage applied to a source region (or a drain region) of each memory cell is supplied from a Vcc power source (A power source supplied externally of the chip and normally used for reading operation; this is applied thereafter) of the nonvolatile semiconductor memory device, an erasure voltage reversed in polarity to that of the Vcc power source is applied to a control gate electrode of each memory cell, and said erasure voltage is supplied from a voltage conversion circuit (a step-up circuit) within the nonvolatile semiconductor memory device. The value of the erasure voltage having a reversed polarity is determined according to the constructional constant and characteristics of the memory cell, for example, the value of the order of Vcc–2 Vcc.

Next, the fourth object is realized by using the means for achieving the above-described third and sixth objects and by dividing the block in a direction of a word line so that memory cells connected to the same word line belong to the same block.

The fifth object is realized, in the means for achieving the above-described third and sixth objects, by an arrangement wherein a source line (or a data line) for applying an erasure voltage and a word line are decoded, and erasure operation is effected merely by a memory cell which is present at an intersection between a pair of selected source line (or a data line) and a word line.

Circuits for a typical example of operation of a memory array corresponding to the means used to achieve the third to sixth objects and working voltages of various parts are shown in FIGS. 29 to 31.

In this example, a memory array M-ARRAY comprises FAST type memory cells (n channel) M1' to M9' arranged in three lines and three rows, and operation thereof takes place through word lines W1'–W3', data lines D1'–D3', and a common source line CS'.

FIG. 29 shows the collective erasure operation with the whole memory array M-ARRAY as a single unit.

In this case, a negative erasure voltage (–7V) is applied to all word lines W1' to W3', and a positive erasure voltage (+5) is applied to the common source line CS'. +5V of the common source line CS' is supplied from the Vcc power source externally of the device, and –7V of the word line is supplied from the voltage conversion circuit within the device. At that time, the substrate and the data line have a ground potential. It is noted that writing and reading operations are carried out by decoding the data line and the word line and selecting the memory cell at the intersection, similar to the conventional chip collective erasure type flash EEPROM of the two-power source system.

Next, FIG. 30 shows the case where a group of memory cells MB1', MB2' and MB3' connected to the word lines as surrounded by the broken lines in the figure are handled as a bunch of memory blocks to effect the erasure operation. That is, the group of memory cells connected to the same word line are selectively erased.

In this case, the word line to which is applied the negative erasure voltage (–7) is decoded to thereby select a memory block for effecting erasure. Other configurations are similar to those shown in FIG. 29.

Next, FIG. 31 shows the case where a suitable 1 bit in the memory array M-ARRAY is selected to effect erasure operation.

In this case, the word line to which is applied the negative erasure voltage (–7V) is decoded, and the positive erasure voltage (5V) is applied from the data line. The data line is decoded whereby erasure is effected by the memory cell at an intersection between the selected word line and data line. At that time, the substrate and the common source line are at a ground potential.

Writing is carried out by applying a writing voltage to the common source line and the selected word line and grounding the selected data line. At the memory cell located at the intersection, injection of a hot electron occurs from the source region side to realize the writing operation. At that time, non-selected data lines are separated one by one to provide an open state, and the non-selected word lines are at a ground potential. Reading operation is carried out by decoding the data line and the word line to select a memory cell at an intersection, similar to the conventional chip collective erasure type flash EEPROM of the two-power source system.

The intended objects are realized by the aforementioned means.

First, the Vcc power source is applied to a source region or a drain region of each memory cell, an erasure voltage having a polarity reversed to that of the Vcc power source is applied to a control gate electrode, and said erasure voltage is supplied from a voltage conversion circuit provided within the memory device. Function of such a construction as just mentioned is as follows.

In carrying out the collective erasure operation by the nonvolatile semiconductor memory device using the FAST type memory cell, the source region through which flows a large leak current (for example, several 10 mA with 1 Mbit) is directly driven by the Vcc power source. It is necessary for preventing the lowering of erasure speed to apply an erasure voltage reversed in polarity to that of the Vcc power source to the control gate electrode. However, since only a fine tunnel current (for example, current of the order of 10 $\mu$A with 1 Mb) directly contributed to the erasure flows into the control gate electrode, it can be driven by the voltage conversion circuit (step-up circuit) provided within the nonvolatile semiconductor memory device. In this manner, the chip collective erasure operation by the Vcc single power source can be realized without sacrifice of the erasure speed.

Next, the function of the arrangement wherein the block is divided in a direction of the word line so that the memory cell connected to the same word line belongs to the same block, in addition to the aforementioned arrangement, is as follows.

Since the erasure voltage applied to the source region of the memory cell is stepped down from the conventional Vpp voltage (for example, of the order of 12V) to the Vcc voltage (for example, of the order of 5V), it is possible to materially restrain the phenomenon in which, as shown in FIG. 32, a hole generated in a tunnel between bands is formed into a hot hole by an electric field between the source and the substrate, which is then injected into and captured by the gate oxide film. Since the memory cells connected to the same word line are collectively rewritten without fail, the program disturb time experienced by the individual cells may be of the sum of times required for writing other memory cells on the same word line. It is possible to avoid the phenomenon in which the disturb time increases depending on times of rewriting. With this, the nonvolatile semiconductor memory device which is excellent in the program disturb durability and can provide electric erasure per block unit is realized.

Next, in the arrangement wherein the source line (or the data line) to which is applied the erasure voltage and the word line are decoded and the erasure operation is effected merely by the memory cell located at the intersection between the pair of selected source line (or data line) and word line, the source lines (or data lines) to which erasure voltage different in polarity from each other are applied and the word lines are decoded whereby the erasure operation can be selectively carried out by the memory cell located at the intersection. At that time, the tunnel phenomenon of electrons which controls erasure greatly depends upon the intensity of the electric field of the oxide film, and therefore, substantial erasure can be avoided from occurrence at the semi-selected memory cell in which only either data line or word line is selected.

The aforementioned seventh object is realized by individually controlling substantial terminals of the collective erasure operation every memory element or every bunch of some memory elements according to individual erasure speeds of the memory elements. Specifically, this can be realized by a combination of means described below as shown in FIG. 50.

First, a memory array M-ARRAY is divided into two blocks or more (in FIG. 50, MB1' to MB4'), each block comprising at least one memory element. Means (in FIG. 50, ED1'–4') for independently performing electric erasure every block are provided.

Second, there is provided means (in the figure, read-out device SA') which determines, prior to the electric erasure, if erasure is not required since threshold voltages of all memory elements in the block are low, or even at least one element of high voltage is present.

Third, there is provided means for impeding an application of an erasure voltage so that the collective erasure operation is not carried out when erasure is not required because threshold voltages of all the memory elements within the block are low. That is, there is provided a function in the means ED1'–ED4' to receive output of the SA' to determine if an erasure voltage is applied.

Finally, when necessary and sufficient erasure operation was carried out with respect to all the memory elements, the collective erasure terminates. This determination may be made within the system or by means of an external control.

While in FIG. 50, the case has been shown in which the memory array M-ARRAY has one read-out device SA', it is to be noted that generally, 8 sets or 16 sets of memory arrays and read-out devices SA' are provided so that read/write per 8-bit unit or 16-bit unit may be carried out. In case of the 8 sets, an arrangement as shown in FIG. 51 is employed.

Furthermore, while in FIG. 50, it is assumed that the whole memory array M-ARRAY is erased, it is to be noted that a partial erasure for erasing only a part among them may be employed. That is, in simultaneously erasing blocks MB1' and MB2', the MB1' and MB2' form blocks to constitute the same.

Thereby, the collective erasure operation as the chip is continued until the latest erasure among all the memory elements terminates. However, paying attention to the individual erasing blocks, further substantial erasure will not be carried out with respect to memory elements which have been erased to a level as needed. As a result, even if unevenness in erasure characteristics of memory elements subjected to the collective erasure is present, it is possible to precisely arrange the threshold voltage after termination of erasure to the desired value.

The above and other objects and novel features of the present invention will become more apparent from the detailed description given in this specification together with the accompanying drawings of the preferred embodiments.

BRIEF DESCRIPTION OF THE DRAWINGS

FIGS. 6 and 7 are circuit diagrams of a specific embodiment of the timing control circuit CNTR according to a preferred embodiment;

FIG. 9 is a circuit diagram of the unit circuit of the address buffers XADB and YADB according to a preferred embodiment;

FIG. 10 is a circuit diagram of the erasing circuit ERC according to a preferred embodiment;

FIG. 32 is a view showing energy bands in the present invention and prior art;

FIG. 55 is an explanatory view showing the relationship between the working mode of the device in an embodiment of the present invention and external signals;

DETAILED DESCRIPTION OF THE PREFERRED EMBODIMENTS

While the invention will be described in connection with specific and preferred embodiments, it will be understood that it is not intended to limit the invention to those embodiments. To the contrary, it is intended to cover all alterations, modifications and equivalents as may be included within the spirit and scope of the invention as defined by the appended claims.

Figure 20:
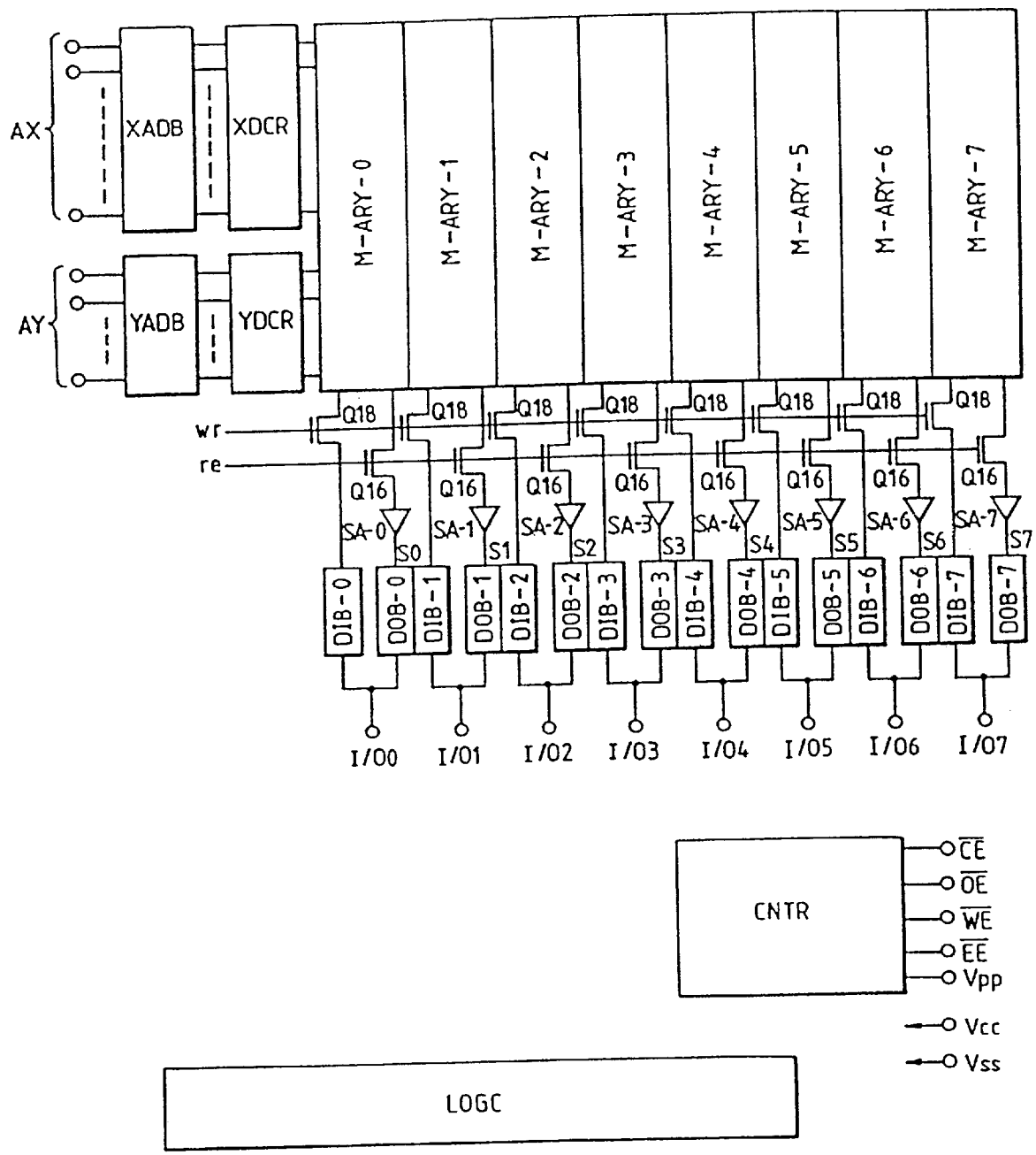
FIG. 20 is a block diagram of an overall EEPROM according to a preferred embodiment of the invention.

In FIG. 20, there is shown a block diagram of an electrically batch erasing type EEPROM (also referred to as "a flash EEPROM") to which the present invention has been applied. Each of the circuit blocks shown in FIG. 20 is formed on a single semiconductor substrate by way of a well known semiconductor integrated circuit technique, although it is not necessarily limited thereto. Symbol "○" shown in FIG. 20 represents an external terminal provided on the flash EEPROM.

In the circuit of FIG. 20, each of M-ARY-0 to M-ARY-7 corresponds to a similarly constructed memory array. The respective memory arrays include a plurality of word lines, a plurality of data lines arranged in such a manner that these data lines cross (intersect) the above word lines, and that memory cells are respectively provided on each cross point which corresponds to an intersection between the corresponding word and data lines. Symbol "XADB" indicates a row address buffer, and receives an external row address signal AX which is supplied via an external terminal so as to form an internal complementary row address signal corresponding to the row address signal AX. Symbol "XDCR" indicates a row address decoder and receives the internal complementary row address signal which has been formed by the row address buffer XADB so as to decode this internal row address signal. Although it is not limited thereto, both the row address buffer XADB and row address decoder XDCR are commonly used for the above-described memory addresses M-ARY-0 to M-ARY-7 in the preferred embodiment. That is, the row address decoder XDCR decodes the internal complementary row address signal so as to produce a word line selective signal for selecting a single word line in accordance with the external row address signal AX from a plurality of word lines in the respective memory arrays M-ARY-0 to M-ARY-7. As a result, a single word line is selected from the respective memory arrays M-ARY-0 to M-ARY-7.

In FIG. 20, symbol "YADB" denotes a column address buffer and receives an external column address signal AY which is supplied via the external terminal so as to produce an internal complementary column address signal in accordance with this external column address signal. Symbol "YDCR" represents a column address decoder, and decodes the internal complementary column address signal produced by the column address buffer YADB in order to produce a data line selective signal in accordance with the external column address signal AY. Although not shown in FIG. 20, a column switch is provided in each data line in the respective memory arrays M-ARY-0 to MARY-7, which receives the data line selective line, whereby a single data line is selected in accordance with the external column address signal AY, from among a plurality of data lines within the memory array, and which is coupled to a common data line (not shown) corresponding to the memory array.

As previously described, in the respective memory arrays M-ARY-0 to M-ARY-7, a single data line and a single word line are selected in response to the external row address signal AX and external column address signal AY. In accordance therewith, a selection is made of a memory cell which corresponds to a location in the respective memory array at a cross point between the selected word line and data line. In other words, the memory cell coupled to the selected word line and data line is selected from a plurality of memory cells within all of the memory arrays. As a result, one memory cell is selected from the respective memory arrays.

Although it is not restricted thereto, with respect to the memory cells selected from the respective memory arrays in the preferred embodiment, both the write operation and read operation are performed substantially simultaneously. That is to say, either the write operation of the information, or the read operation thereof is carried out in connection with an 8-bit data unit. To this end, there are eight external input/output terminals I/00 to I/07 associated with the flash EEPROM according to the preferred embodiment. Between the respective memory arrays M-ARY-0 to M-ARY-7 and the corresponding external input/output terminals I/00 to I/07, there are provided a data input buffer DIB, a data output buffer DOB, a sense amplifier SA, and switching MOSFETs Q18 and Q16. In the case of a writing operation of, for instance, the memory array M-ARY-0, the selected memory cell is coupled via MOSFET Q18, which is turned (switched) ON in response to the write control signal "wr," to the output node of the data input buffer DIB-0. In the reading operation, the selected memory cell is coupled via MOSFET Q16, which is turned (switched) ON in response to the read control signal "re," to the input node of the sense amplifier SA-0. The external input/output terminal I/00 is connected to the input node of the above-described data input buffer DIB-0 and is also coupled to the output node of the sense amplifier SA-O via the data output buffer DOB-0. The remaining memory arrays M-ARY-1 to M-ARY-7 are respectively coupled to the external input/output terminals I/01 to I/07, similarly to the above-described memory array M-ARY-0.

In FIG. 20, symbol "LOGC" represents an internal circuit for performing a control operation of the automatic erasing operation (to be later discussed in detail). Symbol "CNTR" is a timing control circuit which produces both an external signal or voltage to be supplied to the external terminals $\overline{CE}$, $\overline{OE}$, $\overline{WE}$, $\overline{EE}$ and $V_{PP}$, and also a timing signal including the above-described control signals wr, re and so on in response to the signal from the internal circuit LOGC. In FIG. 20, symbol "Vcc" denotes an external terminal for applying a power source voltage Vcc to the respective circuit blocks, and symbol "Vss" is an external terminal for applying a ground potential "Vss" to the respective circuit blocks.

It should be noted that the word lines were subdivided into individual groups of word lines wherein each group is correspondingly associated with an individual memory array in the above-described description; however, the word lines employed may be common to each and every one of the memory arrays.

Figure 1:
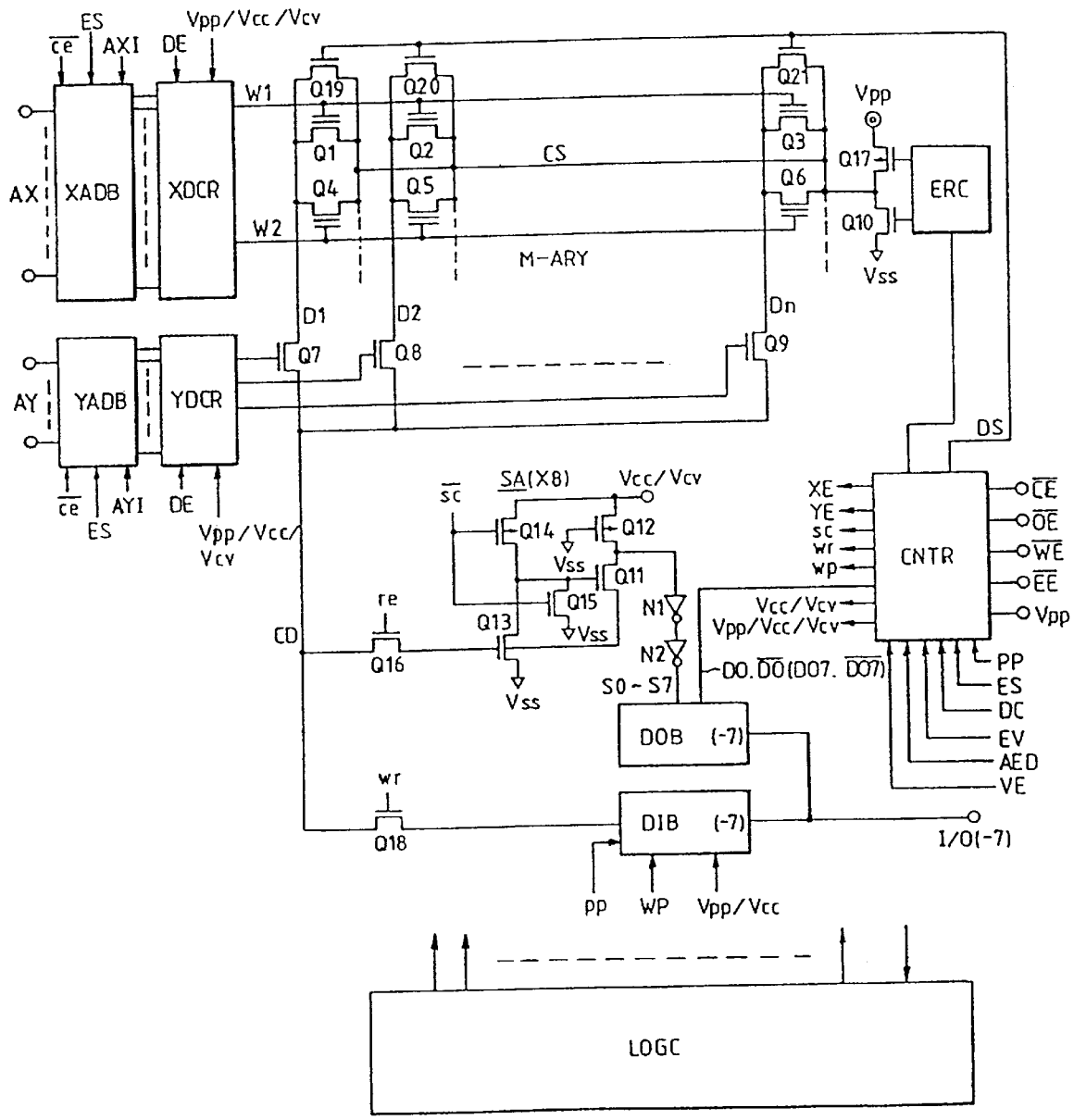
FIG. 1 is a block diagram of a circuit arrangement of a memory array unit and also a peripheral circuit of an EEPROM according to a preferred embodiment of the invention.

In FIG. 1, there is shown a detailed block diagram relating to a single memory array in the flash EEPROM shown in FIG. 20, a peripheral circuit of this memory array, a row address buffer, a column address buffer, a row address decoder, a column address decoder, a timing control circuit (CNTR) and the internal circuit LOGC which provides automatic control of the erasing operation. As is readily understood from the foregoing description, the respective circuit elements shown in FIG. 1 are formed on a single semiconductor substrate such as a monocrystal (single crystal) silicon by way of a known manufacturing technique with respect to CMOS complementary type MOS integrated circuit technology, although not limited thereto. In the circuit shown in FIG. 1, a P-channel MOSFET is discriminated from an N-channel MOSFET by adding an arrow to a channel (back gate) of the first-mentioned MOSFET. This fact is also applied to other figures (to be discussed later).

Although it is not restricted thereto, the integrated circuit is fabricated on a monocrystal P-type silicon. The N-channel MOSFET is constructed of a source region formed on this semiconductor substrate surface; a drain region; and a gate electrode which is made from a polysilicon formed on the semiconductor substrate surface between the drain region and source region via a thin gate insulating film. On the other hand, the P-channel MOSFET is formed in an N-type well region fabricated on the above-described semiconductor substrate surface. As a result, the semiconductor substrate constitutes a common substrate gate for a plurality or N-channel MOSFETs formed thereon, to which the ground potential "Vss" of the circuit is applied. The N-type well region constitutes a substrate gate of the P-channel MOSFET formed thereon. The power supply voltage Vcc is applied to the substrate gate of the P-channel MOSFET, namely N-type well region. It should be noted that a high voltage Vpp externally applied via the external terminal Vpp, or another high voltage produced inside the EEPROM, is applied to the N-type well region where the P-channel MOSFET is formed and which high voltage is effected by a circuit that processes a voltage higher than the power supply voltage Vcc.

Alternatively, the above-described integrated circuit may be fabricated on a semiconductor substrate made of a monocrystal N-type silicon. In this case, an N-channel MOSFET and a nonvolatile memory (storage) element are formed on a P-type well region, whereas a P-channel MOSFET is formed on the above-described N-type semiconductor substrate.

A more detailed description will now be given of the flash EEPROM according to the preferred embodiment with reference to FIG. 1. For the sake of brevity and facilitating greater understanding, the same explanations as those for the EEPROM shown in FIG. 20 apply in connection with the following descriptions.

In the flash EEPROM according to the preferred embodiment, the internal complementary signal is produced by the address buffers XADB and YADB which receive X(row) and Y(column) address signals AX and AY supplied via the external terminal from the external unit, and is then supplied to the address decoders XDCR and YDCR, although it is not limited thereto. The above-described address buffers XADB and YADB are initialized by the internal chip selecting signal $\overline{ce}$, and in conjunction therewith the buffers fetch the external address signals AX, AY supplied from the external terminal, and, in accordance therewith, each buffer produces a complementary address signal constituted by an internal address signal having the same phase as that of the external address signal supplied from the external terminal, and an internal address having a phase opposite to that of the external address signal, although it is not restricted thereto. To the above-described address buffers XADB and YADB, a signal representative of the erasing mode, and the internal address signal AXI, AYI, and the like in addition to the above-described chip selecting signal $\overline{ce}$, are supplied. However, these signals ES, AXI, YAI and the like are signals to be used in the erasing mode (to be later discussed); however, during the normal writing mode, or reading mode associated with the flash EEPROM, these signals do not affect the operation of the address buffers XADB and YADB.

The row (X) address decoder XDCR is initialized by the address decoder initializing signal DE and, upon being initialized, produces a selection signal for selecting one word line from a plurality of word lines within the memory array MARY in accordance with the complementary address signal derived from the corresponding address buffer XADB.

Similarly, the column (Y) address decoder YDCR is initialized in response to the above-described address decoder initializing signal DE, and it produces a selection signal for selecting one data line from a plurality of data lines within the memory array M-ARY in accordance with the complementary address signal derived from the corresponding address buffer YADB.

The above-described memory array M-ARY includes a plurality of word lines, a plurality of data lines arranged to be crossed (intersected) with the plural-word lines, and a plurality of memory cells provided at the cross points (intersections) between these word and data lines. In this drawing, a portion of this memory array M-ARY is illustrated as a typical example. That is to say, in FIG. 1, there is shown the word lines W1 and W2 among a plurality of word lines; the data lines D1, D2 and Dn among a plurality of data lines; and memory cells provided at the cross points of these data lines and word lines. Each of the memory cells is constructed of, as previously described with reference to FIG. 19A, a single storage transistor (nonvolatile memory element). In other words, each of these memory cells is constructed of a single storage (memory) transistor having a stacked gate structure including a control gate and a floating gate. As previously described, the above-described storage transistor has a similar structure to a storage transistor of an EPROM. It should be noted that as previously described and also as will be discussed later, the erasing operation is electrically carried out by utilizing the tunneling phenomenon between the floating gate and the source region coupled to the source line CS, which is different from the erasing method employed in an EPROM which utilizes ultraviolet radiation.

In the above-described memory array M-ARY, the control gates (selecting nodes of the memory cells) of the storage transistors Q1 to Q3 (Q4 to Q6) arranged on the same column are connected to the corresponding word lines W1 (W2), whereas the drain regions (input/output nodes of the memory cells) of the storage transistors Q1, Q4 to Q3, Q6 arranged on the same row are connected to the corresponding data lines D1 to Dn. The source regions of the storage transistors are coupled to the source line CS.

In accordance with the preferred embodiment, both an N-channel MOSFET Q10 (pull-down MOSFET) and P-channel MOSFET Q17 (pull-up MOSFET) which are switch-controlled by the erasing circuit ERC are connected to the source line CS. This erasing circuit ERC enables the N-channel MOSFET Q10 to be turned on during the writing mode and reading mode, so that the ground potential Vss of the circuit is applied to the source line. On the other hand, during the erasing mode, the P-channel MOSFET Q17 is turned on whereby the high voltage Vpp for erasing purposes is applied to the source line CS.

If the above-described memory array M-ARY is partially erased, the storage transistors arranged in a matrix form are subdivided into M blocks along a longitudinal direction, and source lines corresponding to the above-described source lines are respectively provided in each of the blocks. An erasing circuit ERC and MOSFETs Q10 and Q17 are provided on the respective source lines CS employed in each of the respective blocks. In this case, in order to determine which one of the plurality of blocks is being erased, it is required to address the respective erasing circuits by the address signal. In the above-described preferred embodiment, the information stored in all of the memory cells constituting the memory array M-ARY is erased within a single time period. In this case, the number corresponding to the source line CS is selected to be 1, and the above-described erasing circuit ERC and MOSFETs-Q10 and Q17 are provided in connection thereto.

In an EEPROM according to the preferred embodiment, since the writing/reading operations are performed in a unit of plural bits such as 8 bits, the above-described memory arrays M-ARY comprise 8 arrays (M-ARY-0 to M-ARY-7) in total, as illustrated in FIG. 20. It should be understood that when 16-bit information is read/written, 16 sets of the above-described memory arrays M-ARY are employed.

The respective data lines D1 to Dn constituting a single memory array are selectively connected via column selecting MOSFET switches Q7 to Q9 (column switch) to the common data line CD in response to a data line selecting signal from the column address decoder YDCR. To this common data line CD, the output terminal of the data input buffer DIB for the writing operation, which receives the write data input from the external terminal I/O, is connected via the MOSFET switch Q18. Such column selecting MOSFET switches, similar to that of FIG. 20, are also employed in the remaining 7 memory arrays M-ARY, to which the selection signals derived from the column address decoder YDCR are supplied. It should be noted that, additionally, different column address decoders may be provided with each one of the respective memory arrays which would control in response to the selection signals derived the corresponding column selecting MOSFET switches of the respective arrays.

The common data line CD, provided correspondingly with the memory array, is coupled to an input terminal of a first stage amplifier circuit which constitutes an input stage circuit of a sense amplifier SA via the MOSFET switch Q16. For the sake of convenience, the multi-stage sensing circuit is herein referred to as "a sense amplifier SA" including a circuit which is arranged by MOSFETs Q11 to Q15 as the above-described first stage amplifier circuit and a cascade-connected CMOS inverter circuit which includes CMOS logic inverters N1 and N2. During normal read out operating conditions (normal read out mode), the relatively low power supply voltage $V_{CC}$ is applied as the power supply for the sense amplifier SA to the power supply voltage terminal $V_{CC}/V_{CV}$ associated with the sense amplifier SA, whereas a voltage $V_{CV}$ having a potential of a magnitude lower than the above-described power supply voltage $V_{CC}$ is applied as the power supply to the power supply voltage terminal $V_{CC}/V_{CV}$ during the erase verifying operation, which will be subsequently described.

The common data line CD as illustrated above, is connected via MOSFET Q16, which is brought into the ON-state in response to the read control signal re, to the source of the N-channel amplifier MOSFET Q11. A P-channel type load MOSFET Q12, to which gate electrode and the ground potential Vss of the circuit is being applied, is provided between the drain of this amplifier MOSFET Q11 and the power supply voltage terminal $V_{CC}/V_{CV}$ of the sense amplifier SA. The above-described load MOSFET Q12 applies a precharge current to the common data line CD for the read operation.

To increase the sensitivity of the amplifier MOSFET Q11, the voltage of the common data line CD via the MOSFET switch Q16 is being applied to the gate of the driver MOSFET Q13 corresponding to the input of the inverting amplifier circuit which further includes the N-channel driver MOSFET Q14. The output voltage of the inverting amplifier circuit is applied to the gate of the amplifier MOSFET Q11. In addition, in order to prevent unnecessary current consumption of the sense amplifier during the nonoperative period of the sense amplifier SA, an N-channel shunting MOSFET Q15 is provided between the gate of the amplifier MOSFET Q11 and the ground potential point of the circuit. An operation timing signal $\overline{sc}$ of the sense amplifier is commonly supplied to the gates of this MOSFET Q15 and P-channel MOSFET Q14.

When the memory cell is read out, the operation timing signal $\overline{sc}$ of the sense amplifier SA is set to a low level. As a result, MOSFET Q14 is brought into an ON-state and MOSFET Q15 is brought into an OFF-state. The storage transistor constituting the memory cell holds previously written data of either the higher threshold voltage, or lower threshold voltage, than that corresponding to the selection level of the word line which is applied during the read operation.

In the case where a single memory cell which is selected from a plurality of memory cells constituting the memory array M-ARY in accordance with the respective address decoders XDCR and YDCR during the read operation is brought into the OFF state even if the word line is set to the selecting level, the common data line CD is set to the high level or a first voltage, by the current supplied through MOSFETs Q12 and Q11 and thus by the voltage drop thereacross from the voltage value of the SA supply terminal $V_{CC}/V_{CV}$ associated with the read out mode, i.e. $V_{CC}$. On the other hand, in the case where the above-described selected memory cell is brought into the On-state in response to the selecting level of the word line, the common data line CD is set to a low level or a second voltage which is determined by the voltage division of the series coupling of the series connected MOSFETs Q11, Q12, the column MOSFET switch (one of MOSFETs Q7–Qg) and the storage transistor of the selected memory cell. Therefore, this second voltage has a value which is between that of the first voltage (high level) and ground potential ($V_{ss}$), i.e. voltage $V_{CC}$>the first voltage>the second voltage. By applying this relationship to the common data line, the speed-up of the read out operation can be realized because the change in voltage on the common data line between that of the high level and that of the low level, which is indicative of binary data write information stored in a memory cell, is small. Control of the sense amplifier SA amplifier MOSFET Q11, at the gate electrode thereof, is effected by the MOS inverting amplifier circuit (Q13, Q14) which has an output coupled to the gate of MOSFET Q11. In the data line discharge MOSFETs Q19 to Q21 which are provided between the respective data lines D1 to Dn and source line, since the gate bias signal DS supplied to gates thereof is set to the intermediate level (to be discussed later), the charge in those data lines which have not been selected by the column address decoder YDCR is discharged.

It should be noted that the above-described amplifier MOSFET Q11 performs the amplification of the gate grounded type source input, and transfers the output signal thereof to an input of a CMOS inverter circuit N1. A CMOS inverter circuit N2 produces a signal SO (in the case where the memory array M-ARY shown in FIG. 1 corresponds to the memory array M-ARY shown in FIG. 20) which is obtained by shaping the waveform of the output signal from the CMOS inverter circuit N1 by the inverter N2, wherein this signal SO is transferred to the data output buffer DOB-0. The data output buffer DOB-0 amplifies the above-described signal SO and delivers it to the external terminal I/O$_o$.

The data buffer not only has the above-described output function of the data readout, but also includes the following functions. The data output buffers DOB-0 to DOB-6 respectively corresponding to the external input/output terminals I/O$_0$ to I/O$_6$, among eight external input/output terminals, perform an output operation in accordance with three conditions, one of which being a high impedance state condition, in response to the data output buffer initializing signals DO and $\overline{DO}$. However, the data output buffer DOB-7 corresponding to the external input/output terminal I/07 is under the control of the data initializing signals DO7 and $\overline{DO7}$ which are different from the above-described signals DO and $\overline{DO}$. This data output buffer DOB-7 is employed so as to be used in a data polling mode by which the internal erasing condition of the EEPROM is externally read. The write data supplied from the external input/output terminal I/O is transferred via the data input buffer DIB to the above common data line CD. As is shown in FIG. 20, both the read circuit constructed of a sense amplifier SA, which includes an input stage circuit, and data output buffer DOB similar to those of the above-described circuits, and also the write circuit constructed of the data input buffer DIB, are similarly commonly provided between the common data line and external input/output terminal with respect to each of memory arrays M-ARY.

The timing control signal CNTR forms internal timing signals such as: the internal control signal $\overline{ce}$ and an operation timing signal $\overline{sc}$ of the sense amplifier, and changes to the voltages of the reading low voltage V$_{CC}$/erase-verifying low voltage V$_{CV}$/writing high voltage V$_{PP}$. which are selectively supplied from the address decoder and the like so as to selectively output any one of these voltages in response to a chip enable signal $\overline{CE}$, an output enable signal $\overline{OE}$, a write enable signal $\overline{WE}$, an erase enable signal $\overline{EE}$ and write/erase high voltage V$_{PP}$, which are supplied to the external terminals $\overline{CE}$, $\overline{OE}$, $\overline{WE}$, $\overline{EE}$ (simply referred to as signals $\overline{CE}$, $\overline{OE}$, $\overline{WE}$ and $\overline{EE}$) and also to Vpp, and furthermore a prewrite pulse PP, a signal indicative of the erase mode ES, a decoder control signal DC, an erase-verify signal EV, an automatic erase mode setting delay signal AED, a sense amplifier initializing signal VE for the verify mode, which are supplied from an internal circuit LOGC which controls the automatic erasing operation (to be discussed later). The above-described signals PP, ES, DC, EV, AED and VE and the like do not affect the operation of the timing control circuit CNTR in the modes other than the erasing mode. In other words, only during the erasing mode are the respective signals PP, ES, DC, EV, AED and VE effective. That is, various signals for the erasing operation are produced from the timing control circuit CNTR in response to these signals.

Figure 6:
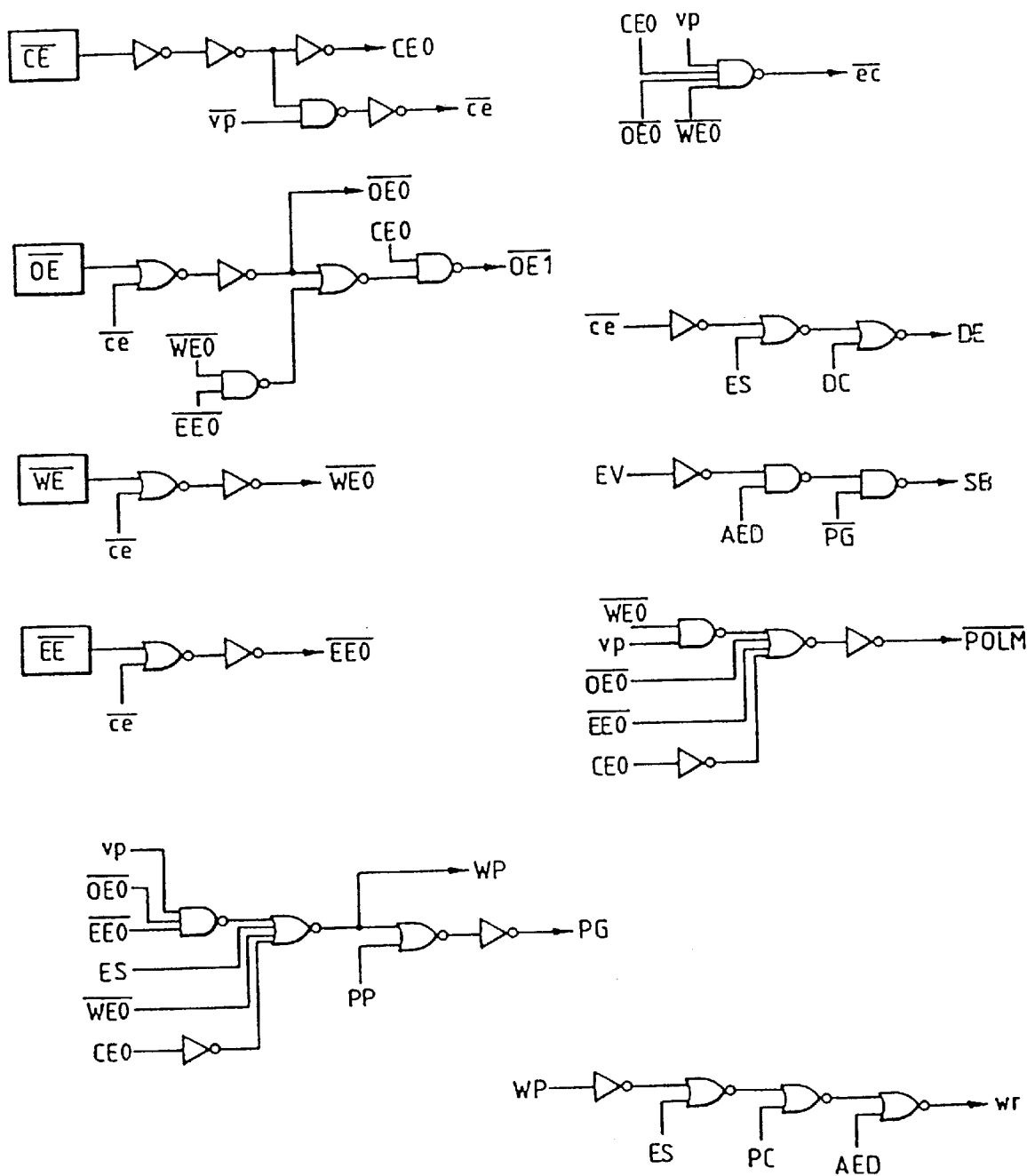
Figure 8:
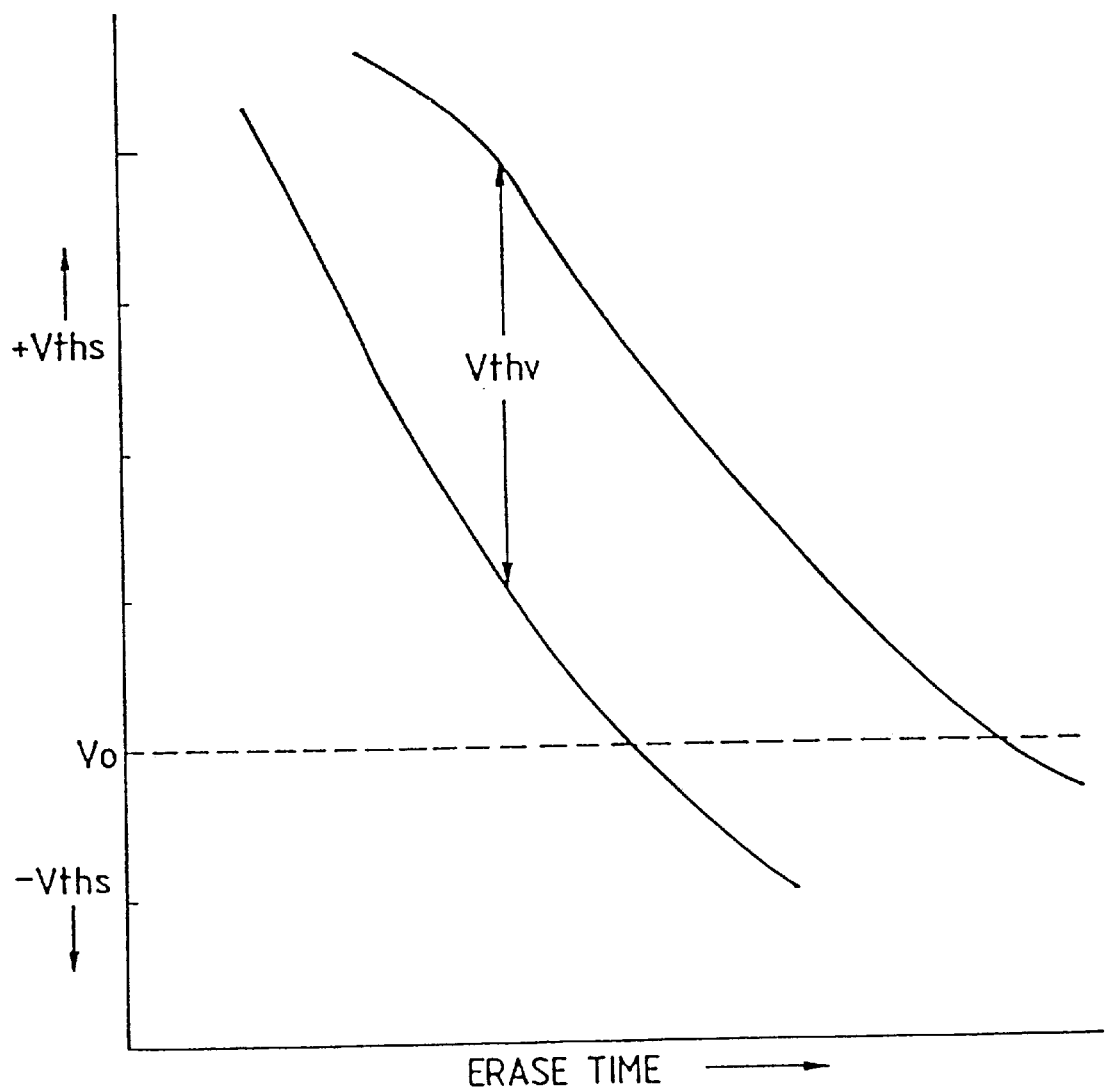
FIG. 8 is a characteristic diagram for representing a relationship between the erasing time and the threshold voltage value of the storage transistor.

In FIGS. 6 and 7, there are shown circuit diagrams of the major circuit portions of the above-described timing control circuit CNTR according to one preferred embodiment of the invention. In the Table accompanying this specification, there is represented the respective external signals supplied via the above-described external terminals to the flash type EEPROM, the operation modes corresponding to these external signals, and several internal timing signals among the internal timing signals formed in accordance with the respective external signals.

In this Table, symbol "H" denotes a high level, symbol "L" indicates a low level, and symbol "V$_{PP}$" indicates a voltage (e.g., 12V) higher than the power supply voltage Vcc (e.g., 5V). In the column of the external terminal I/O, symbol "H$_z$" indicates a high impedance condition, word "input" denotes a data input, and word "output" represents a data output. In particular, word "output (I/O7)" indicates that the external input/output terminal I/O7 corresponds to the data output. In this table, symbol "*," associated with an externally applied signal in connection with certain flash EEPROM operating conditions, indicates that either a high level "H" or a low level "L" is available, whereas symbol "0" represents that a level thereof is varied in response to the signal supplied from the internal circuit LOGC to the timing control circuit CNTR.

As to an understanding of this table, the read mode will now be described as one example. A similar explanation may be applied to other modes, which can be easily understood from the following examples.

When the low-leveled chip enable signal $\overline{CE}$ and output enable signal $\overline{OE}$, and the high-leveled write enable signal $\overline{WE}$ and erase enable signal $\overline{EE}$ are supplied to the flash EEPROM, and also the low voltage such as the power supply voltage "V$_{CC}$" is applied to the external terminal V$_{PP}$ of the flash EEPROM, a judgment (determination) is made that the read mode is designated by the timing control circuit CNTR, both the timing control circuit CNTR and internal circuit LOGC enable the respective internal signals VP, EV, WP, wr, AED, DC, ES, POLM, and PP to become a low level, respectively, and enable the internal signals SC, re and DE to become a high level. The data held by the memory cell designated by the address signal is thus output from the external input/output terminals I/O$_0$ to I/O$_7$.

It should be noted in the present specification that the same symbols represent the same signals or terminals with respect to each other. A signal represented by a minus symbol "-" attached on the upper portion of the alphabet character, denotes another signal not indicated by the minus symbol "-" attached thereon but by the same alphabet character, the phase of which is opposite to that of the first-mentioned signal. For example, the signal having the symbol "$\overline{VP}$" corresponds to the signal having the symbol "V$_P$," the phase of which is opposite to that of the first-mentioned signal "$\overline{VP}$." It should be noted that this signal V$_p$ becomes a high level (V$_{CC}$) when the high voltage V$_{PP}$ is applied to the external terminal V$_{PP}$, and becomes a low level (V$_{SS}$) under the condition other than the above operation.

Although detailed operations of the circuit arrangements shown in FIGS. 6 and 7 for constituting the major portion of the timing control circuit CNTR are not described, these operations will be readily understood from the above-described table representative of the operation mode and the below-mentioned explanations regarding the different modes of operation. Under such a condition that the signal $\overline{CE}$ is set to a high level and no high voltage is applied to the external terminal V$_{PP}$, the above-described flash EEPROM becomes a nonselective condition. Under the conditions that the chip enable signal $\overline{CE}$ is set to a low level, the output enable signal $\overline{OE}$ is set to a low level, a write enable signal $\overline{WE}$ is set to a high level, the erase enable signal $\overline{EE}$ is set to a high level, and no high voltage is applied to the external terminal $V_{PP}$, as previously described, the read mode is set, so that the internal chip enable signal $\overline{ce}$ becomes a low level and the address decoder initializing signal DE, the operation timing signal of the sense amplifier sc, and the read signal re are brought into the high levels, respectively. At this time, the low voltages $V_{CC}$ (approximately 5V) are supplied from the timing control circuit CNTR to the respective address decoders XDCR, YDCR, and data input circuit DIB. As a result, the sense amplifier SA is set in the operation condition, so that the above-described read operation is carried out. At this time, the non-initializing signal SB for the data line discharging MOSFET is set to a low level by the circuit shown in FIG. 6. In response to this operation, the N-channel MOSFET (FIG. 7) is turned OFF which receives the non-initializing signal SB, and the P-channel MOSFET (FIG. 7) is turned ON, which similarly receives the non-initializing signal SB. At this time, since the sense amplifier operation timing signal sc becomes a high level, the N-channel MOSFET (FIG. 7) which receives this signal sc is turned ON and the P-channel MOSFET (FIG. 7) receiving this signal sc is turned OFF, so that the data line discharging MOSFET gate bias signal DS becomes an intermediate voltage in accordance with the conductance ratio of two series-connected P-channel MOSFETs (FIG. 7) to three series-connected N-channel MOSFETs (FIG. 7), and controls either the data line discharging MOSFET Q19 or Q21 provided on the data line of the memory array M-ARY, whereby the charges of the data line under the nonoperative condition is discharged.

The write mode is set if the chip enable signal $\overline{CE}$ is set to a low level, the output enable signal $\overline{OE}$ is set to a high level, the write enable signal $\overline{WE}$ is set to a low level, the enable signal $\overline{EE}$ is set to a high level, and the high voltage (for instance, approximately 12V) is being applied to the external terminal Vpp. At this time, the above-described internal signal $\overline{ce}$ is set to a low level, and the address decoder initializing signal DE, write mode signal WP, write control signal wr and write pulse $\overline{PG}$ are set to a high level, respectively, whereas the gate bias signal DS, sense amplifier timing signal control signal re, data output buffer initializing signal DO and DO7 are set to a low level, respectively. The address decoders XDCR and YDCR are initialized in response to the high level of the signal DE, and therefore a single word line and a single data line are selected from a plurality of word lines and a plurality of data lines constituting the above-described memory array M-ARY by the external address signals AX and AY. At this time, the high voltage $V_{PP}$ is applied as the operation voltage to the address decoders XDCR, YDCR and data input buffer DIB from the timing control circuit CNTR. As described above, since the read control signal re is set to a low level during this write mode, the above-described MOSFET Q16 is brought into the OFF condition, the discharging MOSFETs Q19 to Q21 are also brought into the OFF condition, and the sense amplifier SA is noninitialized by the sense amplifier operation timing signal sc. Since both the data output buffer initializing signal D0 and D07 become a low level, respectively, the respective data output buffers DOB-0 to DOB-7 are non-initialized. It should be noted that the arrangement of the data output buffer DOB will be discussed with reference to FIG. 11.

Figure 16:
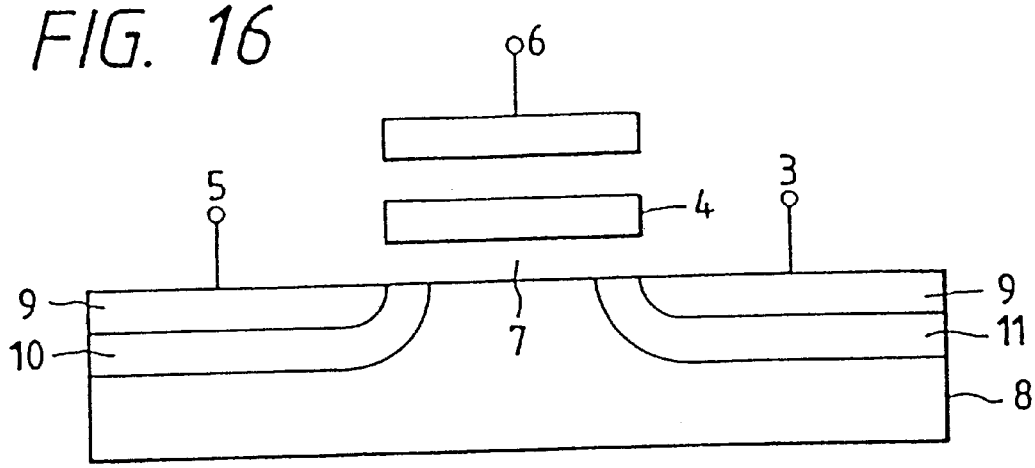
FIG. 16 is a cross-sectional view for explaining one example of a conventional memory cell.
Figure 17:
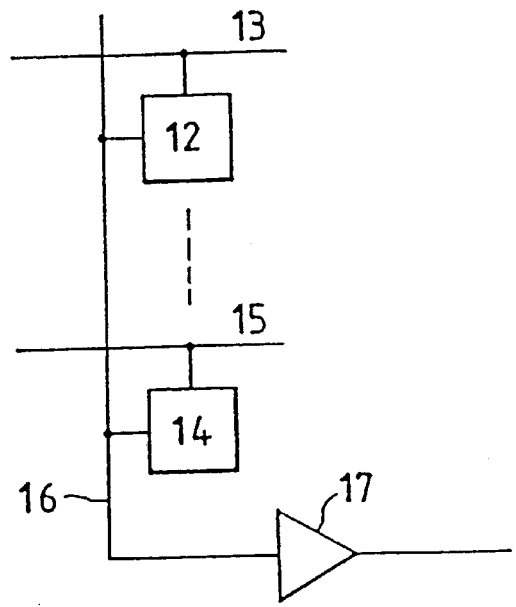
FIG. 17 is a schematic circuit diagram for explaining the read out operation of the conventional memory cell.
Figure 18:
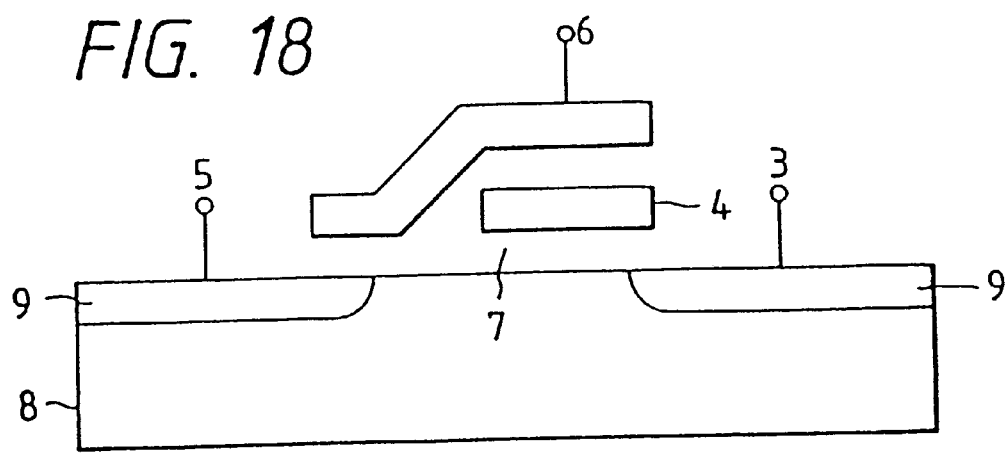
FIG. 18 is a cross-sectional view for explaining another conventional memory cell.

The potential of the selected word line, that is, the word line to which the selecting node of the vector cell to be written has been coupled, becomes such a high voltage as approximately 12V in accordance with the above-described high voltage $V_{PP}$ for writing, the potential of which is increased by the address decoder XDCR to which the high voltage $V_{PP}$ has been applied as the operating voltage thereof. On the other hand, the selected data line is set to either a high potential or low potential by the data input buffer DIB in accordance with the information to be written. As previously described, the memory cell is constructed of the storage transistor shown in FIG. 16. In the memory cell which is coupled to the word line where the selected node thereof has been selected, and is coupled to the data line where the input/output node thereof has been selected, when the electrons are injected into the floating gate of the storage transistor for constituting the memory cell, the potential of the selected data line is set to a high voltage in accordance with the high voltage "$V_{PP}$" via the data input buffer DIB and MOSFET Q18 which has been brought into the ON-state in response to the high level of the write control signal "wr." As a result, a channel saturation current flows through the storage transistor, electrons accelerated by the high electric field become ionized in a pinch-off region adjacent to the drain region coupled to the data line, and thus, the electrons having the high energy, namely hot electrons occur. The potential of the floating gate of this storage transistor, on the other hand, attains a voltage value which is determined by the voltage of the control gate to which the word line has been coupled, the voltage of the drain region, the capacitance between the semiconductor substrate and floating gate, and also the capacitance between the floating gate and control gate. As a consequence, hot electrons are conducted to the floating gate so that the potential of the floating gate becomes negative. Since the potential of the floating gate is set to a negative value, the threshold value voltage of the storage transistor to which the electrons have been injected is increased, as compared with the threshold 5 value voltage before the electron injection.

In the case, however, where no electrons are injected into the floating gate of the storage transistor of the selected memory cell, the threshold value voltage of the storage transistor is not increased, but is held at a relatively lower value. In order to prevent any electron injection into the floating gate of the storage transistor corresponding to the selected memory cell, from the drain region thereof, a lower voltage to the drain region such that the hot electrons do not occur in the pinch-off region adjacent to this drain region may be applied via the selected data line, MOSFET Q18 which is brought into the ON-state, and data input buffer DIB. Whether the above-described high voltage is applied to the drain region of the storage transistor of the selected memory cell, or the above-described low voltage is applied thereto, is determined based upon the information to be written. The data input buffer DIB (which will be discussed later with reference to FIG. 22) produces the above-described high voltage or low voltage in accordance with the information supplied via the external terminal I/O, and the produced voltage is delivered to the selected data line, as described above.

The storage transistor, the threshold value voltage of which has been increased by injecting the electrons into the floating gate thereof, does not become conductive during the mode even when the selection signal having the selective level (e.g., 5V) is supplied, namely the word which the selecting node has been coupled is selected, but becomes nonconductive. However, another storage transistor where no electron has been injected into the floating gate thereof becomes conductive during the read out mode when the selection signal having the selective level is supplied to the corresponding word line thereof because the threshold value voltage of such a storage transistor is held at the relative low voltage. As a result thereof, the current flows through the storage transistor.

It should be noted that in the memory cell which has not been selected during the write mode, no high voltage is applied to either the control gate and/or drain region of the storage transistor constituting this memory cell. As a consequence, no electron is injected into the floating gate and the threshold value voltage of the storage transistor does not change.

When the chip enable signal $\overline{CE}$ is set to a low level, the output enable signal $\overline{OE}$ is set to a low level, the write enable signal $\overline{WE}$ is set to a high level, the erase enable signal $\overline{EE}$ is set to a high level, and the high voltage ($V_{PP}$) is applied to the external terminal $V_{PP}$, the write verify mode is set. The condition of this write verify mode is the same as that of the read out mode except that under the write verify mode the high voltage ($V_{PP}$) is applied to the external terminal $V_{PP}$. As to the respective address decoders XDCR, YDCR and data input circuit DIB, the operation voltages thereof are changed from the high voltage $V_{PP}$ into the low voltage $V_{CC}$ and such is accordingly applied thereto.

In the write/erase inhibit mode represented in the table, each of these decoders is initialized, but no high voltage $V_{PP}$ which typifies the write/erase operations is applied to the respective decoders. During this mode, the above-described gate bias signal DS becomes a high level and this condition corresponds to a preparation period for the write/write verify/erase operations where the data line is discharged.

The erase mode is commenced when both the chip enable signal $\overline{CE}$ and erase enable signal $\overline{EE}$ become low levels, both the output enable signal $\overline{OE}$ and write enable signal $\overline{WE}$ are set to high levels, and the high voltage $V_{PP}$ is applied. The commencement of the erase mode is instructed by combining the voltages of these external signals. However, the erase mode is not ended unless this condition is first maintained, as will be discussed later with reference to FIG. 21.

Figure 2:
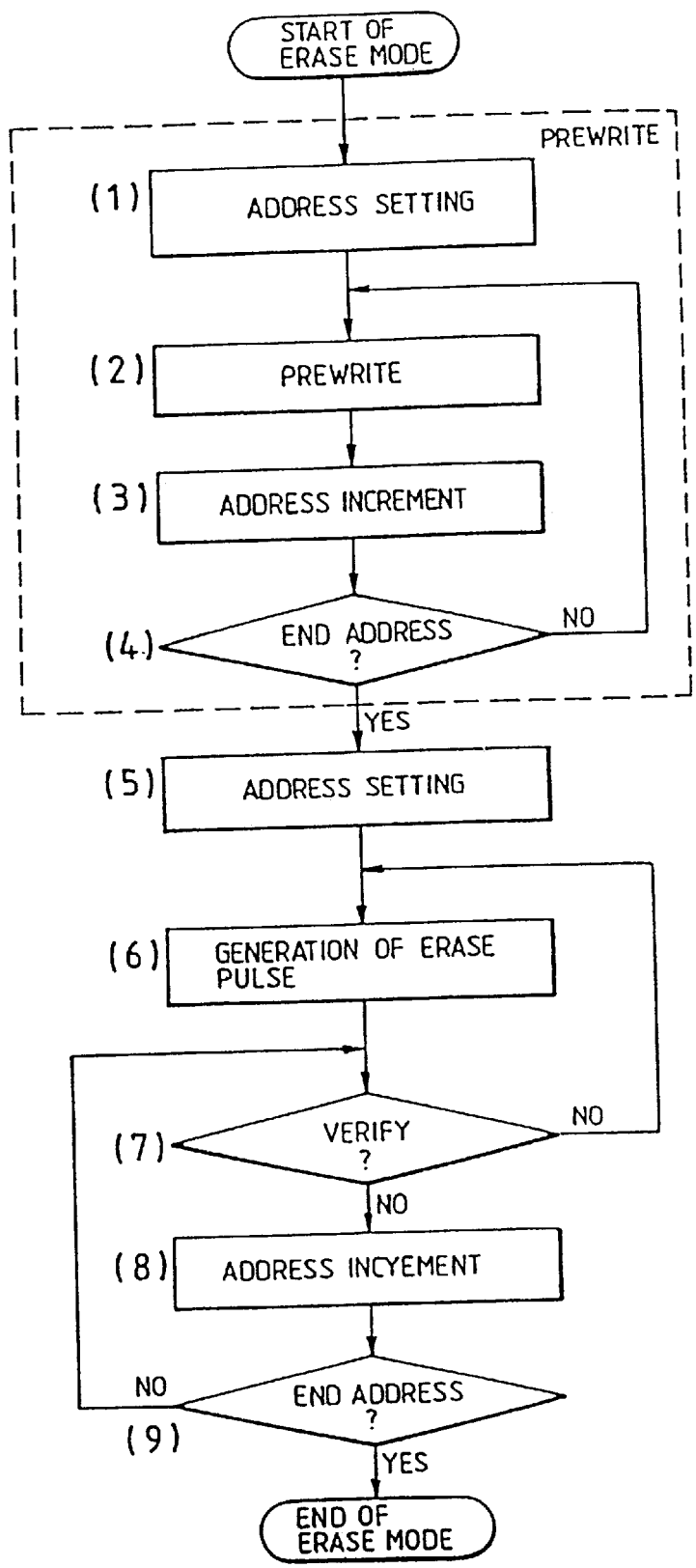
FIG. 2 is a flowchart for representing one example of an erasing algorithm according to the invention.

The erase mode in the flash EEPROM according to the preferred embodiment will now be described in detail with reference to: FIG. 2 where one example of this algorithm is represented as a flowchart, FIGS. 3 and 4 where detailed circuit diagrams are illustrated of the major circuit portions of the internal circuit LOGC, and FIG. 5 where an operation timing chart is shown. It should be noted that the above-described internal circuit LOGC functions as the erase control circuit.

Figure 3:
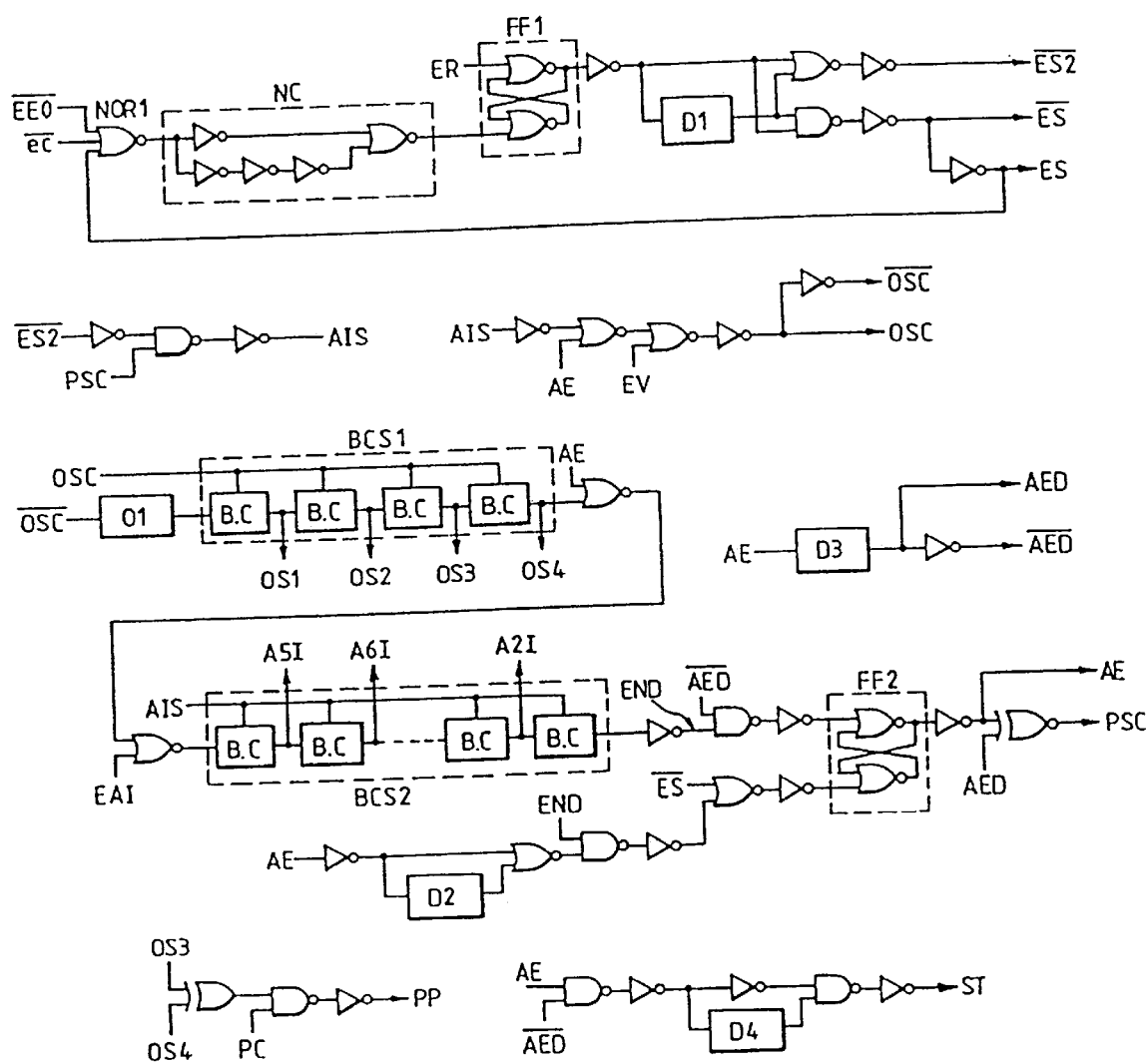
FIGS. 3 and 4 are circuit diagrams of a specific embodiment of the erase controlling circuits LOGC according to a preferred embodiment.
Figure 4:
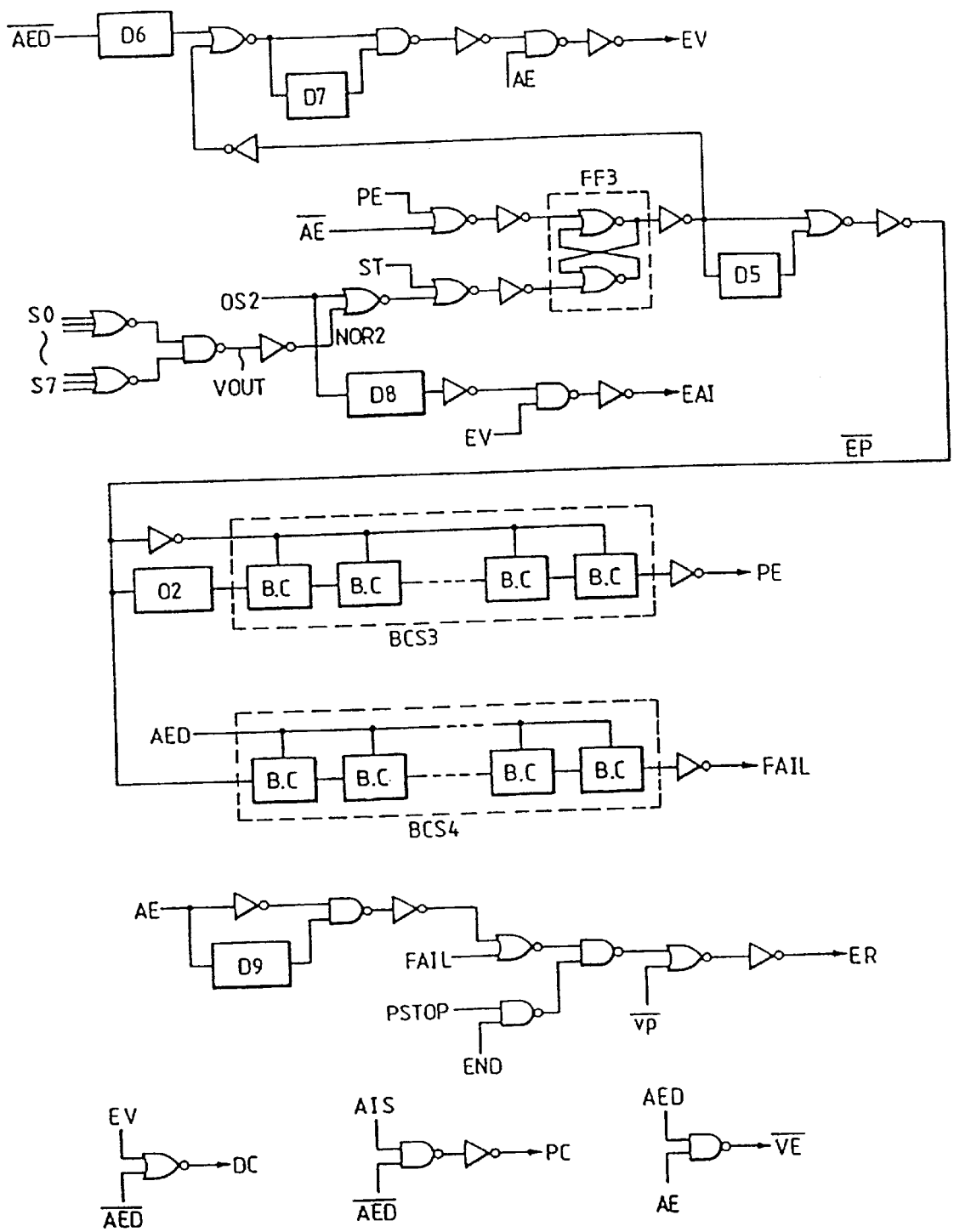
Figure 5:
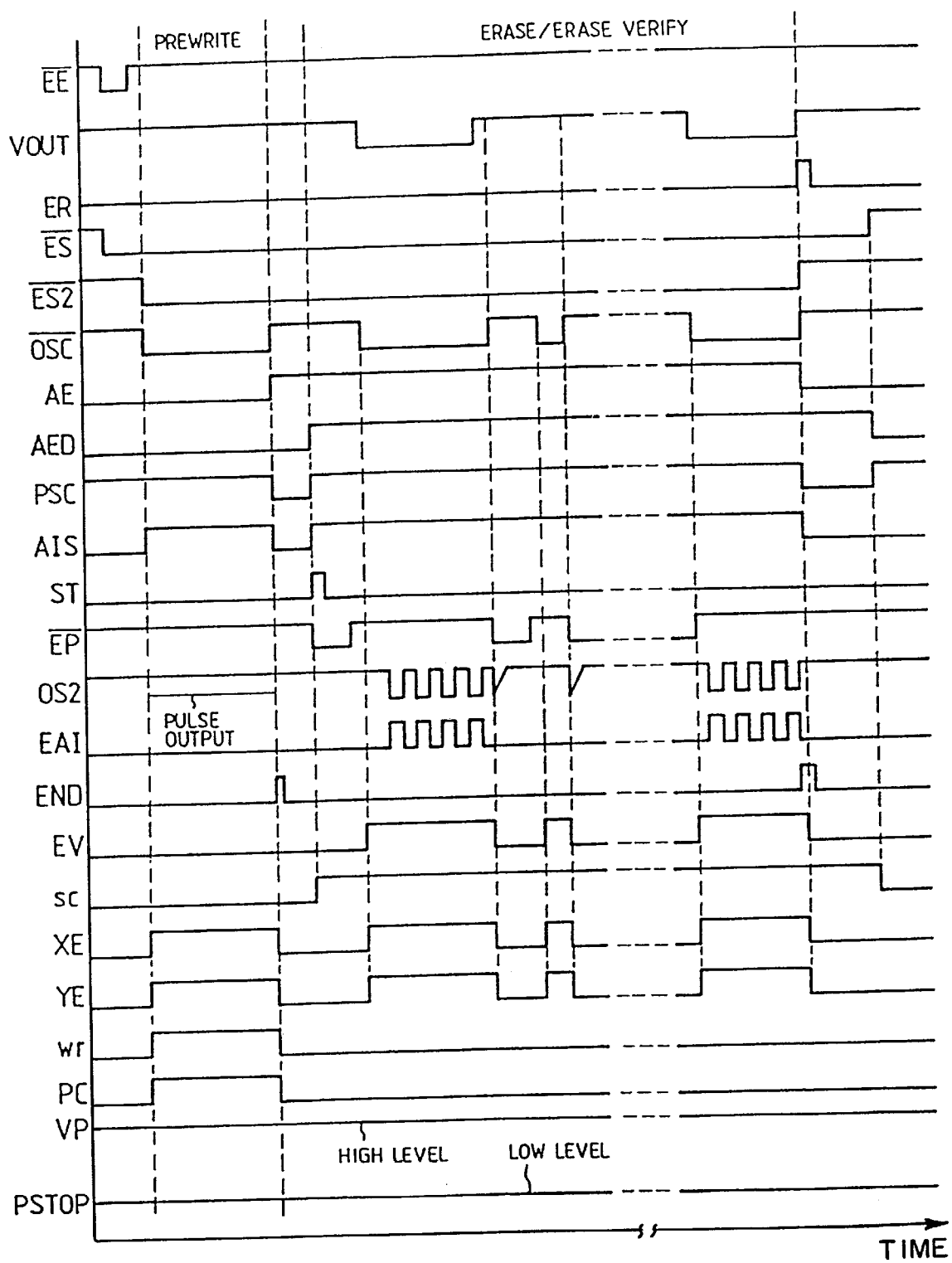
FIG. 5 is a timing chart for explaining the erasing operation.

The circuits shown in FIGS. 3 and 4 perform sequence controls so as to execute the algorithm shown in the flowchart of FIG. 2, the operations of which will be readily understood from the descriptions of the erase operation mode with reference to the operation timing chart shown in FIG. 5.

In the flowchart shown in FIG. 2, a series of prewrite operations are performed as denoted by a dash line prior to the actual erasing operation. The storage of information of the memory cell in the memory array M-ARY which is not yet erased, in other words, the threshold value voltage thereof corresponds to either a high or low voltage depending upon whether or not the above-described write operation has been carried out (i.e., whether or not the electron is injected into the floating gate), is executed during the above-described prewrite operation. In other words, this prewrite operation is performed since there are storage transistors whose threshold value voltages have been set to high values and also storage transistors whose threshold value voltages have been set to low values in the memory array M-ARY which have not yet been erased. The above-described prewrite operation is to, therefore, perform the write operation of all of the storage transistors prior to effecting an electric erasing operation. As a consequence, with respect to the memory cell wherein data has not been written (i.e., no electron is essentially injected into the floating gate of the storage transistor constituting this memory cell), namely the memory cell under the non-erasing condition, the threshold voltage value of the storage transistor thereof is prevented from attaining a negative threshold voltage value by performing the internal automatic erasing operation according to the preferred embodiment.

In this prewrite operation algorithm (FIG. 2), an address setting is executed at a first step (1). That is to say, the address counter circuit is set in such a manner that the address signal for selecting the respective memory cells is produced in the address counter circuit. When such an address is set, the address of the memory cell at which the write operation should first be performed at is produced from the address counter circuit.

At a step (2), the write pulse is produced and then the write operation (prewrite operation) is effected with respect to the memory cell designated by the address signal produced by the address counter circuit.

After this write operation, a process defined by a step (3) is performed. In this step (3), the above-described address counter circuit is incremented by +1, whereby an address increment is carried out.

Then, at a next step (4), a judgment or determination is made whether or not the address signal generated from the address counter circuit corresponds to a final address. In case that the above-described pre-write operation is not yet completed, the process is returned to the previous step (2) whereby the prewrite operation is effected. This process is repeated until a prewrite operation corresponding to the final address has been implemented. Since a determination of whether or not the prewrite operation has been performed is repeatedly made with respect to each address until the final address after the step (3), the actual judged address corresponds to the final address +1. Alternatively, the step (3) of the address increment may be provided after the step (4) where the final address is determined. In this case, when the determination made results in a "NO," the step (3) is formed in the return path from the step (4) to the step (2), whereby the address increment is carried out.

When the above-described prewrite operation is carried out until the final address (YES), the flowing erase operation will be then performed.

In a step (5), the address is initialized for the erasing operation. That is to say, the initialization of the address signal is carried out for the address counter circuit. In accordance with the preferred embodiment, since all of the cells in the flash EEPROM are erased in a batch form, this address initialization does not relate to an erasing operation of a specific address. This address initialization is required for the verify operation (erase verify) which is executed after the erasing operation.

In a subsequent step (6), an erase pulse is generated so as to erase the stored information in the flash type EEPROM in a batch form. Thereafter, the verify operation is carried out in accordance with the address setting operation in a step (7). In this verify operation, the above-described read out operation is carried out under a lower operating voltage "$V_{CV}$," e.g., 3.5V than that of the low power supply voltage Vcc (for example, 5V) which is applied via the external terminal $V_{CC}$. That is to say, the above-described low voltage "$V_{CV}$"

instead of the power supply voltage $V_{CC}$ is applied as the operating voltages to the address decoders XDCR, YDCR and sense amplifier SA. It should be noted that in this case, the power supply voltage Vcc is being applied as the operating voltage thereof to the internal circuit LOGC and to the timing control circuit CNTR. If the read out signal is "0" during this read out operation, namely the storage transistor is brought into the ON-state, the threshold value voltage of this storage transistor must necessarily be equal to less than 3.5V, which is below the operating voltages employed during the erasing condition. As a result, the process defined by the next step (8) is executed. In this step (8), the address of the address counter circuit is incremented. Then, similar to the above-described prewrite operation, a determination is made in step (9) as to whether or not the address signal produced by the address counter circuit designates the final address. If the determination results in a NO (not the final address), the process is returned to the step (7) in which the erasing verify operation similar to the above case is again performed with respect to a different address. This process is repeated until the address signal designates the final address, whereby the erasing operation is accomplished. As previously described, since all of the information stored in the memory array M-ARY are erased in the batch mode, according to the preferred embodiment, the number of erasing operations employed is determined by the storage transistor, the threshold voltage of which is set to the highest value by the write operations of all of the memory cells during the above-described erasing prewrite operation. In other words, the erase pulse is continuously applied (i.e., erasing operation) in the step (6) until the storage transistor the threshold value voltage of which has been set to the highest value can read the stored information with an operating voltage at 3.5V, namely this storage transistor has the low threshold value voltage. Thereafter, a check is made by the erasing verify operation defined in the step (7) as to whether or not this storage transistor has the above-described low threshold value voltage. That is, based upon the verify result of step (7), a decision is made whether or not the erase pulse defined in the step (6) is applied (erasing operation).

The above-described erasing operation mode will now be described with reference to an operation timing chart shown in FIG. 5 in conjunction with the detailed circuits shown in FIGS. 3 and 4. It should be understood that the above-described FIGS. 6 and 7, and also the Table will be referred to in the following description.

Under such conditions that the chip enable signal $\overline{CE}$ is set to a low level; the output enable signal $\overline{OE}$ is set to a high level; the write enable signal $\overline{WE}$ is set to a high level, and the high voltage $V_{PP}$ (for instance, approximately 12V) is applied to the external terminal $V_{PP}$, the internal chip enable signal $\overline{ce}$ and the erasing start signal $\overline{ec}$ become a low level, respectively, as is apparent from the specific circuit of the timing control circuit CNTR shown in FIG. 6 and the Table. As a result, when the erase enable signal $\overline{EE}$ is changed from the high level to the low level, then the flip-flop circuit FF1 in FIG. 3 is set accordingly.

Thus, the signal representative of the erasing mode is varied from the high level into the low level, and thereafter the operation is brought into the erasing mode. The internal signal ES2 is changed into the low level after a predetermined delay time which is defined by the delay time of the delay circuit D1. When the signal ES which is indicative of the erasing mode is changed into the high level, it is fed back to the NOR gate circuit NOR1 (FIG. 3). As a consequence, until the erasing mode signal ER is generated, the erasing mode signal ES is held by this feedback operation. Accordingly, during the erasing mode, the NOR gate circuit NOR1 does not accept changes in the signals $\overline{CE}$, $\overline{OE}$, $\overline{WE}$ and $\overline{EE}$ which typically corresponds to the internal signal ec. That is to say, the erase controlling circuit LOGC becomes unresponsive to changes in any one or more of above-described external control signals $\overline{CE}$, $\overline{OE}$, $\overline{WE}$ and $\overline{EE}$, but executes the erasing sequence operation. In other words, the change in an external control not give any influence to the internal operations by this erasing mode signal ES. In FIG. 6, for instance, the circuit for producing the decoder initializing signal DE is not susceptible to the signal $\overline{ce}$ based upon the chip enable signal $\overline{CE}$ when the above-described erasing mode signal ES becomes a high level.

Prior to an execution of the erasing operation, the above-described prewrite operation is performed. The oscillator circuit 01 in FIG. 3 is initialized in response to the address increment commencement signal AIS and the oscillator control signal OSC in accordance with the prewrite operation during which the write operation is carried out with respect to all bits for a predetermined time period. The output signal from the oscillator circuit 01 is frequency-divided by a 4-bit binary counter circuit BCS1 so as to produce a prewrite pulse "PP." As is obvious, the generation of the prewrite pulse "PP" is not limited to the formation of the frequency dividing signals OS3 and OS4 and of the prewrite control signal "PC," which are produced from the above-described frequency division, but may be performed by various other modifications.

The output signal of the counter circuit BCS1 is supplied to the binary counter circuit BCS2. This binary counter circuit BCS2 performs the operation of the address counter circuit so as to produce the internal address signals A5E, A6I ---, A2I. These address signals A5I, A6I, ---, A2I are input to the address buffer XADB and YADB. The above-described erasing mode signal ES is employed for changing the input of this address buffers XADB and YADB. The respective address buffers XADB and YADB are constructed of a plurality of unit circuits which have similar arrangements with respect to each other. In FIG. 9, there is shown the unit circuit. In the unit circuit, the input signal thereto is changed from the external address signals AX and Ay which are supplied via the external terminals AX and AY, into the internal address signals AXI and AYI, and both the internal complementary address signals ax, $\overline{ax}$, and ay, $\overline{ay}$ are produced which should be transferred to the address decoders XDCR and YDCR. That say, in accordance with the high level of the above-described signal ES, the unit circuits of the address buffers XADB and YADB do not accept the external address signals AX, and AY supplied from the external terminal, but accept the internal address signal AXI and AYI corresponding to the internal address signals A5I, A6I, ---, A2I. The above-described counter circuit BCS2, although it is not limited thereto, produces the internal address signals AXI and AYI, the number of which is the same as that of the external address signals AX and AY.

When the prewrite operation of all of the addresses belonging to the memory array has been performed, the final address signal END, shown in FIG. 5 and which corresponds to an inverted output of counter circuit BCS2 of FIG. 3, becomes a high level and the flip-flop circuit FF2 is set. As a result, the automatic erase mode setting signal AE becomes a high level, which enters into the erasing time period. In response to the internal signal PSC, both the address increment signal AIS and oscillator control signal become low levels, and the oscillator circuit 01, counter circuits BCS1 and BCS2 are reset. The delay time set by the delay circuit D2, in FIG. 3, corresponds to the preparation time period for the erasing operation, during which all of the word lines are brought into the non-selective condition, and also the data lines are discharged. Thereafter, the signal level of the erase commencement signal ST becomes high for a preselected time which is preset by the delay circuit D4, in FIG. 3, and the flip-flop circuit FF3, in FIG. 4, is set. After the time set by the delay circuit D5 has passed, the erasing pulse $\overline{EP}$ becomes a low level. As previously described, the high voltage $V_{PP}$ is applied via the erasing circuit ERC to the source of the memory cell storage transistors in accordance with the low level of this erasing pulse $\overline{EP}$. The erasing circuit ERC is exemplified in FIG. 10, although not restricted thereto. In principle, the erase signal $\overline{EP}$ is transferred to the gate of the P-channel MOSFET Q17 (FIG. 1) via an inverter circuit whose operating voltage is a low voltage $V_{CC}$, and another inverter circuit having a level shift function whose operating voltage is a high voltage $V_{PP}$, and is also transferred to the gate of N-channel MOSFET Q10 (FIG. 1) via two-staged inverter circuits whose operating voltage is a low voltage $V_{CC}$. In FIG. 10, the signal EXTE corresponds to such an external erase mode signal that is different from the internal automatic erasing mode according to the preferred embodiment only when this EEPROM is brought into the normal erase mode, namely when the erasing operation is performed only during the time period set by the external signal, this external erase mode signal is set to a high level.

Both the arrangement and operation of the above-described erasing circuit ERC are as follows. The NAND gate circuit for receiving the erasing pulse $\overline{EP}$ practically functions as an inverter circuit when the external erase mode signal EXTE is set to a low level. As a consequence, this erase pulse $\overline{EP}$ is supplied via three inverter circuits (one of which being a NAND gate) to the gate of the P-channel MOSFET (pull-up MOSFET) of a CMOS inverter circuit whose operation voltage is the high voltage $V_{PP}$, via a transfer MOSFET to which the power supply voltage $V_{CC}$ has been continuously applied to the gate electrode thereof, and via another transfer MOSFET to which the high voltage $V_{PP}$ has been continuously applied to the gate electrode thereof. The output signal from the final-staged inverter of the three inverter circuit is supplied to the gate electrode of the N-channel MOSFET (pull-down MOSFET) constituting the abovedescribed CMOS inverter circuit. Alternatively, the gate electrode of the N-channel MOSFET may be connected to the gate electrode of the P-channel MOSFET. A P-channel MOSFET which is connected as a feedback transistor for the level converting output signal received is provided between the gate electrode of the above-described P-channel MOSFET and the high voltage $V_{PP}$. In the circuit of the preferred embodiment, when the erase pulse $\overline{EP}$ becomes a low level, since the output from the final-staged inverter circuit becomes a high level, the N channel MOSFET is brought into the ON-state, and thus the output signal is set to a low level. As a result, the feedback P-channel MOSFET is brought into the ON-state, the gate voltage of the P-channel MOSFET of the CMOS inverter circuit becomes a high voltage, so that this P-channel MOSFET is set or latched to an OFF-state. Also, as the transfer MOSFET is brought into the OFF-state, there is prevented the flow of DC current from the high voltage $V_{PP}$ toward the final-staged inverter circuit which is operated by a supply voltage level corresponding to the low voltage $V_{CC}$. As a result, MOSFET Q17 becomes conducting, i.e. it is placed in the ON-state since the output signal of the CMOS inverter of the erasing circuit is set to a low level, whereby a potential of the source region of the memory cell is set at a high voltage of about $V_{PP}$. At this time, since the gate voltage of MOSFET Q10 becomes a low level, this transistor becomes nonconducting, i.e. it is brought into the OFF-state. When the erase pulse $\overline{EP}$ is set to a high level, the output of the final-staged inverter circuit becomes a low level, so that the N-channel MOSFET of the CMOS inverter becomes nonconducting, i.e. it is brought to the OFF-state, whereas the P-channel MOSFET thereof is brought to the ON-state. As a result, the output signal becomes a high level such as a high voltage $V_{PP}$, and thus the above-described P-channel MOSFET Q17 is brought into the OFF state. At this time, the feedback connected P-channel MOSFET is set in the OFF-state in response to the high level of the output signal and the gate voltage of the N-channel MOSFET Q10 becomes the high level. As a result, MOSFET Q10 is brought into the ON state thereby changing the source potential of the memory cell to about ground potential.

Returning back to FIG. 4, both the oscillator circuit 02 and binary counter BCS3 change the low level of the erase pulse end signal PE into the high level and also resets the flip-flop circuit FF3 after a time determined by these circuits has passed when the erase pulse $\overline{EP}$ is set to a low level. In accordance with the above operation, since the erase pulse $\overline{EP}$ changes its low signal level into a high signal level, the source potential of the memory cell is varied from about the high voltage $V_{PP}$ into that of about the ground potential $V_{SS}$ of the circuit by the above-described erasing circuit ERC.

After the delay time set by the delay circuit D7, the erase verify signal EV becomes a high level and returns to the erase verify mode. At this time, both the counter circuits BCS1 and BCS2 are electrically isolated in response to the automatic erasing mode setting signal "AE," which is different from the circuit condition of the prewrite operation. Then, the counter circuit BCS1 is used to produce a reference pulse for the verify operation, whereas the counter circuit BCS2 is employed so as to generate the internal address signal for the verify operation, not for the prewrite operation. That is to say, a front half period of the output signal OS2 derived from the counter circuit BCS1 becomes a high level, and a rear half period thereof becomes a low level. During the low level period, a determination is made as to whether or not the output signals S0 to S7 (in case of the 8-bit output signal) derived from the sense amplifier SA are high levels. When all bits of the signals S0 to S7 output from the sense amplifier SA become low levels, namely if the respective threshold value voltages of the eight storage transistors which have been selected by the counter circuit BCS2 are set to low levels, i.e., the erasing condition, the flip-flop circuit FF3 is not set, but in response to the verifying address increment, internal address signals AXI and AYI for designating the subsequent address are produced by the counter circuit BCS2. Another determination is performed when the signal OS2 again becomes a low level. As previously described, in response to the address increment signal produced during the verify operation, the internal address signals AXI and AYI are formed, whereby a determination is made on the memory cell in accordance with the internal address signals AXI and AYI. If an output signal associated with more than 1 bit among the output signals S0 to S7 from the sense amplifier SA is at a high level, namely there is a memory cell where even 1 bit is not erased, the flip-flop circuit 3 (in FIG. 4) is set by the NOR gate circuit NOR2 and again the erase pulse EP having the low level is generated. In response to the erase pulse EP having the low level, the above-described erase operation is executed. Then, the above-described erase verify operation is carried out again. In FIG. 5, there is shown an example where a determination is made that the stored information is erased by four addresses indicated by the internal signal OS, another determination is made that it is not erased by the fifth address, and then the verify time period is accomplished. At this time, the last pulse of the signal OS2 does not appear in the address increment signal EAI by the effect of the delay circuit D8, and is held at the address for determining that the stored information is not finally erased. In other words the address which is determined as not erased is held in the counter circuit BCS2 (in FIG. 3). As a result, the erase verify operation after the automatic erasing operation is again carried out is executed from the address determining that no previous erasing operation is effected, although it is not limited thereto. It should be noted that the basic pulse of the verify mode is the output signal OS2 of the frequency divider circuit, although it is not restricted thereto.

When the memory cells corresponding to all addresses are verified by repeating the above-described operation, the end address signal END becomes a high level after the prewrite operation is completed, and the flip-flop circuit FF2 (in FIG. 3) is reset. In accordance with the resetting operation of this flip-flop circuit FF2, the automatic erase mode setting signal AE becomes a low level, and also the erase mode end signal ER is set to a high level during the delay time which is defined by the delay circuit D9 (in FIG. 4).

The flip-flop circuit FF1 (in FIG. 3) is reset by the high-leveled erase mode end signal ER, the signal $\overline{ES}$ indicative of the erase mode is changed into the high level after the delay time preset by the delay circuit D1 has passed, and the condition where no external signal is accepted is released.

The binary counter circuit BCS4 (in FIG. 4) counts an occurrence number of the erase pulse $\overline{EP}$. Even when this counter counts the erase pulse $\overline{EP}$ at a predetermined number, and the erase mode is not yet completed as previously described, an extraordinary condition detecting signal "FAIL" is set to a high level, so that the erase mode is forcibly attained. In other words, the mode end signal ER is generated. In the logic circuit for producing this erase mode end signal ER there is shown a gate circuit into which the internal signal PSTOP and end address signal END are input. This is because this erase mode can be ended in response to the internal signal PSTOP which is produced from the external signal when the erasing operation is not effected by only the prewrite operation.

According to the above descriptions, the specific circuit of the erase control circuit LOGC shown in FIGS. 3 and 4 was mainly described in connection with the timing chart of FIG. 5. In a practical case, the respective signals generated from these erase control circuits LOGC are to control, via the timing control circuit CNTR, the address buffer, decoder and MOSFETs, and the like. In the signal generating circuit for the signals DE, SB, sc, re, wr, PG, DO and the like shown in FIGS. 6 and 7, the inputs to the external terminals $\overline{CE}$, $\overline{OE}$, $\overline{WE}$, $\overline{EE}$ are invalidated by the signals ES, AED, and the like during the erasing mode, and are internally controlled. For instance, the erasing pulse $\overline{EP}$ (FIG. 4) becomes a low level. In other words, in the time period during which the electrical erasing operation is executed, the signals DC shown in FIGS. 3 and 4 become a high level, the signal DE becomes a low level, and the respective decoders XDCR and YDCR become noninitialized. Thus, all of the word lines and also data lines are brought to the non-selective conditions. During other time periods various conditions thereof are determined by the output signal derived from the erase control circuits LOGC shown in FIGS. 3 and 4.

Figure 11:
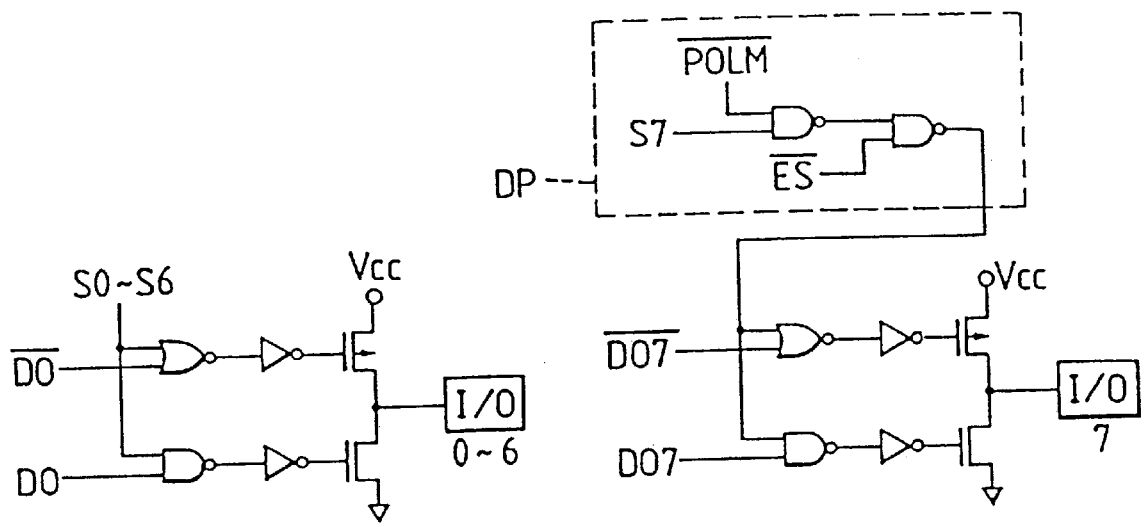
FIG. 11 is a circuit diagram of the data output buffer DOB according to a preferred embodiment.

A data polling mode corresponds to a mode for determining whether or not the flash EEPROM is under the erasing operation. As a consequence, this data polling mode can be regarded as a mode for recognizing the internal conditions of the EEPROM, namely a status polling mode. This data polling mode is set under the conditions that the chip enable signal $\overline{CE}$ is set to a low level; the output enable signal $\overline{OE}$ is set to a low level; the write enable signal $\overline{WE}$ is set to a high level; the erase enable signal $\overline{EE}$ is set to a low level; and the high voltage $V_{PP}$ is applied to the external terminal $V_{PP}$. When the data polling mode is set, a data polling control signal $\overline{POLM}$ becomes a low level in the circuits shown in FIGS. 6 and 7. At this time, a data output buffer initializing signal DO7 is set to a high level, whereas another data output buffer initializing signal DO is set to a low level. A detailed circuit of the data output buffer DOB is shown in FIG. 11. Both arrangements of the data output buffers DIB-0 to DIB-6 corresponding to the external input/output terminals $I/O_0$ to $I/O_6$, and the data output buffer DIB-7 corresponding to the external input/output terminal $I/O_7$, correspond to a 3-state output circuit including a high impedance, respectively, except for the data polling (status polling) control circuit DP. As previously described in the read out mode, when the initializing signals D0 and D07 become high levels, such an operation is executed that the output signals S0 to S7 derived from the sense amplifier SA are output after being inverted. To the contrary, since the initializing signal $\overline{POLM}$ becomes a low level in the data polling mode (status polling mode), the output signal S7 is invalidated, and the output signal of the terminal $I/O_7$ is determined in accordance with the level of the signal $\overline{ES}$ indicative of the erase mode. That is to say, since the signal ES representative of the erase mode becomes a low level during the erasing mode, the low-leveled signal is output from the external input/output terminal $I/O_7$. When the erase operation is completed, the high-leveled signal is output.

Figure 12:
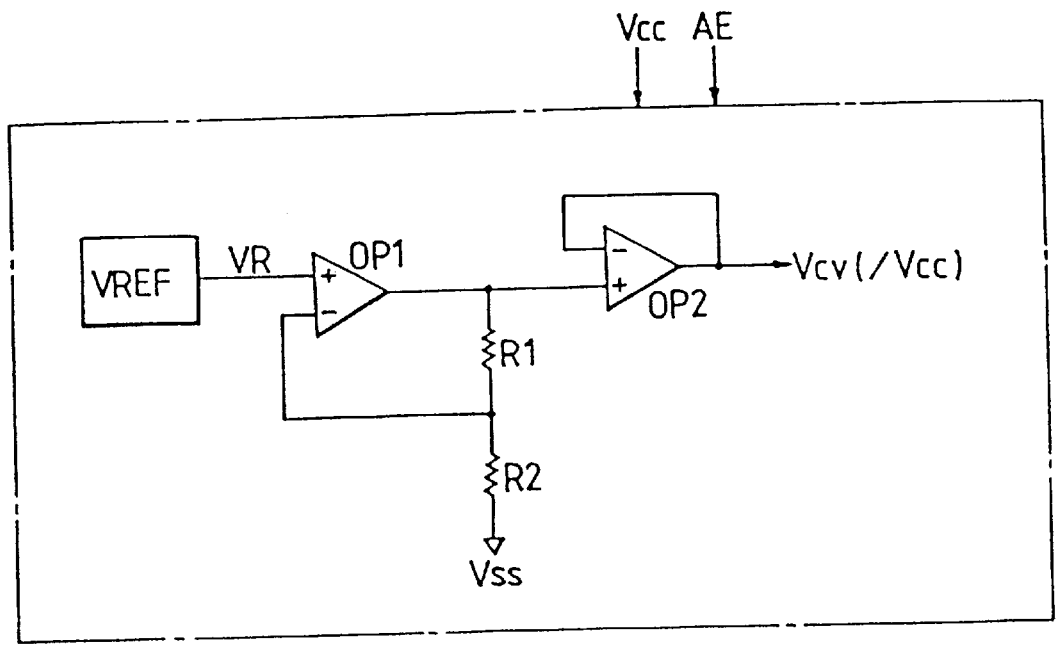
FIG. 12 is a circuit diagram of the power supply circuit, according to a preferred embodiment, for generating the erase verifying voltage $V_{CV}$.

In FIG. 12, there is shown a power supply circuit for producing the operation voltage Vcv which is supplied to the sense amplifier SA and to address decoders XDCR and YDCR during the erase verifying mode. This power supply circuit is constructed by the known reference voltage generating circuit VREF for utilizing a silicon band gap, and operational amplifier circuits OP1 and OP2. That is to say, the above-described reference voltage VR (namely, the reference voltage formed by the voltage generating circuit VREF) is voltage-amplified by the operational amplifier circuit OP1 in accordance with the gain (R1+R2) determined by the resistors R1 and R2, whereby approximately 3.5V is produced. This voltage is output via the operational amplifier circuit OP2 which is of a voltage follower type, so as to obtain the above-described voltage $V_{CV}$. The operational amplifier circuits OP1 and OP2 are initialized by the automatic erase mode setting signal AE in order to obtain the above-described voltage $V_{CV}$. As a consequence, the current consumption in the power supply circuit can be prevented during other operation modes. In case that the output circuit of the above-described operational amplifier circuit is constructed of the P-channel MOSFET and N-channel MOSFET, when the operational amplifier circuits are initialized in response to the above setting signal AE, the P-channel MOSFET is brought into the ON-state so as to output the power supply voltage $V_{CC}$ as the low voltage $V_{CC}$. With such circuit arrangements, the voltage changing functions between the voltage "$V_{CC}$" and "$V_{CV}$" can be added to the above-described power supply circuit in response to the automatic erase mode setting signal AE. It should be noted that as the above-described reference voltage generating circuit VREF, the circuit disclosed in, for instance, UK patent GB 2081458B may be employed.

The above-described operating voltage during the erase verifying operation is desirable for setting such that it is lower than the power supply voltage $V_{CC}$ required during the read mode of the flash EEPROM in order to be equal to the lower power supply voltage $V_{CC}$ min. by which the read operation can be performed with respect to the flash EEPROM. It should be noted that although the power supply is built in the circuit arrangement as shown in FIG. 12 according to the preferred embodiment, alternatively, the automatic erase mode setting signal AE may be output from the flash EEPROM, a programmable power supply externally provided may be controlled in accordance with this signal AE, whereby the resultant voltage may be applied to the circuits employed in the flash EEPROM, such as sense amplifier SA, address decoders XDCR, YDCR and so on. It should be noted that the above-described lower limit voltage $V_{CC}$ min. implies the lowest power supply voltage $V_{CC}$ (to be applied to the external terminal $V_{CC}$ of EEPROM) by which the information stored in the memory cell having the maximum threshold value voltage among the memory cells for constituting EEPROM, can be read out therefrom.

Figure 23:
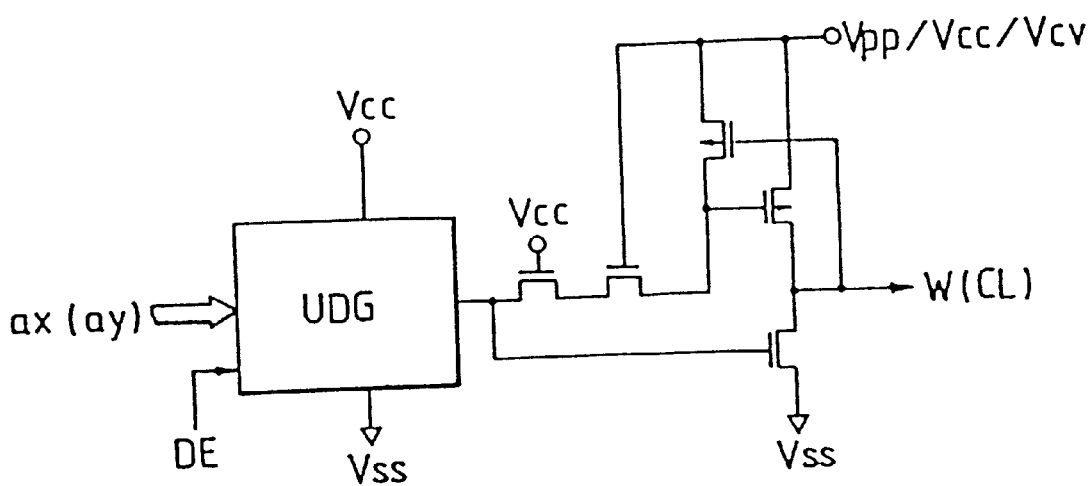
FIG. 23 is a circuit diagram of a unit circuit for constituting the address decoders XDCR, YDCR according to a preferred embodiment.

In FIG. 23, there is shown a circuit diagram of a unit circuit for constituting the address decoders XDCR, YDCR. Each of the address decoders is arranged by a plurality of unit circuits having the similar arrangements. However, a combination of internal address signals supplied with respect to each is different for each of the respective address decoder unit circuits. FIG. 23 illustrates a single unit circuit with respect to one preferred embodiment of the invention.

In FIG. 23, symbol "UDG" indicates a unit decoder circuit which is constructed of, for instance, NAND circuits for receiving the internal address signal ax (ay) and address decoder initializing signal DE. The output signal from this NAND circuit arrangement is supplied to a level converting circuit having a similar arrangement as that shown in FIG. 10. In the level converting circuit shown in FIG. 23, the high voltage $V_{PP}$, power supply voltage $V_{CC}$ and low voltage $V_{CV}$ are selectively applied from the timing control circuit CNTR to a node corresponding to the node to which the high voltage $V_{PP}$ has been applied as shown in FIG. 10. However, the power supply voltage $V_{CC}$ is constantly applied to the NAND circuit 5 UDG.

As a result, when either the write operation, or prewrite operation, is carried out, a selection signal having a voltage substantially equal to the above-described high voltage $V_{PP}$ is output from the unit circuit to the word line "W" (the selection line CL of the column switch MOSFET) which is designated by the internal address signal ax (ay) supplied from the address buffer XADB (YADB). During the read out operation, another selection signal having a voltage substantially equal to the power supply voltage $V_{CC}$ is output to the word line W (selection line CL) designated by the internal address signal ax (ay). During the verifying mode, a further selection signal having a voltage substantially equal to the above-described low voltage $V_{CV}$ is output from the address buffer XADB (YADB) to the word line W (selection line CL) designated by the internal address signal ax (ay) supplied from the address buffer XADB (YADB). When the erase operation is carried out, since the initializing signal DE is set to a low level, as described above, a voltage substantially equal to the ground potential $V_{SS}$ of the circuit is applied from all of the address decoder unit circuits to the word line W (selection line CL). It should be noted that a voltage in accordance with the ground potential $V_{SS}$ of the circuit is applied to a word line (selection line CL) which is not selected. As previously stated, during both the prewrite operation and erase verifying operation, not the external address signal AX (AY), but rather the internal address signal AXI (AYX) formed in the counter circuit is fetched by the address buffer XADB (YADB), whereby the internal address signal ax (ay) corresponding to this signal is produced.

Figure 22:
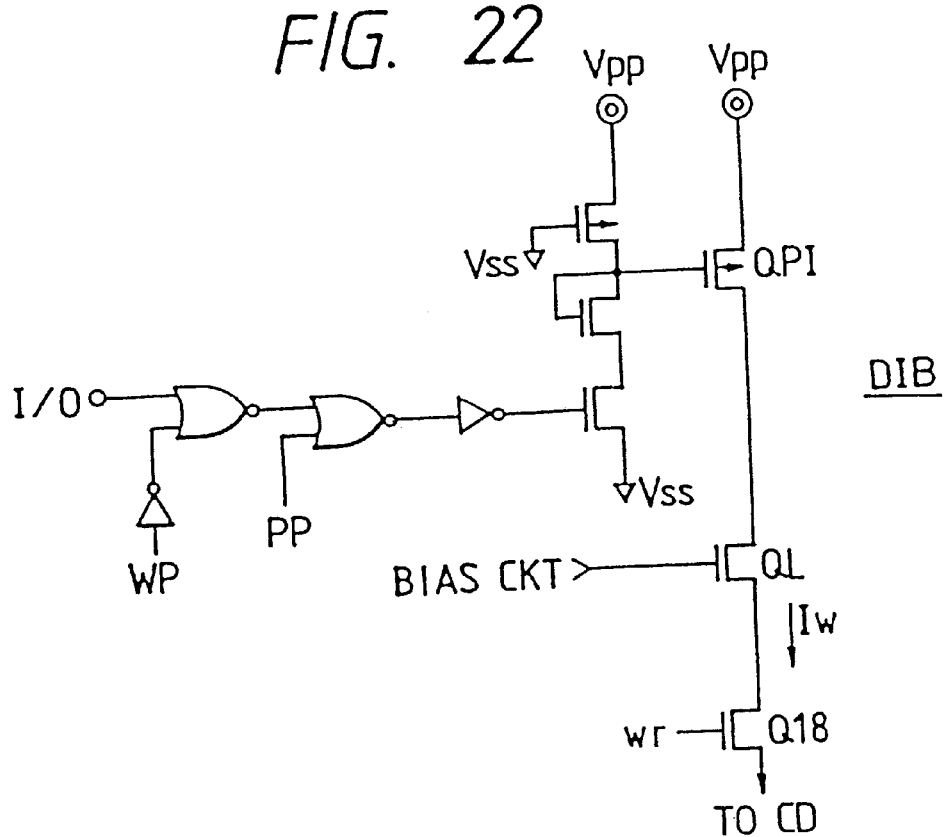
FIG. 22 is a circuit diagram of the data input buffer according to a preferred embodiment.

In FIG. 22, there is shown a circuit diagram of the data input buffer DIB according to one preferred embodiment.

This data input buffer DIB is commonly used in the case for when the data supplied from the external input/output terminal I/O is to be written into the memory cell, and also the predetermined data which is written into the memory cell during the prewrite operation. In the case of a write mode, as understandable from the herein included Table, the write mode signal WP is set to a high level, and also a prewrite pulse PP is set to a low level. As a result, the data supplied to the external input/output terminal I/O is transferred via two NOR circuits to the input node of the MOS inverter. After the data transferred to the input node is phase-inverted by the MOS inverter, it is supplied to the bias circuit where a single P-channel MOSFET QPI and two N-channel MOSFETs QL and Q18 are series-connected. The above-described data whose level has been converted into a predetermined level by the bias circuit is supplied to the gate of the writing P-channel QPI. This writing P-channel MOSFET QPI is coupled via MOSFET QL, having a gate to which a predetermined bias voltage is applied, and MOSFET Q18 to a common data line CD and is, furthermore, coupled via a selected data line to a drain of a memory cell (storage transistor) to be written. The P-channel MOSFET QPI supplies the voltage in accordance with the data to be written to the drain of the memory cell and, as a result thereof, the data of the memory cell selected is written. However, when the threshold value voltage of the storage transistor of the memory cell attains a negative value, the current Iw flowing through the MOSFET QL and the like is increased, and the voltage drop across the MOSFET QL and the like is increased. As a result of this voltage drop increase, as previously described, the data cannot be properly written. In contradistinction with this, according to the preferred embodiment, since it can prevent the threshold value voltage from becoming negative as well as the current IW from being increased, the data can be properly written in the memory cell.

It should be noted that since the signal WP becomes a low level during the prewrite operation, the data is not fetched from the external input/output terminal I/O. Instead of this operation, the prewrite pulse PP is written as write data.

Figure 21:
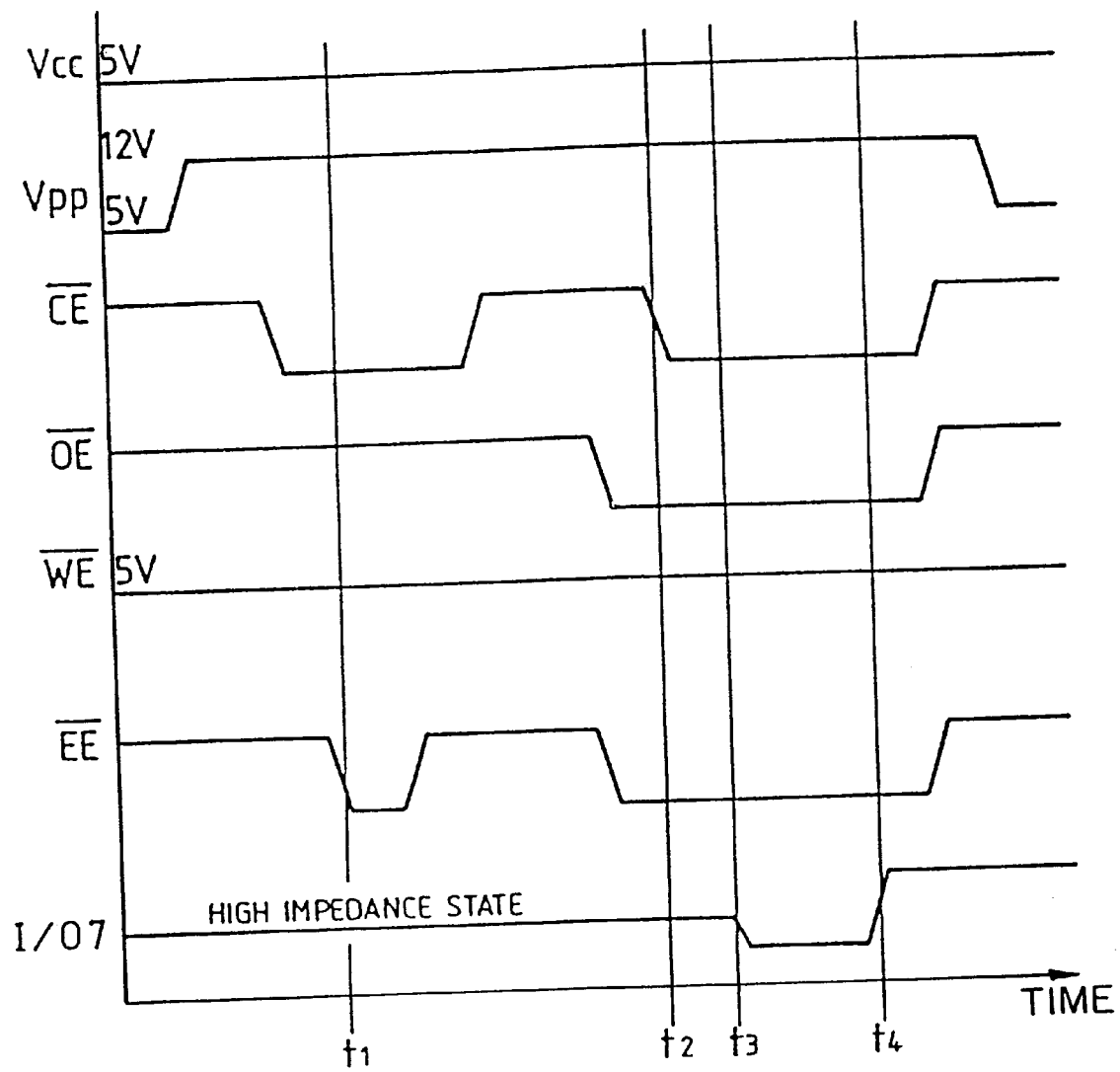
FIG. 21 illustrates one example of the externally applied signals of an EEPROM in connection with the present invention.

In FIG. 21, there is represented a timing chart for showing the external input signal and external output signal during the automatic erase mode. At a time instant "$t_1$", when the signal level of the erase enable signal EE is changed from a high level into a low level, a latch is actuated which is provided in the flash EEPROM, whereby the automatic erase mode is entered. Thereafter, until the erase operation is completed at a time instant "$t_4$", the flash EEPROM does not accept any external signal other than a combination of the external signal representative of a demand of a data polling operation. After the signal level of the erase enable signal $\overline{EE}$ is maintained at a low level for a time period more than a time period determined by the internal circuit, any combination of the external control signals of $\overline{CE}$, $\overline{OE}$, $\overline{WE}$ and $\overline{EE}$ may be available. In the automatic erase mode according to the preferred embodiment, a time period when the erase enable signal $\overline{EE}$ is maintained at the low level is used for setting the automatic erase mode to the flash EEPROM rather than for executing an actual erase operation from the memory cells thereof. As a result, the above-described constant time is required for setting the latch circuit shown in FIG. 3 to a predetermined condition, and is sufficiently shorter than a time period required for erasing a memory cell. Although the address signal is not illustrated in this timing chart, any signal combination can be accepted in order not to be internally fetched. As represented in this figure, the operation enters into the data polling mode at a time instant "t2." A data polling signal appears at the external input/output terminal I/O7 at a time instant "$t_3$" which is determined by the signal delay of the internal signal. Since the erase operation is not yet completed from the time instant "$t_3$" to the time instant "$t_4$," the output is at a low level. When the erase operation is completed at a time instant "$t_4$" the signal level is varied to the high level, so that it can detect the end of the erase operation by the external circuit of the flash EEPROM. It should be noted that the external input/output terminals $I/O_0$ to $I/O_6$ are brought into the floating condition during the automatic erase mode. The external input/output terminal $I/O_7$ is also brought into the floating state during the automatic erase mode, except for the polling mode.

Figure 24:
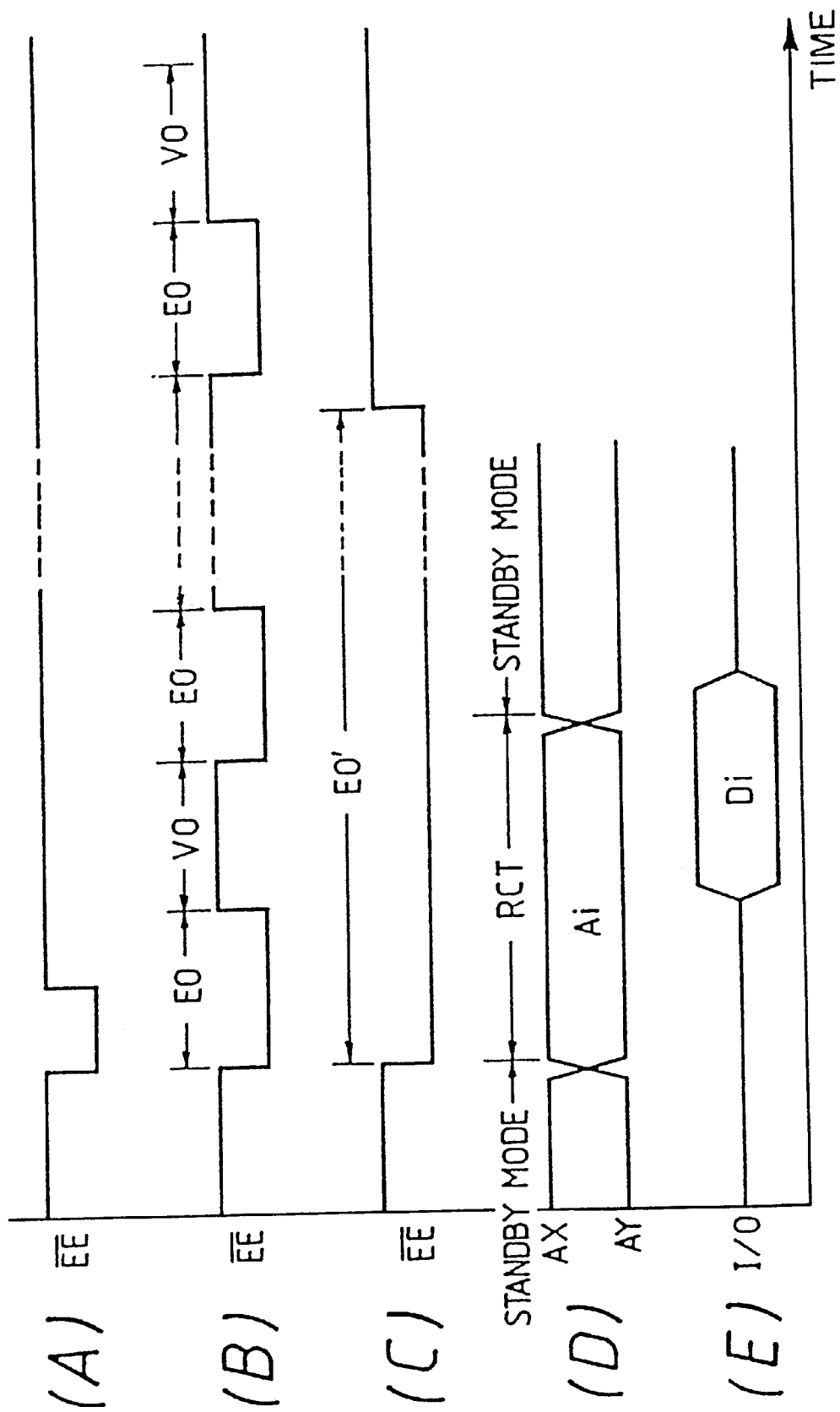
FIGS. 24(A), (B) and (C) are waveform charts of the erase enable signals.
FIGS. 24(D) and (E) are waveform charts of the read out cycle.

In FIG. 24, there are shown waveforms of the erase enable signals $\overline{EE}$ which are supplied externally when the information stored in the memory cells are to be erased. FIG. 24(A) illustrates a waveform of the erase enable signal $\overline{EE}$ during the above-described automatic erasing mode. FIG. 24(B) indicates a waveform of the erase enable signal when both the erase operation and verifying operation are externally instructed. FIG. 24(C) denotes a waveform when erasing the stored information is merely instructed by the erase enable signal $\overline{EE}$ externally. These waveforms represent those in case of the batch erasing operation. In FIG. 24(B), during a time period EO (for instance, 10 ms) in which the above-described signal $\overline{EE}$ is set to a low level, the memory cell (for example, 1 byte memory capacity) is erased. During another time period "VO" in which the above signal $\overline{WE}$ is set to a high level, the verifying operation of the memory cell (1 byte memory capacity) is actually carried out in conjunction with the read operation. In FIG. 24(C), the erasing operation is actually executed for all of the memory cells on the chip during a time period EO' (for instance, 1 second) in which the signal $\overline{EE}$ is set to a low level. In the above-described automatic erasing mode, however, the signal $\overline{EE}$ is merely set to a low level during a time in which the latch circuit and the like shown in FIG. 3 are set to a predetermined condition. As a consequence, the time during which the erase enable signal $\overline{EE}$ is held at a low level may be shorter than the time periods shown in FIGS. 24(B) and (C), e.g. 50 ns. This is because during the time period of the low-leveled erase enable signal EE in the automatic erase mode, the actual erase operation for the memory cell is not performed.

It should be noted that with respect to the internal circuit arrangements for the automatic erasing mode in connection with the preferred embodiment, the erasing mode may be performed in conjunction thereto, as shown in FIGS. 24(B) and (C).

In FIGS. 24(D) and 24 (E), there are shown external address 15 signals AX, AY and output signals at external input/output terminals I/O while the read out cycle is effected. To set the read out mode, the respective external signals are required to be set as represented in the above Table. Therefore, in these figures, both the external address signal and output signal are represented as described above. In a standby mode, for instance, the external address signals AX and AY for designating a desired address "Ai" are supplied to the EEPROM, so that the data "Di" held at this address Ai is output from the external terminal I/O. Thereafter, the EEPROM is again set to the standby mode, for instance. Since the selection of the memory cell is performed, and the sense amplifier is initialized during this read out cycle, this cycle time is required for, for example, 100 to 200 ns. Contrary to this, in the erase mode shown in FIG. 24A, the pulse width of the erase enable signal EE may be selected to be short, for instance, 50 ns as described above. As a result, an apparatus (CPU etc.) for controlling the EEPROM does not necessarily have to be occupied by an erasing operation of the EEPROM for an extended length of time, which will be discussed with reference to FIGS. 14 and 15. The pulse width of this erase enable signal $\overline{EE}$ (FIG. 24(A)) may be set to be shorter than the time period required for practically erasing the memory cell. This is because, as previously described, the actual erasing operation is not performed in response to this erase enable signal $\overline{EE}$, but that the erasing operation is instructed to the EEPROM.

In the above-described preferred embodiment, the erase verifying operation was performed for all of the addresses, however, the present invention is not limited thereto. The erase verifying operation may be varied in accordance with a degree of controlling a required threshold value voltage after the erasing operation. For instance, only one data line may be verified and only one typical bit (of a memory cell) may be verified in a specific case. In the case wherein the abovedescribed verifying power supply voltage $V_{CV}$ is set to be sufficiently lower than the required readable lower limit voltage $V_{CC}$ min., a lower limit power supply voltage $V_{CC}$ min. by which the data can be sufficiently read can be maintained even by such a method. It should be noted that symbol "PSTOP" shown in FIG. 5 is a signal for a test purpose.

Figure 13:
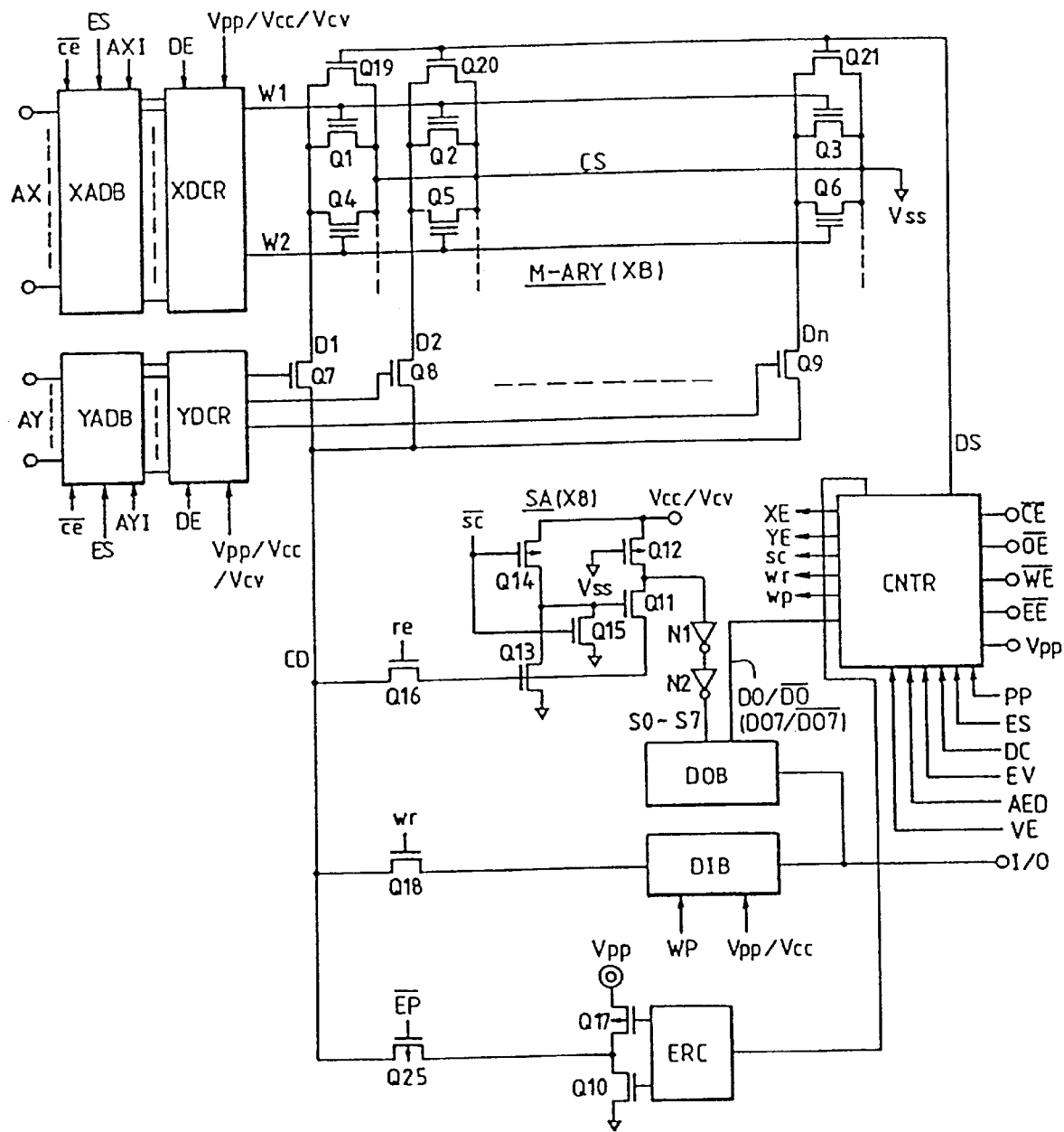
FIG. 13 is a circuit diagram of a memory array unit of an EEPROM according to another preferred embodiment.

FIG. 13 represents a circuit diagram of another preferred embodiment of an EEPROM to which the present invention is applied. In this preferred embodiment, there are only shown a single memory array and a peripheral circuit thereof, which is similar to the previous embodiment shown in FIG. 1. An overall circuit of this embodiment will be referred to the circuit shown in FIG. 20.

In accordance with the memory cell of an EEPROM according to the preferred embodiment, the erasing operation is electrically performed at the drain region side, instead of the source region side as performed in the previous preferred embodiment.

That is to say, a source line of a memory array M-ARY is fixedly connected to a ground potential point Vss of a circuit thereof according to this preferred embodiment.

The combination of an erasing circuit ERC, the above-described P-channel MOSFET Q17 switched by this erasing circuit, and an output node of an N-channel MOSFET Q10 are coupled to a common data line CD via a P-channel type switching MOSFET Q25. The switching MOSFET Q25 has a gate to which the above-described erasing pulse $\overline{EP}$ is applied. As a result, the switching MOSFET Q25 is brought into the ON-state during a time period in which the erasing pulse $\overline{EP}$ is set to a low level, and a high voltage $V_{PP}$ which is output via a P-channel MOSFET Q17 is transferred to the common data line CD. This P-channel MOSFET Q17 is brought into an ON-state based upon the low level of the erasing pulse $\overline{EP}$. In order to erase all of memory cells within the memory array M-ARY in a batch mode, an address decoder YDCR enables all of column switch MOSFETs Q7 to Q9 to be turned ON so as to transfer the high voltage $V_{PP}$ of the above-described common data line CD to the data line in response to, for instance, the erasing pulse $\overline{EP}$. Instead of this arrangement, if the column decoder YDCR produces a selection signal in accordance with an internal, or external address, an erasing operation can be effected in a unit of a data line. Accordingly, the control of the address decoder YDCR of the EEPROM according to the preferred embodiment is different from that of the preferred embodiment shown in FIG. 1 during the erasing operation, wherein description thereof of portions which are the same as that shown in FIG. 1, reference should be made to FIG. 1.

Figure 14:
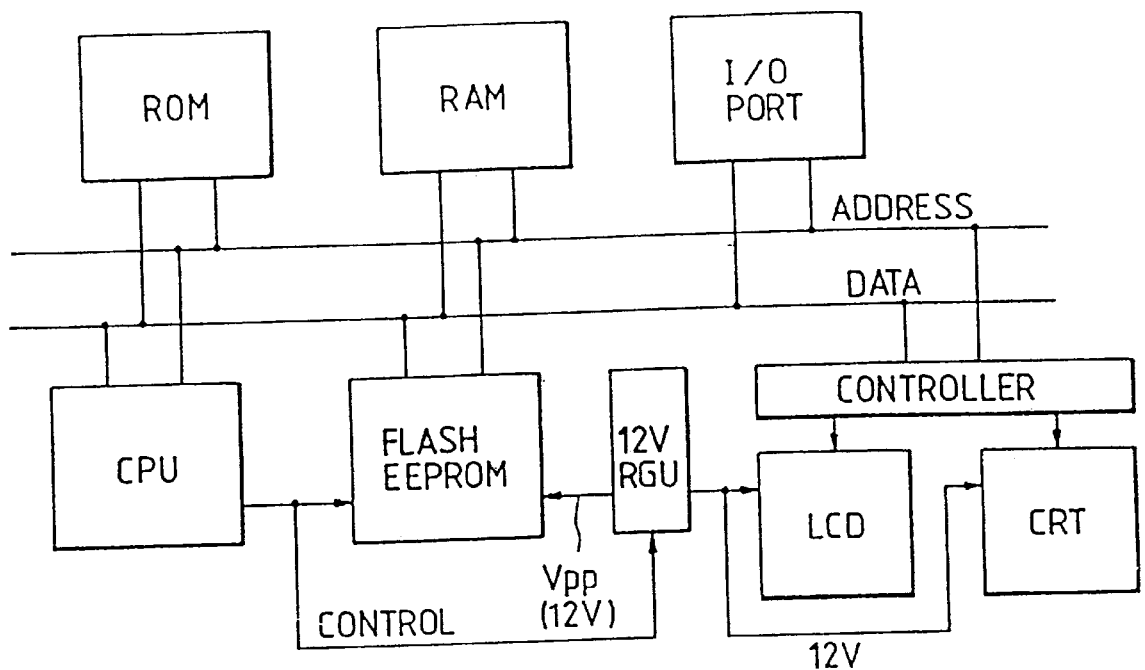
FIG. 14 is a schematic block diagram of a microcomputer system employing an EEPROM, according to a preferred embodiment.

In FIG. 14, there is shown a block diagram of a microcomputer system employing a flash type EEPROM according to the present invention.

In the microcomputer system according to the preferred embodiment, there is included: a ROM (read only memory) for storing a program and the like, a RAM (random access memory) employed as a main memory device, an input/output port I/O PORT, the above-described flash type EEPROM according to the present invention interconnected to a microprocessor CPU, and either a liquid crystal display device or a CRT (cathode ray tube) connected via a control circuit CONTROLLER as a monitor via a control bus for transferring a control signal CONTROL to an address bus ADDRESS and a data bus DATA.

Figure 15:
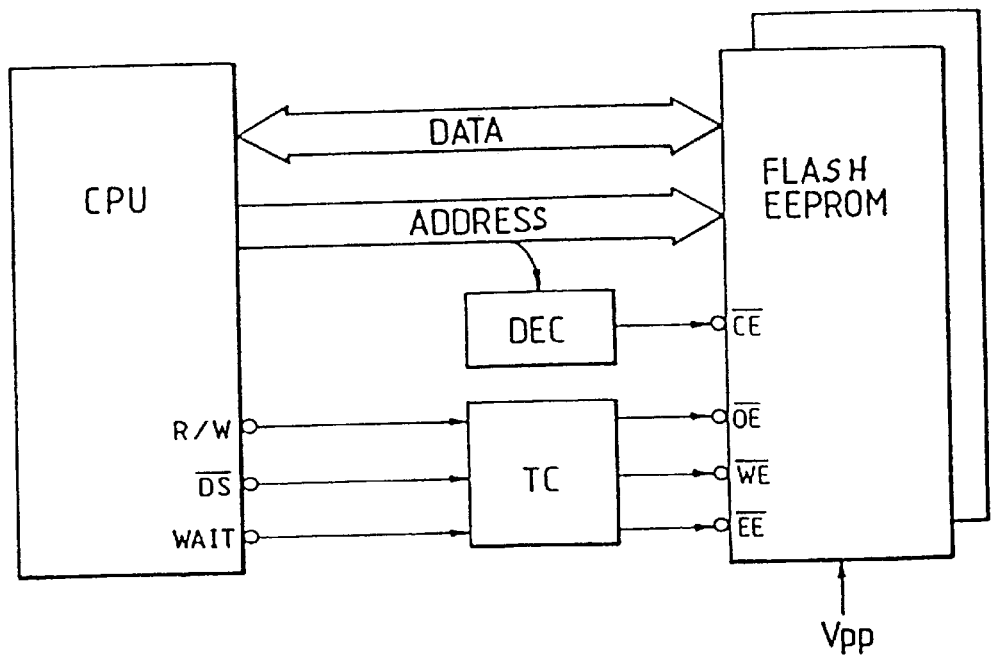
FIG. 15 is a schematic block diagram for illustrating connections between an EEPROM and a microprocessor CPU, according to a preferred embodiment.

In accordance with the preferred embodiment, a 12V power supply RGU required for the above-described display device LCD and CRT may be utilized as the high voltage $V_{PP}$ for the flash type EEPROM. As a consequence, such a changing function is additionally provided with this power supply RGU that in response to a control signal from the microprocessor CPU, the terminal $V_{PP}$ is changed into $V_{CC}$, such as 5V, during the read out operation. In FIG. 15, there is shown a connecting relationship diagram with respect to various signals between the microprocessor CPU and EEPROM.

At a chip enable terminal $\overline{CE}$ of the EEPROM, a chip enable signal $\overline{CE}$ is generated by supplying an address signal indicative of an address domain which has been allocated to the EEPROM among a system address, to a decoder circuit DEC. A timing control circuit TC produces an output enable signal $\overline{OE}$, a write enable signal $\overline{WE}$, and an erase enable signal $\overline{EE}$ in response to a R/W (read/write) signal, a $\overline{DS}$ (data strobe) signal and a WAIT signal. It should be noted that a data terminal of the microprocessor CPU is coupled via a data bus to the external input/output terminals $I/O_0$ to $I/O_7$ of the EEPROM, whereas an address terminal of the microprocessor CPU is coupled via an address bus to the external address terminals AX and AY of EEPROM.

In accordance with the microprocessor system of the preferred embodiment, since the EEPROM has an automatic erasing function, the microprocessor CPU produces the signal $\overline{CE}$ by addressing the EEPROM and produces the signals $\overline{OE}$, $\overline{WE}$, and $\overline{EE}$ for designating the erase mode shown in FIG. 21 by combining the above-described signals R/W, $\overline{DS}$ and WAIT. Thereafter, the EEPROM is entered into an internal automatic erasing mode, as described above. When the EEPROM is brought into the erasing mode, the address terminal, data terminal and all of the control terminals become free, and the EEPROM becomes electrically isolated from the microprocessor CPU. Consequently, the microprocessor CPU merely designates the erasing mode with respect to the EEPROM, whereby then, it can perform data processing by employing the system bus where information can then be transferred/received between other memory devices, e.g., ROM and RAM, and otherwise with the input/output port. As a consequence, a flash type EEPROM can be erased under the condition that it is actually packaged with the system, which is similar to the full function (writable with a byte) EEPROM, without sacrificing the throughput capability of the system. In the microprocessor CPU, after the above-described erasing mode is designated, the above-described data polling mode is designated for the above EEPROM at a proper time interval, a determination is made as to whether or not the signal level at the input/output terminal I/O7 among the data bus corresponds to a logic low level or a logic high level so as to ascertain whether or not the erasing operation is completed, and when the erasing operation is ended and there is data to be written into the EEPROM, the microprocessor instructs the write operation.

The particular advantages of the above-described preferred embodiment are as follows.

(1) In an EEPROM comprising a memory array in which the electrically erasable nonvolatile storage elements are arranged in a matrix form, the erasing control circuit is built in which after the erasing operation is completed in accordance with an externally supplied erasing operation instruction, the corresponding memory cell is read at least one time, and the continuation and interruption of the erasing operation is controlled based upon the read information. As a result, since the EEPROM per se owns the erasing confirmation function, namely the above-described automatic erasing function in conjunction with the read out operation, the erasing operation can be implemented while the EEPROM is loaded on the system without loading the microprocessor.

(2) Since the prewrite function, by which the write operations are performed for all memory cells prior to the above-described erasing operation, is added to the above-described erasing control circuit, the developing of a negative threshold value voltage in those memory cells in which data is not written can be prevented by performing the erasing operation.

(3) As the above-described memory cell, a MOSFET type is employed which has a double layer gate structure of the control gate and floating gate. The electrical erasing operation is carried out by drawing the information charges which have been stored in the floating gate into the drain or well while utilizing the tunnel phenomenon, whereby the occupied area of the memory cell becomes small, and the large memory capacity can be realized.

(4) In the memory cell for constituting the memory array, the sources and drains of the overall memory array, or a portion of memory cell groups are commonly utilized. The electrical erasing operation is performed in a batch mode of the commonly used memory cells, so that the memory cell can be fabricated in a small area as described above.

(5) The address circuit for sequentially selecting the memory cell is employed as the erasing control circuit, so that the verifying operation for performing the prewrite operation and erasing confirmation can be executed for all of the memory cells.

(6) While the verifying operation of the memory cells is effected so as to control the continuation and interruption of the erasing operation, the selection potential of the word line transferred to the control gate is set to such a low voltage, e.g., approximately 3.5V, corresponding to the readable lower limit voltage $V_{CC}$ min. below the low voltage $V_{CC}$, whereby the erasing operation can be sufficiently guaranteed.

(7) As the power supply circuit for generating the selection potential of the word line at the relatively low voltage $V_{CV}$, the first operational amplifier circuit for receiving the reference voltage produced by the reference voltage generating circuit and for converting this reference voltage into a desirable output voltage, and also the second operational amplifier circuit of the voltage follower mode for producing the output voltage by receiving the output signal from the first operational amplifier circuit, are fabricated. A desirable voltage arbitrarily set can be obtained with high precision without being adversely influenced by the fluctuations in the element manufacturing process.

(8) The data polling function by which the internal conditions on the continuation and interruption of the erasing operation are output externally in response to the instruction externally given to the EEPROM is additionally provided with the EEPROM, so that the memory supervising operation effected by the microprocessor can be simply achieved.

(9) An EEPROM is packaged with the microcomputer, and the erasing operation is automatically performed by the internal erasing control circuit under the condition that the EEPROM is electrically isolated from the microprocessor in response to the erasing instruction supplied from the microprocessor. The erasing operation of the EEPROM can be performed under the on-board condition without deteriorating the throughput capability of the microcomputer system.

(10) According to such a semiconductor nonvolatile memory device, there is effected: a memory array where electrically erasable nonvolatile memory elements are arranged in a matrix form and selected by a single gate signal line (a word line) and a single drain signal line (a data line), characterized in that an erasing operation is commenced in response to an externally supplied erasing instruction; thereafter the erasing operation is automatically carried out irrespective of an address signal, input data, and a control signal which are supplied externally; and after the erasing operation is completed, a desired operation is available in response to the externally supplied address signal, input data, and control signal.

(11) In accordance with such an information processing system, there is also effected: a semiconductor nonvolatile memory device including a memory array where electrically erasable nonvolatile memory elements are arranged in a matrix form and selected by a single gate signal line (a word line) and a single drain signal line (a data line), characterized in that an erasing operation is commenced in response to an externally supplied erasing instruction; thereafter the erasing operation is automatically carried out irrespective of an address signal, input data, and a control signal which are supplied externally; and after the erasing operation is completed, a desired operation is available in response to the externally supplied address signal, input data, a control signal and a microprocessor having a predetermined information processing function; and, a system bus for connecting said semiconductor nonvolatile device with said microprocessor, said semiconductor nonvolatile memory device being electrically separated in accordance with the erasing instruction derived from the microprocessor, and the erasing operation being automatically executed by an internal erasing control circuit.

(12) A semiconductor nonvolatile memory device has been realized which is an electrically writable/erasable nonvolatile memory arranged in a matrix form and constructed by a column and a row, characterized in that an erasing operation is commenced by inputting a single pulse having a time period less than a readout cycle time; thereafter the erasing operation is carried out irrespective of an address signal, data signal, and a control signal which are externally inputted; and after the erasing operation is completed, the address signal, data signal, and control signal are accepted.

(13) An information processing system as that implemented in accordance with the present invention includes: a semiconductor nonvolatile memory device having an electrically writable/erasable nonvolatile memory arranged in a matrix form by a column and a line, and connected to a microprocessor and a system bus, is further characterized in that the erasing operation thereof is commenced during an erasing mode by inputting a single pulse having a time period less than a readout cycle time; thereafter the erasing operation is automatically performed irrespective of an address signal, data signal, and a control signal derived from the system bus; and after the erasing operation is completed, a signal supplied from the system bus is received.

(14) In accordance with the present improvements, the memory cell which has the lowest threshold value voltage among the memory cells present can be prevented from developing a negative threshold value voltage during the erasing operation, and also the erasing operation by the EEPROM can be automatically controlled by the internal erasing control circuit in such a manner that the memory cell having the highest threshold value voltage owns the threshold value voltage at which the reading operation is available with the lower limit voltage $V_{CC}$ min. due to the erasing operation.

While the foregoing aspect of the present invention has been described above with reference to the various preferred embodiments, this aspect of the present invention is not limited thereto, but may be changed without departing from the technical scope and spirit of the invention.

Figure 19A:
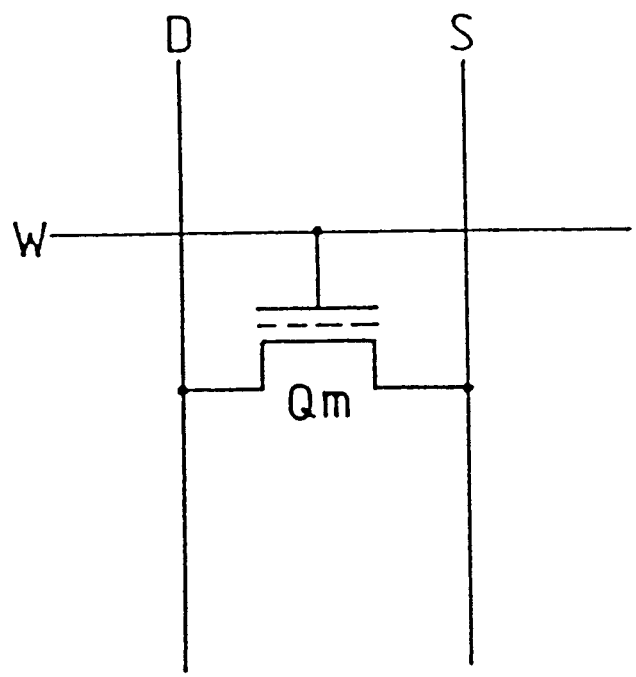
FIG. 19(A) is a circuit diagram of a memory cell employed in an EEPROM to which the present invention is applied.
Figure 19B:
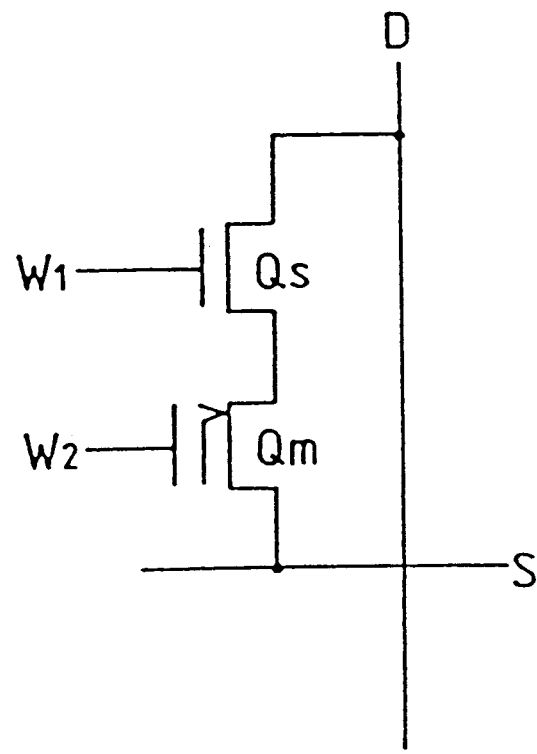
FIG. 19(B) is a circuit diagram of the conventional memory

For instance, the signals FAIL and ER may be output externally from the EEPROM. In this case, it is preferable to output such signals by utilizing the above-described data polling function in order to avoid an increase in the total number of the external terminals. Also, the data input/output terminals $I/O_5$ and $I/O_6$ are circuits similar to the data output circuit corresponding to the data input/output terminal $I/O_7$ shown in FIG. 11, and the signals FALL and ER may correspond to the gate to which the signal $\overline{ES}$ is supplied. Similarly, the signal indicative of the other internal operating sequence may be externally output, if required. As to the erasing operation of the memory array M-ARY, the source lines and word lines may be independently subdivided, and then a memory block to be erased may be designated by a combination of the subdivided lines. As to the storage transistor for constituting the memory cell, a MOS transistor having a stacked gate structure employed in the EPROM may be utilized as well as a FLOTOX type storage transistor where a writing operation is also effected by utilizing the tunnel phenomenon. In the previous embodiments, a single storage transistor shown in FIG. 16 was used as a single memory cell. Alternatively, a single storage transistor represented in FIG. 16 (in this case, two transistors are practically regarded as a single transistor) may be utilized as a single memory cell. In other words, the present invention is particularly suitable for such an EEPROM wherein a single storage transistor as shown in FIG. 19A is used as one memory cell. However, the present invention may also be applied to another EEPROM having the memory cell shown in FIG. 19B (one memory cell is constructed of two transistors, and defined by two word lines and one data line). The high voltage $V_{PP}$ utilized for writing/erasing the data is not limited to that of a high voltage which is externally applied. That is to say, if the small current flows during the writing/erasing operation, such a high voltage may be obtained by utilizing a boosted voltage from the power supply voltage Vcc inside the EEPROM by means of a known charge pump circuit, for example. Alternatively, a combination between this internal boosting power supply and the external high voltage $V_{PP}$ may be utilized so as to obtain the high voltage. The arrangements of the circuit portion (CNTR) for controlling the normal write/read operations of the EEPROM, and also of the circuit portion (LOGC) for controlling the erasing algorithm thereof, may be constituted by any type of circuit arrangements capable of performing the above-described operation sequence. In other words, these circuit arrangements may be fabricated by not only the random logic circuit, but also a programmable logic array (PLA), a combination between a microcomputer and a program with respect to software associated therewith, or a synchronization circuit, although the circuit of the previously described preferred embodiment was arranged using non-synchronization circuits, as shown in FIGS. 3, 4, 6 and 7. As described above, as the circuit for realizing such an operation sequence, various types of circuit arrangements may be employed.

Also, various types of circuit arrangements may be utilized as specific circuit arrangements for the memory array and peripheral circuits constituting the EEPROM. In addition, the EEPROM and the like may be built in a digital semiconductor integrated circuit device such as a microcomputer.

This aspect of the present invention may be broadly utilized in connection with a storage transistor having the stacked gate structure employed in the EPROM and with a semiconductor nonvolatile memory device employing the FLOTOX type storage transistor, and furthermore with respect to an information processing system employing such a semiconductor nonvolatile memory device.

It should be noted that, in accordance with this aspect of the present invention, although the pair of regions in connection with the storage transistors were defined, in the above descriptions, as the source region and drain region thereof, such source region and drain regions may alternatively be read as one region (node) and another region (node) of the storage transistor, the source and drain, of course, being determined in accordance with the relative values of the applied voltages.

Figure 25:
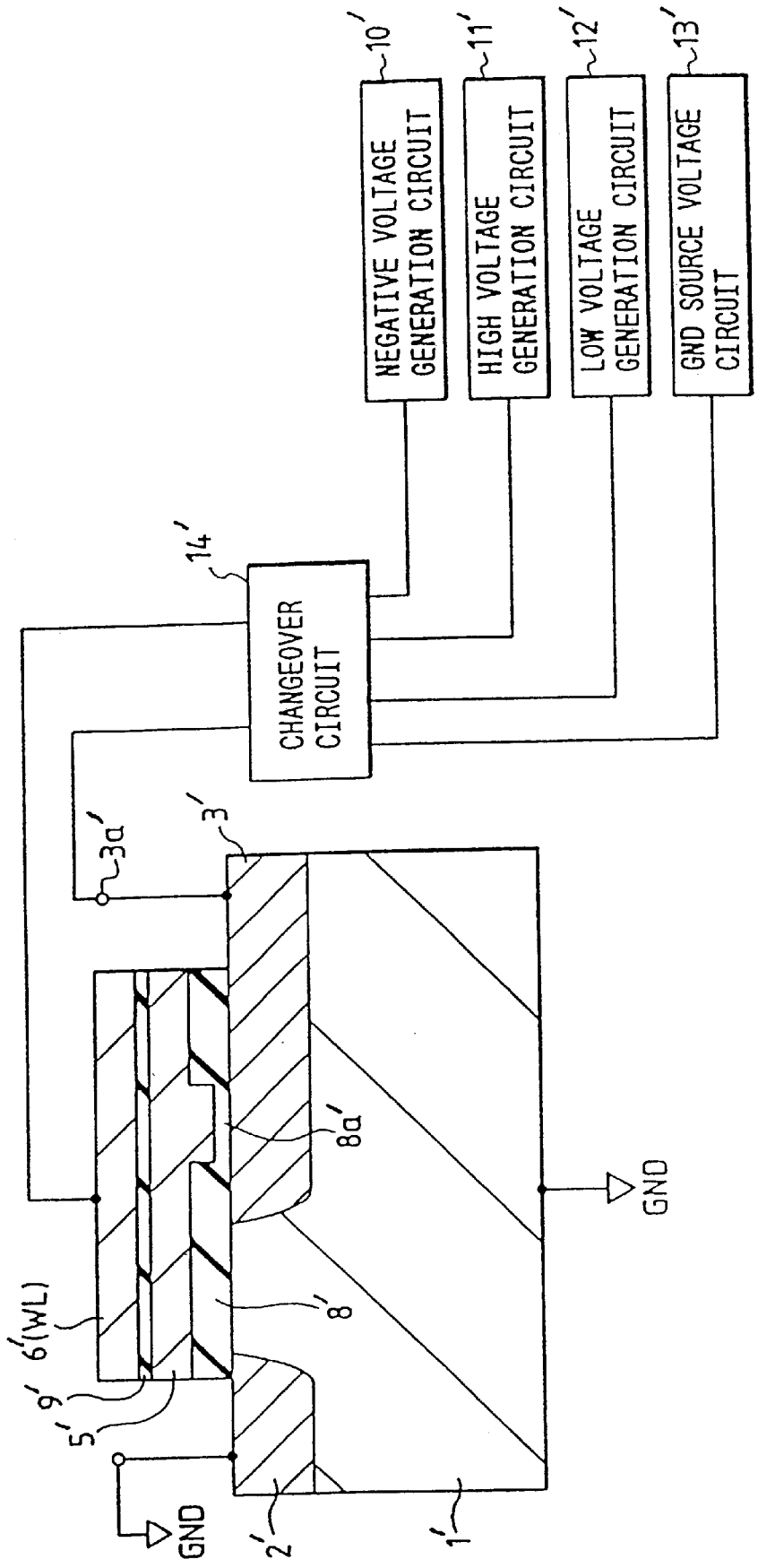
FIG. 25 is an explanatory view schematically showing a section of a memory cell of an EEPROM, according to one embodiment of the present invention, and circuit connections.
Figure 26:
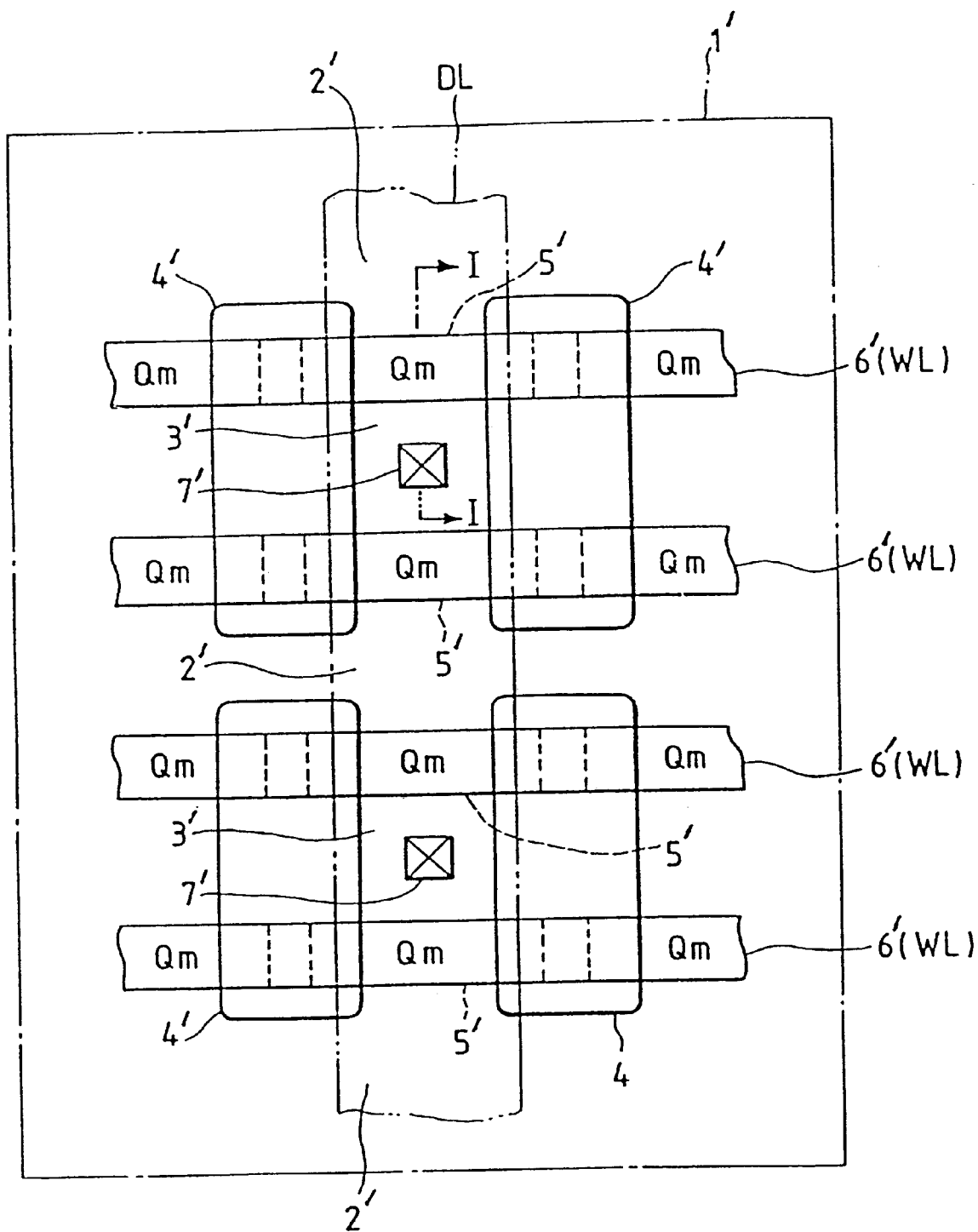
FIG. 26 is a plan view of a semiconductor substrate showing a memory cell array of an EEPROM.
Figure 27:
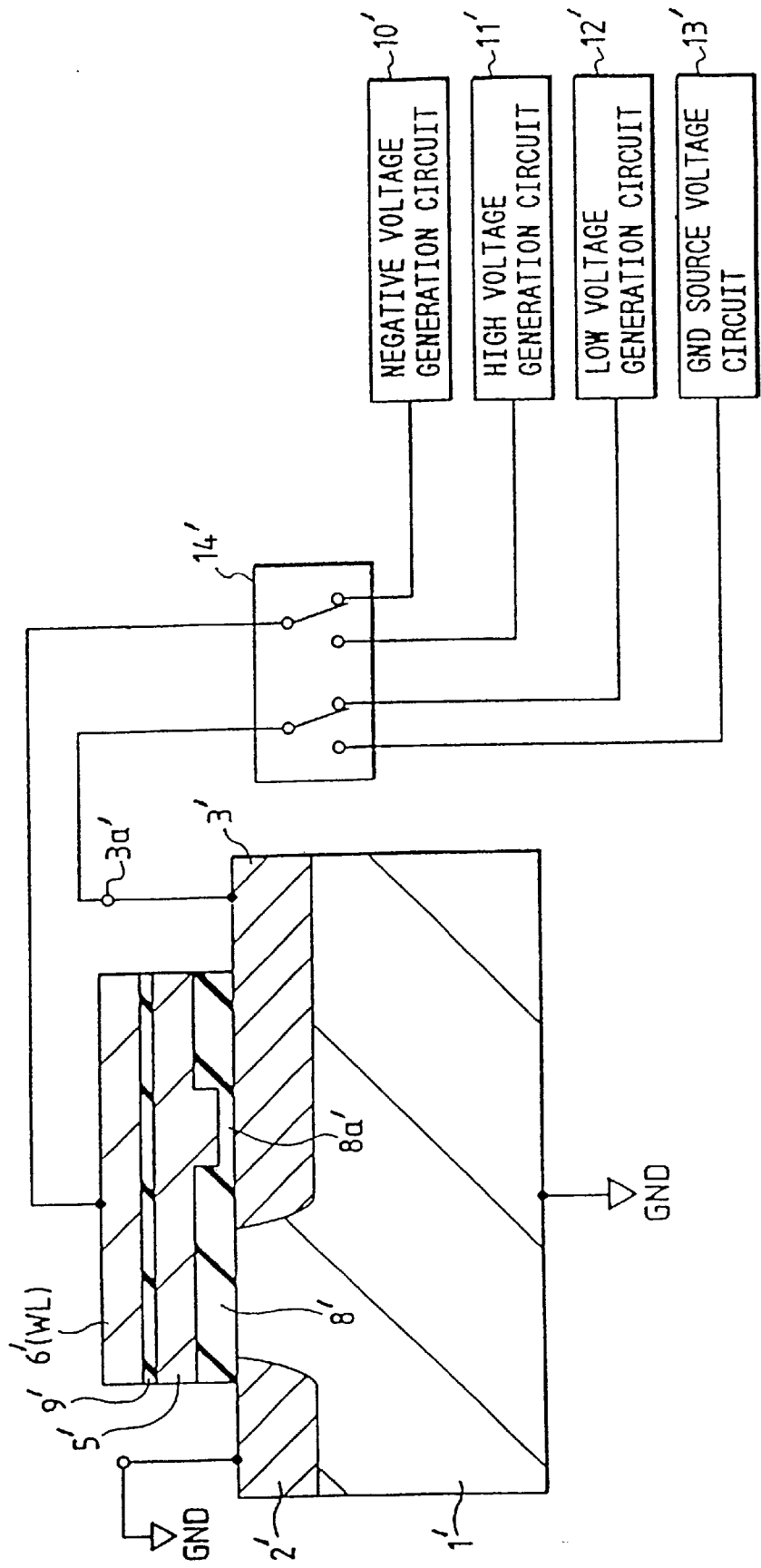
FIG. 27 is an explanatory view showing a circuit connection for emission of electrons from a floating gate.
Figure 28:
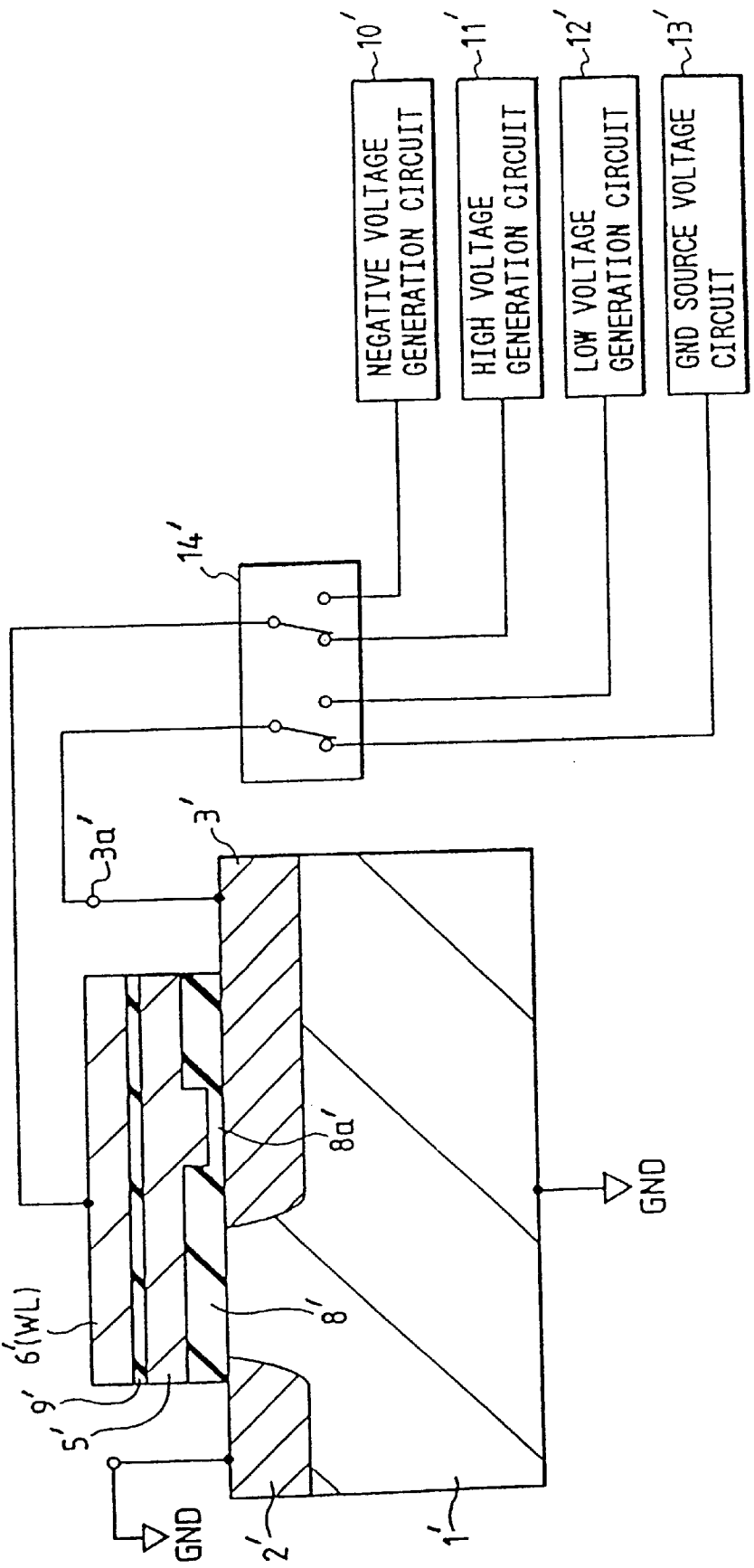
FIG. 28 is an explanatory view showing a circuit connection for emission of electrons to a floating gate.
Figure 29:
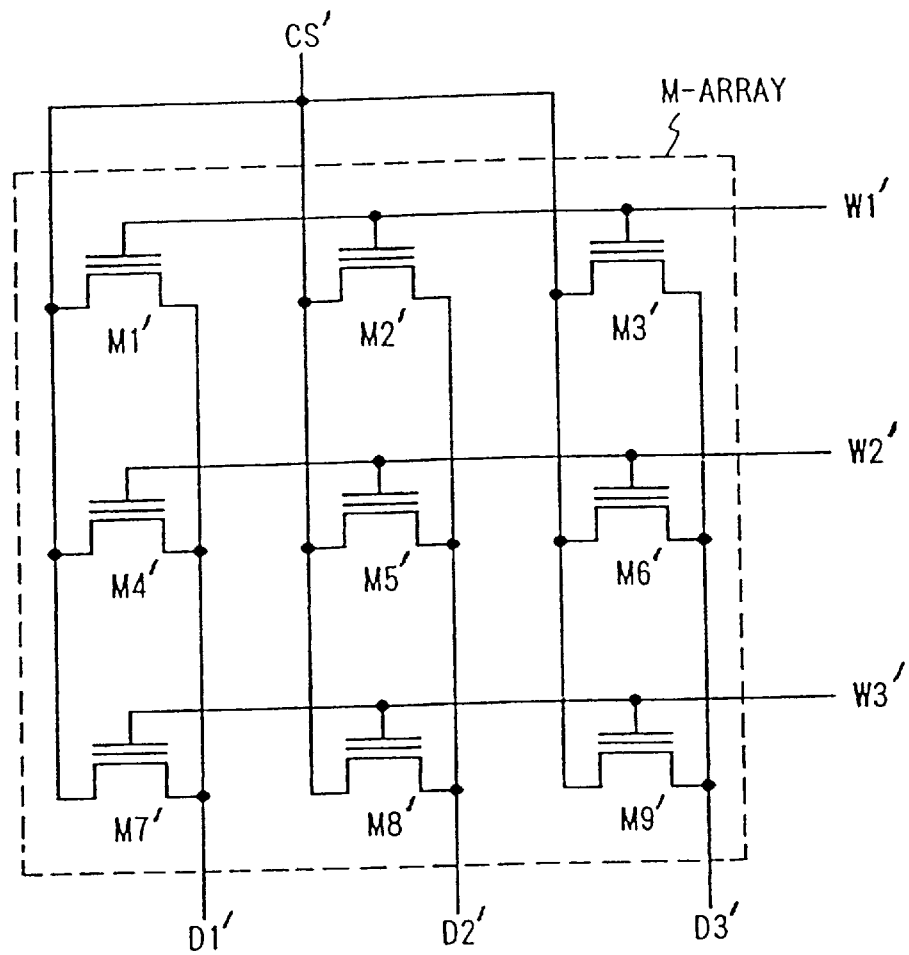
FIGS. 29 to 31 are respectively views showing a circuit for explaining the principle of the present invention and working voltages.
Figure 30:
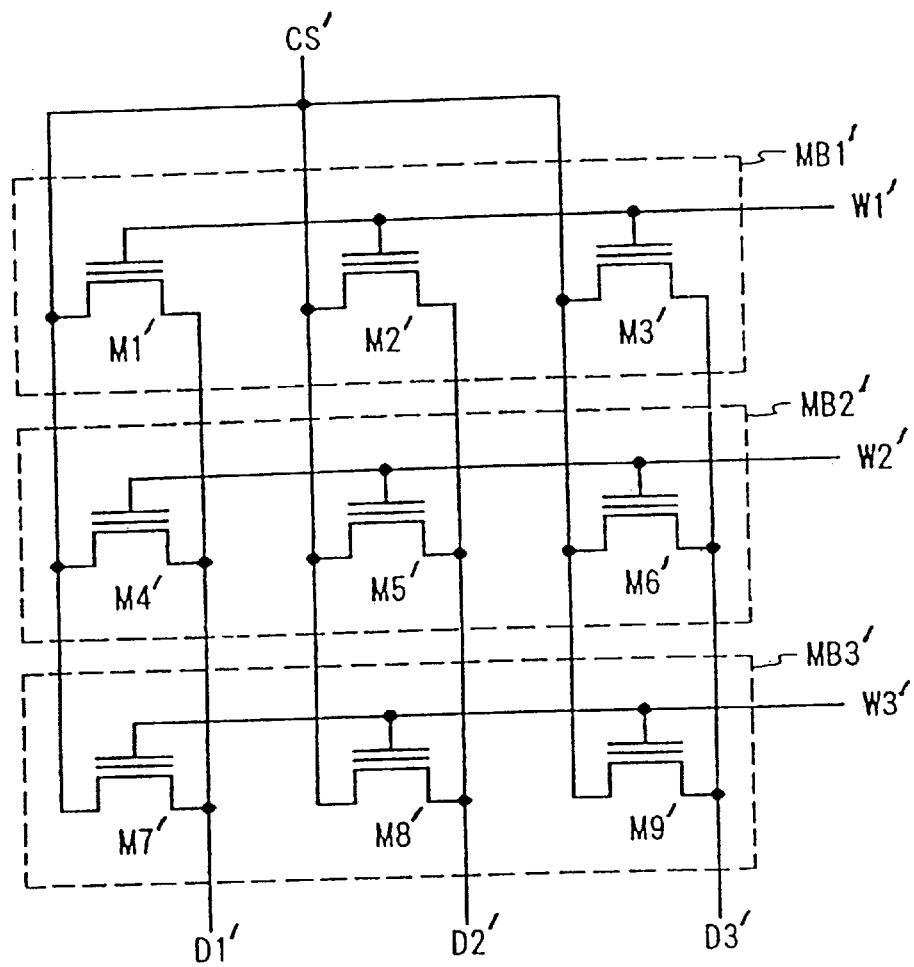
Figure 31:
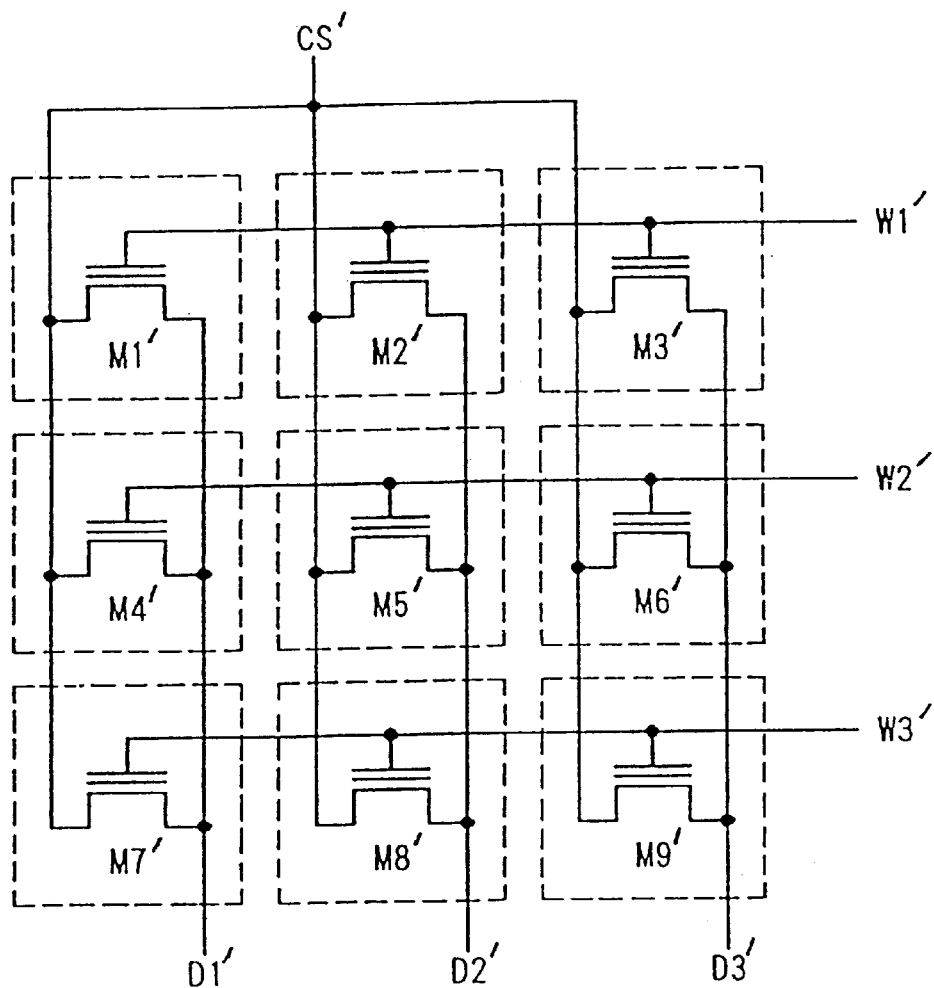

As another aspect of the present invention, FIG. 25 is an explanatory view schematically showing a section of a memory cell of an EEPROM according to one embodiment thereof and a circuit connection thereof, FIG. 26 is a plan view of a semiconductor substrate showing a memory cell array of this EEPROM, FIG. 27 is an explanatory view showing a circuit connection in emitting electrons from a floating gate, and FIG. 28 is an explanatory view showing a circuit connection in injecting electrons into the floating gate.

A nonvolatile semiconductor memory device according to the present embodiment is an EEPROM of a FLOTOX type.

The plan structure of a memory cell array of an EEPROM according to the present embodiment will be described hereinafter with reference to FIG. 26. In FIG. 26, insulated films other than field insulated films are not shown for simplifying the description.

On a semiconductor substrate (hereinafter referred to as a substrate) 1' formed, for example, of a p-type silicon (Si) single crystal, are arranged source regions 2' formed, for example, of an $n^+$-type diffusion layer and drain regions 3' so that these regions are opposed to each other for every memory cell Qm of the EEPROM.

The drain regions 3' are separated for every memory cell Qm of the EEPROM through island-like field insulated films 4', formed of $SiO_2$ or the like.

Between the source region 2' and the drain region 3' of each memory cell Qm of the EEPROM are formed a floating gate 5 and a control gate 6 in order from a lower layer. These two gates, the source region 2' and the drain region 3' constitute a MOSFET of a two-layer gate construction.

The floating gates 5' are gates for holding electrons. They are formed, for example, of a silicon (polycrystalline Si) layer, and formed one by one on each memory cell Qm.

The control gates 6' are controlling gates adapted to emit electrons from the floating gates 5' or inject electrons int the floating gates 5'. They are formed, for example, of a polysilicon layer similar to the floating gates 5', and co-owned by the memory cells Qm arranged in lateral direction as viewed in the figure to also serve as word lines WL. All the memory cells Qm connected to a single word line WL are co-owned by their source regions 2'.

The control gate 6' also serving as the word line WL is formed in its upper layer with a data line DL extending in a direction perpendicular to the direction in which the word line WL extends. The data line DL is formed, for example, of an aluminum (Al) layer and is electrically connected to each drain region 3' through a contact hole portion 7'. Two memory cells Qm arranged along the direction in which the data line DL extends, co-own their drain region 3', and are arranged so that they are symmetrical with each other in a mirror surface fashion about the drain region 3'.

FIG. 25 is an explanatory view of a sectional view of the memory cell taken on line I—I of FIG. 26 and schematically shows the connecting state between circuits formed on the substrate and each electrode of the memory cell.

The substrate 1' has formed thereon a gate insulating film 8' formed of $SiO_2$ or the like. In the gate insulating film 8', the drain region 3' is formed in its upper portion with a tunnel region 8a' whose thickness of an insulating film is thinner than other portions.

The gate insulating film 8' is formed in its upper surface with the aforementioned floating gate 5'. The emission of electrons from the floating gate 5', and injection of electrons into the floating gate 5', are effected through the tunnel region 8a' of the gate insulating film 8'.

The floating gate 5' is formed in its upper surface with an insulating film 9' formed of $SiO_2$ or the like, and in its further upper surface with the aforementioned control gate 6'.

On the other hand, in the present embodiment, the substrate 1' is formed in its element forming region except a region formed with a memory cell array with a negative voltage generation circuit 10', a high voltage generation circuit 11', a low voltage generation circuit 12', a GND power source voltage circuit 13' and a change-over circuit 14'.

The negative voltage generation circuit 10' is a circuit for applying a negative voltage to the control gate 6' when an electron is emitted from the floating gate 5'.

The high voltage generation circuit 11' is a circuit for applying a high voltage to the control gate 6' when an electron is injected into the floating gate 5'.

The low voltage generation circuit 12' is a circuit for applying a low voltage to a drain electrode 3a' when an electron is emitted from the floating gate 5'.

It is to be noted that the high voltage generation circuit 11' and the low voltage generation circuit 12' may be constituted as a single circuit so that a low voltage and a high voltage may be suitably outputted.

The GND power source voltage circuit 13' is a circuit for applying a GND voltage to the drain electrode 3a' during a supply of GND potential (ground potential of circuit) to each electrode and injection of electrons into the floating gate 5'.

The change-over circuit 14' is a circuit for switching the connecting state between the circuits 11' to 13' and the drain electrode 3a' and the control gate 6' in response to the injection and emission of electrons.

Next, the method for erasing data and method of writing in an EEPROM as described above will be described with reference to FIGS. 27 and 28. In the present embodiment, the emission of electrons from the floating gate indicates the erasure of data, and the injection of electrons into the floating gate indicates the writing of data.

First, for erasing data (for emitting data from the floating gate 5'), an output terminal of the negative voltage generation circuit 10' is electrically connected to the control gate 6' through the change-over circuit 14', and an output terminal of the low voltage generation circuit 12' is electrically connected to the drain electrode 3a' through the change-over circuit 14', as shown in FIG. 27.

If, for example, a potential difference of the order of 15V is required between the control gate 6' and the drain electrode 3a' for erasure of data, a negative voltage of the order of −8V is applied from the negative voltage generation circuit 10' to the control gate 6', and a positive low voltage of the order of 7V is applied from the low voltage generation circuit 12' to the drain electrode 3a'.

In this way, a potential difference ($|-8|+7=15V$) required for emission of electrons from the floating gate 5' is secured between the control gate 6' and the drain electrode 3a', and, therefore, the electrons held by the floating gate 5' are emitted toward the drain region 3' through the tunnel region 8a' to effect erasure of data.

That is, in an EEPROM of the present embodiment, in erasing the data (emission of electrons from the floating gate 5'), a negative voltage is applied to the control gate 6' whereby a voltage applied to the drain electrode 3a' can be stepped down, for example, by 8 to 13V as compared with the prior art.

In writing data (injection of electrons), an output terminal of the high voltage generation circuit 11' is electrically connected to the control gate 6' through the change-over circuit 14', and an output terminal of the GND power source voltage circuit 13' is electrically connected to the drain electrode 3a' through the change-over circuit 14', as shown in FIG. 28. A high voltage, for example, 15 to 20V, is applied from the high voltage generation circuit 11' to the control gate 6' and a GND voltage (0 V) is applied from the GND power source voltage circuit 13' to the drain electrode 3a' so that electrons are injected from the drain region 3' into the floating gate 5' through the tunnel region 8a' to write data.

As described above, according to the present embodiment, the substrate 1' is formed in its element-forming region, except the region formed with the memory cell Qm, with the negative voltage generation circuit 10' so that in erasing data (emission of electrons from the floating gate 5'), a negative voltage generated by the negative voltage generation circuit 10' is applied to the control gate 6', whereby a potential of the voltage applied to the control gate 6' is stepped down as compared with prior potential, and therefore even if the potential of the voltage applied to the drain electrode 3a' is stepped down as compared with prior potential, the potential difference required for emission of electrons can be secured between the floating gate 5' and the drain electrode 3'.

Accordingly, in erasing data (emission of electrons from the floating gate 5'), a voltage applied to the $n^+$ diffusion layer forming the drain region 3' or the $n^+/p$ junction portion can be considerably stepped down as compared with prior voltage, to improve reliability of the EEPROM.

Furthermore, since the voltage applied to the drain region 3' can be considerably stepped down as compared with prior voltage, it is not necessary for the memory cell Qm to provide a high pressure withstanding construction. Because of this, it is possible to decrease the area occupied by the memory cell Qm and miniaturize the EEPROM.

While in the aforementioned embodiment, the case has been described in which in injecting electrons into the floating gate, a high voltage is applied to the control gate, it is to be noted that the configuration is not limited thereto, but, for example, in injecting electrons into the floating gate, an arrangement may be employed in which a negative voltage is applied from the negative voltage generation circuit to the drain electrode and a low voltage is applied from the low voltage generation circuit to the control gate. In this case, the high voltage generation circuit is not required.

Another embodiment of this aspect of the present invention will be described hereinafter with reference to FIGS. 33 to 42.

Figure 33:
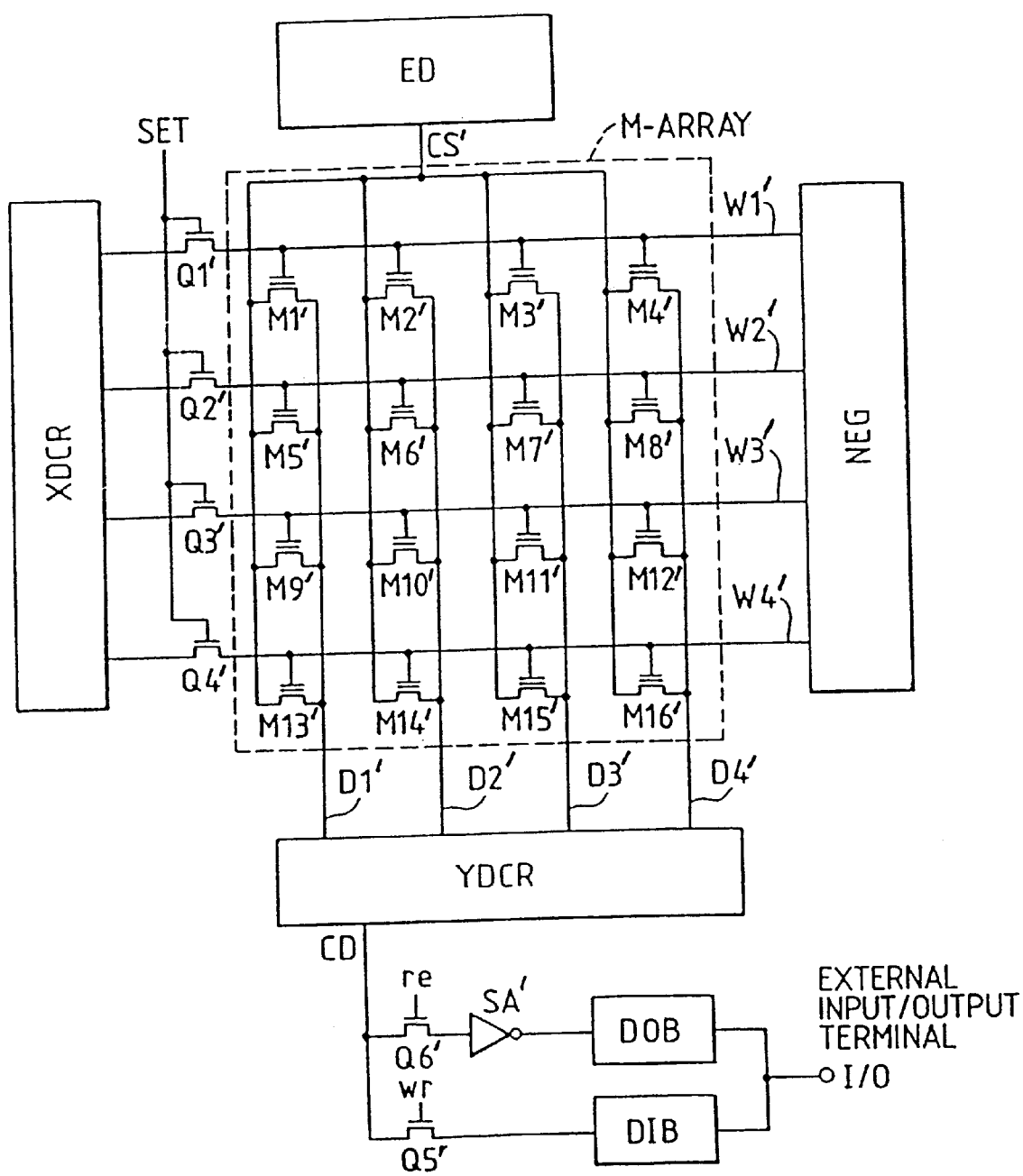
FIG. 33 is an internal block diagram of a nonvolatile semiconductor memory device according to the embodiment.
Figure 34:
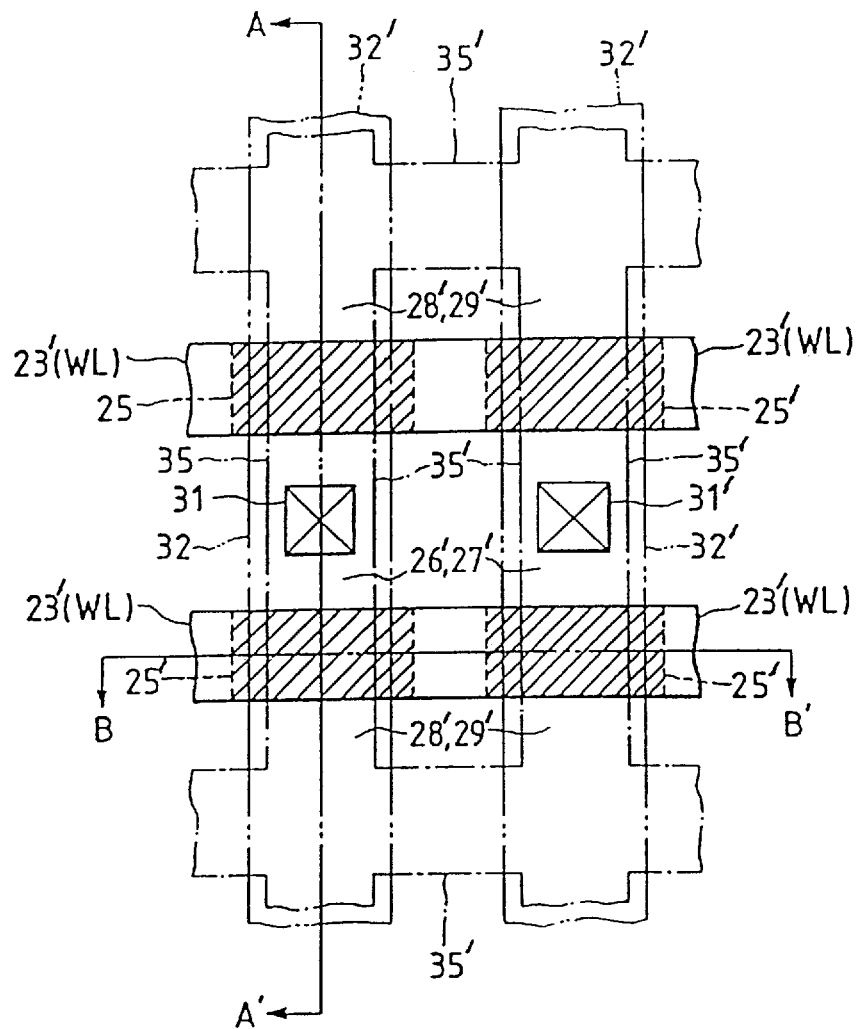
FIG. 34 is a plan view of a 4-bit portion of a FAST type memory cell used in the embodiment.
Figure 37:
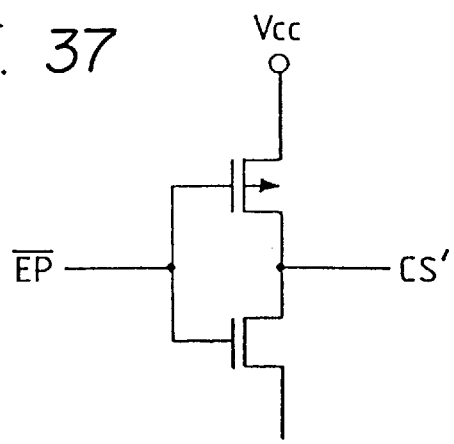
FIG. 37 is a circuit structure of an erasure voltage application circuit ED in the embodiment.
Figure 35:
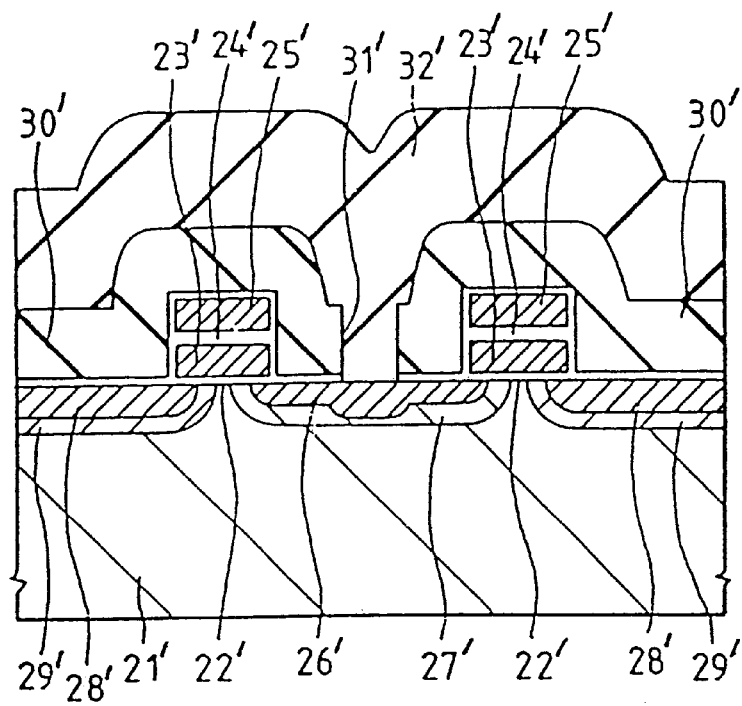
FIG. 35 is a sectional view (2 bit portion) taken on A–A' of FIG. 34.
Figure 36:
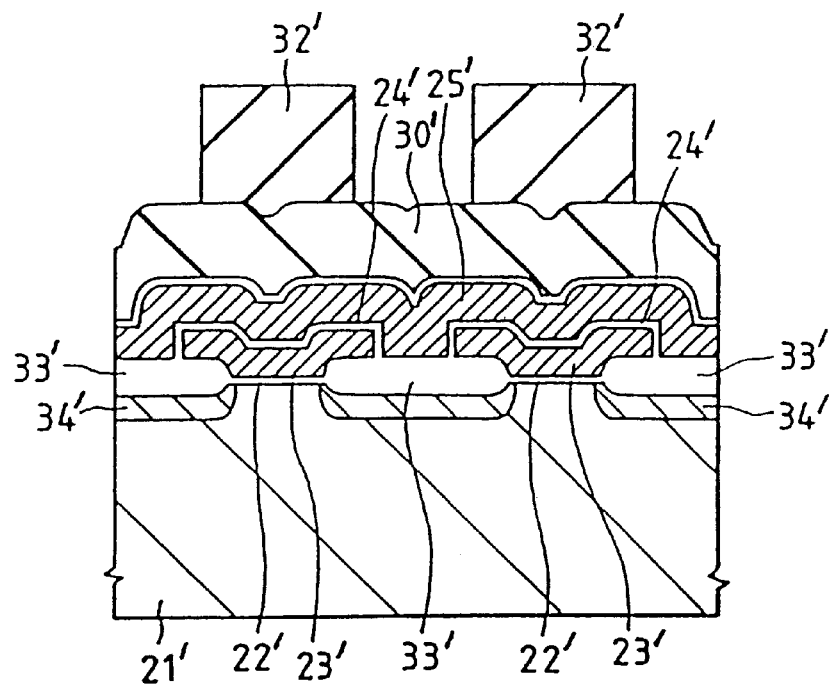
FIG. 36 is a sectional view (2 bit portion) taken on B–B' of FIG. 34.
Figure 38:
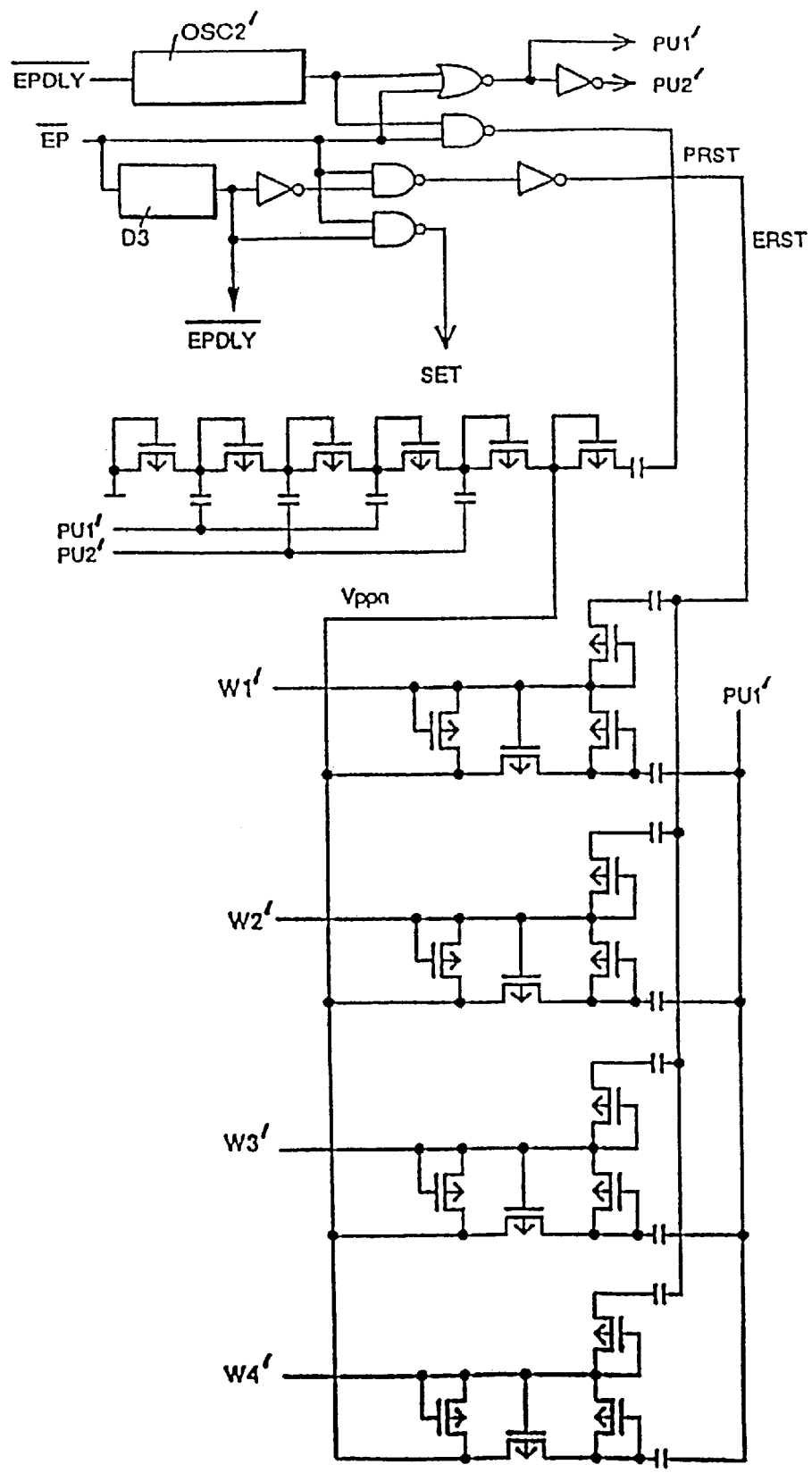
FIG. 38 is a circuit structure of a negative voltage application circuit NEG in the embodiment in which a negative voltage is applied to a control gate by erasure operation.
Figure 39:
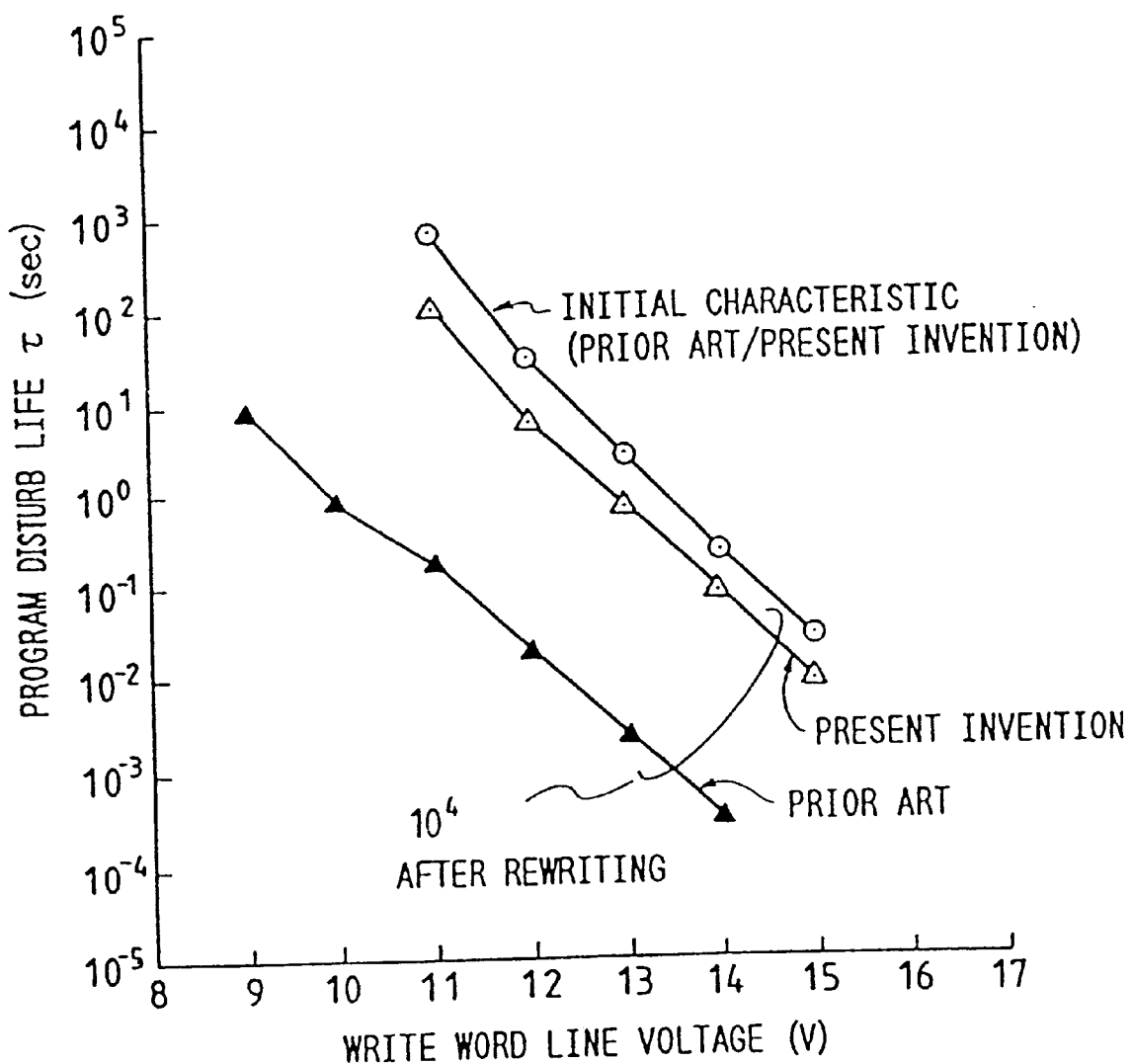
FIG. 39 is a characteristic view showing the effect of an improvement in program disturb durability in the embodiment.
Figure 40:
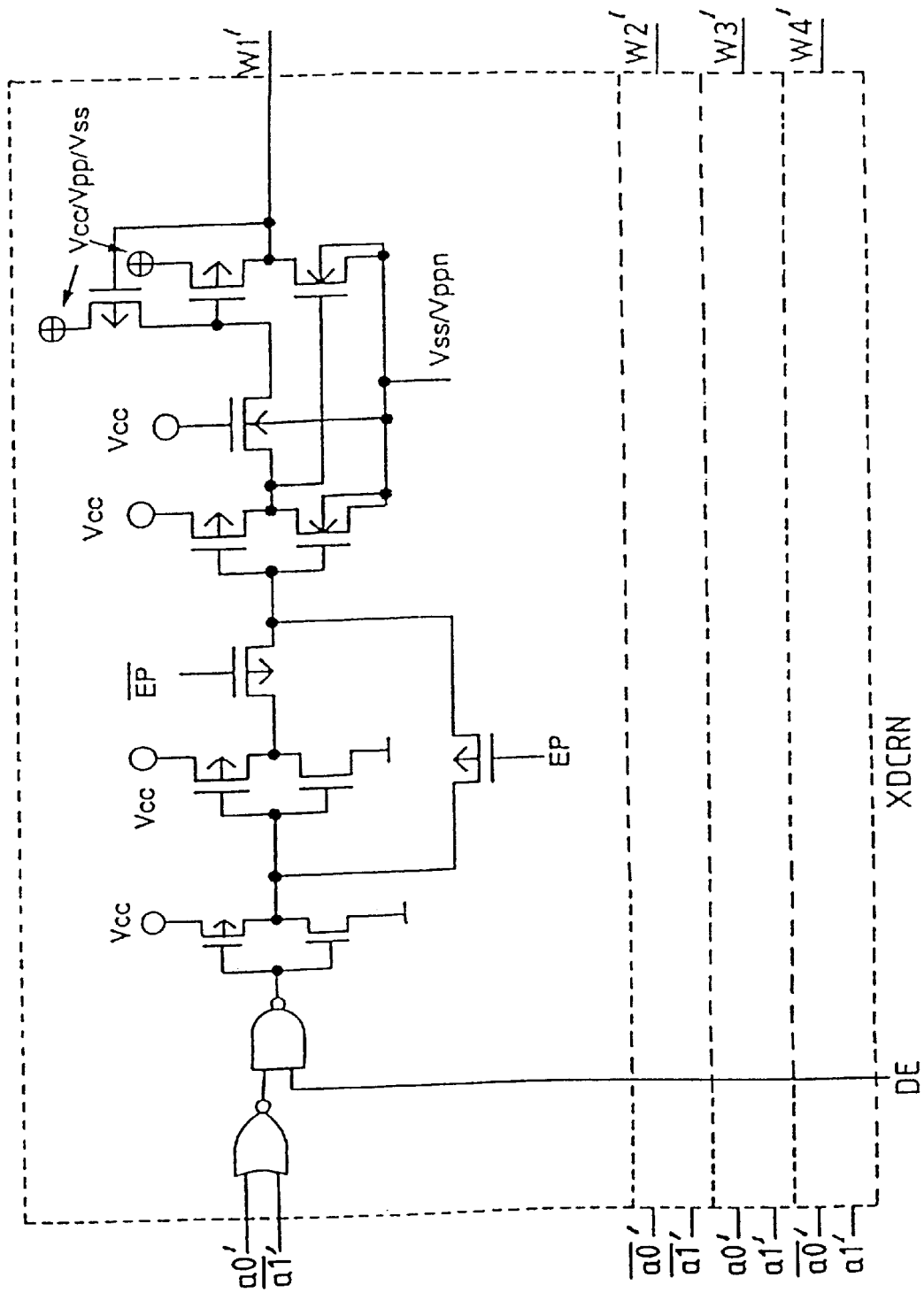
FIG. 40 is a circuit structure of a further negative voltage application circuit XDCRN.
Figure 42:
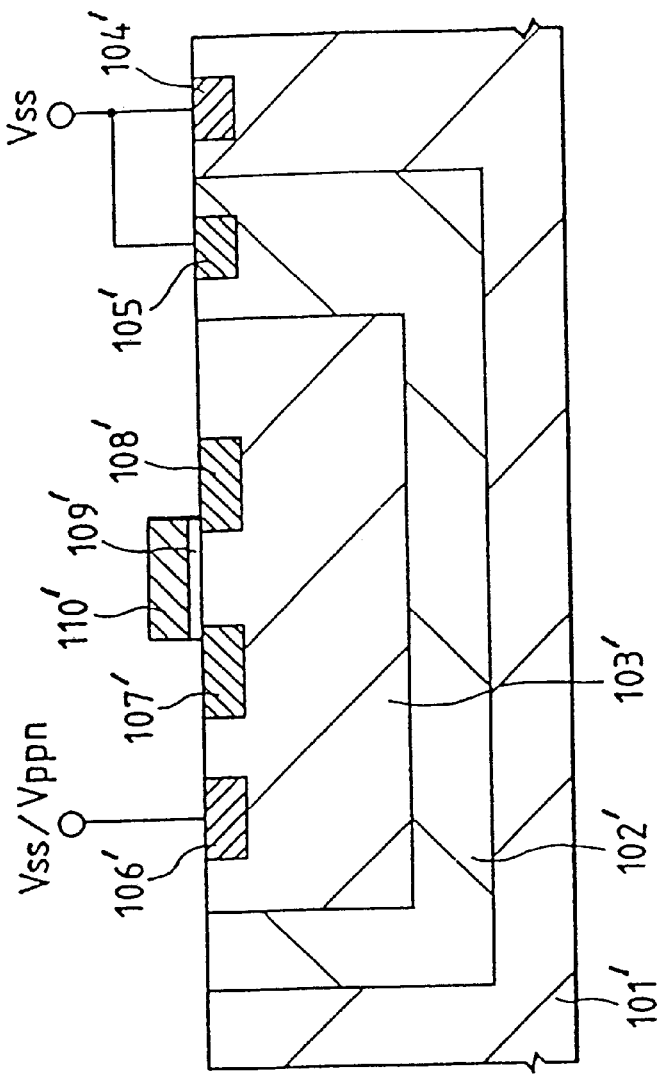
FIG. 42 is a sectional view of a multi-well construction for realizing the XDCRN.
Figure 41:
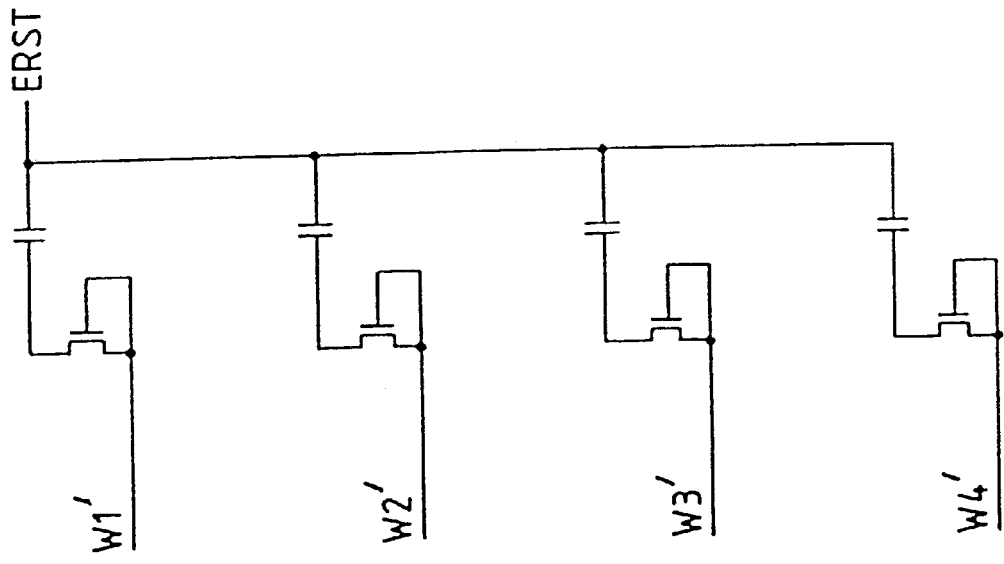
FIG. 41 is a word line resetting circuit structure in which the negative voltage applied by said XDCRN is reset.

FIG. 33 is an internal block diagram of a nonvolatile semiconductor memory device according to the present embodiment, FIG. 34 is a plan view of 4 bit portions of a FAST type memory cell used in this aspect of the present invention, FIG. 35 is a sectional view (2 bit portions) taken on A–A' of the plan view (FIG. 34), FIG. 36 is a sectional view (2 bit portions) taken on B–B' of the plan view (FIG. 34), FIG. 37 is a circuit structure of an erasure voltage application circuit, FIG. 38 is a circuit structure of a negative voltage application circuit NEG for applying a negative voltage to the control gate during erasure operation, FIG. 39 is a characteristic view showing the effect of an improvement in program disturb durability in the present embodiment, FIG. 40 is a circuit structure of a further negative voltage application circuit XDCRN, FIG. 41 is a structural view of a word line resetting circuit for resetting a negative voltage applied by the XDCRN, and FIG. 42 is a sectional view of a multiwell construction for realizing the XDCRN.

Circuit elements of the present embodiment are not particularly limited but are formed on a semiconductor substrate such as a single crystalline silicon by a well-known technique for producing a CMOS (complementary type MOS) integrated circuit. Although no particularly limited, an integrated circuit is formed on a semiconductor substrate formed of a single crystalline p-type silicon.

An n-channel MOSFET is composed of a source region, a drain region and a gate electrode such as polysilicon formed through a thin gate insulating film on a channel between said source region and said drain region, formed on the surface of the semiconductor substrate as described above.

A p-channel MOSFET is formed in an n-type well region formed on the surface of the semiconductor substrate as described above. Thereby, the semiconductor substrate constitutes a common substrate gate for a plurality of n-channel MOSFETs formed thereon, to which is supplied a ground potential of the circuit. A common substrate gate of the p-channel MOSFETs, that is, the n-type well region, is connected to the power source voltage Vcc.

It is to be noted that the integrated circuit may be formed on a semiconductor substrate formed of a single crystal n-type silicon. In this case, the n-channel MOSFET is formed in the p-type well region.

Memory cells of the present invention are formed on the p-type semiconductor substrate, through not particularly limited. FIG. 34 shows a plan construction of 4 bit portions, FIG. 35 shows a sectional construction of the A–A' portion, and FIG. 36 shows a sectional construction of the B–B' portion.

In FIGS. 34 to 36, reference numeral 21' designates a p-type semiconductor substrate; 22' a thin gate oxide film (a tunnel oxide film) formed on the main surface side of the p-type semiconductor substrate; 23' a floating gate electrode; 24' a first interlaminar oxide film; 25' a control gate electrode; 26' an n$^+$-type semiconductor region (a drain region); 27' a p$^+$-type semiconductor region (a drain shield layer); 28' an n$^+$-type semiconductor region (a part of the source region); 29' an n-type semiconductor region (a part of the source region); 30' a second interlaminar oxide film; 31' a contact hole; 32' a data line of aluminum; 33' a field oxide film for separating elements by a LOCOS method; 34' a parasitic channel preventing channel stopper formed from the p$^+$-type semiconductor region; and 35' a boundary line between the element separation region and the active region by LOCOS method.

The gate oxide film 22' is formed from an oxide silicon film formed by thermally oxidizing the surface of the semiconductor substrate 11', which thickness is of the order of 10 nm.

The first interlaminar oxide film 24' is formed from a silicon oxide film formed by thermally oxidizing the surface of the floating gate electrode 23' formed from a polycrystalline silicon film, which thickness is of the order of 20 nm.

The control gate electrode 25' is formed from a polycrystalline silicon film similar to the floating gate electrode 23', and is affixed to the surface of the first interlaminar oxide film to control a potential of the floating gate electrode 23' by an electrostatic capacity coupling. The control gate electrode 25' and the floating gate electrode 23' have their ends in the channel direction simultaneously processed by a single patterning process, which length is 0.7 µm. The control gate electrode 25' is integral with the word line WL and extends on the element separation region 33'.

The drain region constituted by the n$^+$-type semiconductor region 26' is connected to the data line 32' formed of aluminum through the contact hole 31'. The junction depth of the n$^+$-type semiconductor region 26' is of the order of 0.1 µm except a portion immediately below the contact hole, and the junction depth under the contact hole 31' is of the order of 0.2 µm, which is deeper than other portions.

The p$^+$-type semiconductor region (the drain shield region) 27' is formed so as to surround the drain region to realize the setting of the threshold voltage in the thermal equilibrium state, the improvement in efficiency of injection of channel hot electron in the writing operation, and the punch-through prevention during the erasure operation. The impurity concentration of the p$^+$-type semiconductor region 27' is of the order of $5\times10^{17}/cm^3$ in the junction surface with the n$^+$-type semiconductor region 26', and the depth thereof is of the order of 0.25 µm from the surface of the semiconductor substrate 21'.

The source region is composed of the n$^+$-type semiconductor region 28' whose impurity is As and the n-type semiconductor region 29' whose impurity is P, the source region extending in the direction in which the word line WL extends to constitute a source line SL which will be described later. The junction depth of the n$^+$-type semiconductor region 28' is of the order of 0.2 µm. The n-type semiconductor region 29' is formed to be interposed between the n$^+$-type semiconductor region 28' and the p-type semiconductor substrate 21' to increase the junction pressure withstanding between the source and the semiconductor substrate by a gentle inclined profile thereof. The impurity concentration of the n-type semiconductor region 29' is of the order of $1\times10^{19}/cm^3$ in an interface with respect to the n$^+$-type semiconductor region 28', and the junction depth thereof is of the order of 0.35 µm. The junction pressure withstanding exceeds 15 V.

The second interlaminar oxide film 30' is formed from phosphosilicate glass (PSG) to cover the main surface of the p-type semiconductor substrate 21'.

The contact hole 31' is formed by partly removing the second interlaminar oxide film 30' and the gate oxide film 12' on the drain region.

Although not shown in FIGS. 35 and 36, the data line 32' of aluminum has provided thereon a protective film comprising a PSG film formed by chemical vapor deposition (CVD) method and a nitrided silicon film thereon.

The internal block of the nonvolatile semiconductor memory system according to the present embodiment comprising a memory array with the FAST type memory cells arranged in a matrix fashion and peripheral circuits, and the operation thereof, will be described hereinafter with reference to FIG. 33.

The memory array M-ARRAY comprises FAST type memory cells arranged in four lines and four rows as a typical example and is composed of memory cells M1' to M16', word lines W1' to W4' and data lines D1' to D4'. In this embodiment, one memory block is constituted as a whole.

In the aforementioned memory array, control gates of the memory cells arranged in the same line are connected to the word lines corresponding thereto, and drains of the memory cells arranged in the same row are connected to the data lines corresponding thereto. Sources of the memory cells are collectively coupled to a common source line CS.

Although not particularly limited, the aforesaid memory array is designed so as to provide 8 sets or 16 sets in total in order to effect write and read per-8-bit or 16-bit unit.

The data lines D1' to D4' constituting the memory array are connected to the common data line CD through the address decoder YDCR. An output terminal of a write data input circuit DIB for receiving a write signal received from an external input terminal I/O is connected to the common date line C through a MOSFET Q5 which is turned on during writing.

A sense amplifier SA is connected to the common data line CD. An output terminal of the sense amplifier SA is connected to an I/O terminal through a data output buffer DOB.

It is to be noted that other memory arrays are also provided with an address decoder, a common data line, a sense amplifier and a data input/output circuit, which are connected to I/O terminals.

The word lines W1' to W4' constituting the aforesaid memory array are connected to the address decoder XDCR which selects the word lines by the read/write operation through transistors Q1' to Q4', respectively, and connected to the negative voltage application circuit NEG which applies a negative voltage during erasure.

The transistors Q1' to Q4' are pMOSFETS of the depletion type to prevent a negative voltage applied to the word lines during erasure from being applied to the address decoder circuit. Simultaneously they are of the depletion type to prevent the voltage drop at these transistors and the lowering of speed during read and write operations.

The common source line CS is connected to the erasure voltage application circuit ED. This erasure voltage application circuit ED is adapted to apply a positive voltage (in this embodiment, Vcc as an external power source voltage) during erasure and connect the common source line CS to a ground potential 0V of the circuit during read and write operation.

First, the address decoder circuits XDCR and YDCR are activated during the erasure operation to select one word line and one data line. A low voltage is supplied to the address decoder circuits XDCR and YDCR as the working voltage therefor. The memory cells have a high threshold value or low threshold value with respect to a selecting level of the word lines in accordance with data written in advance. In the case where the threshold value of the memory cell selected by each of the address decoders. XDCR and YDCR is high, the memory cell remains turned OFF despite the fact that the word line is at a selected level. On the other hand, in the case where the threshold value of the selected memory cell is low, the memory cell is turned ON according to the selected level of the word line. The presence or absence of current flowing into the common data line in response to the threshold value of the memory cell is detected and amplified by the sense amplifier SA connected through the switch MOSFETQ6 and then outputted out of the external terminal I/O through a data output buffer DOB activated in a read-out mode.

Next, in the write operation, the address decoder circuits XDCR and YDCR are;activated similarly to the read-out operation to select one word line and one data line.

A high voltage Vpp as the working voltage is applied to the address decoder circuits XDCR and YDCR, and a low voltage Vcc is applied to the data input circuit DIP. At this time, the MOSFETQ6 is turned OFF, and the data output buffer DOB and the sense amplifier SA are non-activated. The voltage of the selected word line assumes the aforesaid high voltage Vpp. The data line likewise selected is connected to the low voltage Vcc through the MOSFETQ5 and DIB. Thereby, in the memory cell located at the intersection, a hot electron is injected into the floating gate for writing. In the memory cell in the written state, electrons are accumulated on the floating gate thereof, and the threshold voltage as viewed from the control gate increases. In the memory system according to the present embodiment, the aforesaid low voltage Vcc, as the voltage for driving the data line, can be used due to the fact that the gate length of the memory cell is reduced to 0.7 $\mu$m, and that the injection efficiency of the hot electrons is high because of the effect of introduction of the $p^+$-type semiconductor region (drain shield region) 27 shown in FIG.35. The Vcc voltage is supplied from the Vcc power source externally of the memory device, and the Vpp voltage of the word line through which a small current flows is generated from the Vcc voltage by use of a booster circuit located interiorly of the system to thereby render possible the writing operation by the Vcc single power source.

The memory cell should not be in the depletion state in order to properly carry out the read-out and write operations. If a cell in the depletion state is present, a leak current not intended flows. Therefore, the desired memory cell cannot be selected. This means that the controlability is important in the erasure operation which will be described later.

The erasure operation which constitutes the feature of the present embodiment will be described hereinafter.

The erasure operation in the present embodiment is carried out by a system which comprises applying a negative voltage to the control gate of the memory cell, applying a positive voltage (Vcc as the external power source voltage in this embodiment) to the source, and drawing an electron held on the floating gate due to a potential difference between the positive and negative voltages into the source region by the Fowler.Nordheim tunnel emission. The power source voltage Vcc as the working voltage is supplied to the erasure voltage application circuit ED and the negative voltage application circuit NEG.

The erasure voltage application circuit ED is an inverter circuit which receives an erasure. pulse $\overline{EP}$ as shown in FIG. 37, and the power source voltage Vcc is applied to the common source line CS.

A negative erasure voltage is applied from the negative voltage application circuit NEG to the word lines w1' to w4'.

FIG. 38 shows a circuit structure of the negative voltage application circuit NEG. This circuit is a so-called charge pump circuit.

In FIG. 38, when an erasure signal $\overline{EP}$ is set to be a low level, a signal $\overline{EPDLY}$ will be a low level, after the passage of time determined by a delay circuit 3', and a decoder disconnecting signal will be a high level. Thereby, the address decoder circuit XDCR is electrically disconnected from the word line. Nex, an oscillator OSC2' starts to oscillate to produce complementary pulse -signals PU1' and PU2', which are utilized to produce a negative voltage Vppn by the principle of the charge pump. This negative voltage is applied to the word lines W1' to W4' in accordance with the charge pump using the signal PU1'. When the erasure signal $\overline{EP}$ is set to be a high level, the pulse signals PU1' and PU2' stop, but negative voltage reset signals PRST and ERST cause a node of a negative potential to be 0 V or positive voltage for a period till the signal $\overline{EPDLY}$ assumes a high level to stop the erasure.

Since a current flowing into the word line during erasure operation is small, a negative voltage required for erasure is generated by the external power source voltage (power source voltage supplied from outside the chip through an external terminal) Vcc by the negative voltage application circuit NEG within the system to supply said voltage Vcc to the word line, as previously mentioned. As the low voltage Vcc applied to the common source line CS through which a large amount of leak current flows, the power source voltage Vcc supplied from outside is used. In this way, the electric collective erasure operation for collectively erasing the whole memory array can be carried out by the Vcc single power source (power source voltage Vcc and ground potential Vss of circuit).

The data lines D1'–D4' during erasure operation may be stepped down to the ground potential Vss (0 V) by the address decoder YDCR or may be placed in an open state. This is because of the fact that in the erasure system of the present invention which performs the erasure by applying a high negative voltage to a control gate, even if the erasure proceeds, a parasitic channel current flowing from the source of the memory cell to the drain need not be taken into consideration. The parasitic effect caused by the channel current which comes into question in the conventional erasure system with the control gate grounded is disclosed in Japanese Patent Application No. 62(1988)-141486.

FIG. 39 is a characteristic view-showing the comparison of the state where the program disturb life is lowered by the rewrite cycle, between the prior art and the present embodiment.

In the prior art in which erasure is effected by applying the high voltage Vpp to the source, the program disturb life is considerably lowered as compared to the initial characteristic prior to rewrite. On the other hand, in the present embodiment in which the source voltage can be lowered to Vcc to effect erasure, the lowering of the life is of the order of half figure, from which it is understood that the influence of rewrite can be restricted to a level which rarely poses a problem.

The program disturb life is defined by time till the threshold voltage of the memory cell placed in the word line half-selected state rises by 0.1V.

While in the present embodiment, the line decoder circuit XDCR and the negative voltage application circuit NEG are constituted by separate circuits, it is to be noted that the present invention is not limited thereto. For example, one circuit XDCRN may be used as shown in FIG. 40. This circuit is provided between the line address buffer circuit and the word line as in the decoder circuit XDCR. In this case, a final stage inverter circuit INV1' and a source of the n-type MOSFET of an inverter circuit INV2' provided therebefore are connected to the negative voltage power source Vppn during erasure. The ground potential Vss is provided during read-out and write. However, reset at the termination of erasure should be made similarly to the previous case. The reset circuit therefor is shown in FIG. 41. The circuit XDCRN is integral with the line decoder circuit, which receives outputs a0, $\overline{a0}$, a1 and $\overline{a1}$ of the line address buffer circuit to selectively apply an erasure voltage to a suitable one of the word lines. As the result, the erasure operation is carried out for every word line, using a group of memory cells connected to the respective word lines as a memory block.

Here, FAST type memory cells are normally formed on a p-type substrate, and a substrate potential is a ground potential. Accordingly, the circuit XDCRN may be realized in a manner such that the final stage inverter circuit INV1' and the n-type MOSFET of the inverter circuit INV2' provided frontwardly thereof are formed within the p-type well provided within the n-type well, the p-type well being connected to the negative voltage power source Vppn. Of course, in case of using an n-type substrate, the p-type well is formed similarly to the conventional circuit, the p-type well being connected to the negative voltage power source Vppn. In FIG. 42, reference numeral 101' designates a p-type semiconductor substrate; 102' an n-type well region; 103' a p-type well region provided with the n-type well region 102' and separated from the p-type semiconductor substrate 101'; 104' a p$^+$-type semiconductor region for connecting the p-type semiconductor substrate 101' to the ground potential Vss; 105' an n$^+$-type semiconductor region for connecting the n-type well region 102' to the ground potential Vss; 106' a p-type semiconductor region for connecting the p-type well region 103' to the negative voltage power source Vppn during erasure operation and connecting it to the ground potential Vss during write/read operation; 107' and 108'n$^+$-type semiconductor regions constituting source and drain regions of MOS transistors formed within the p-type well region 103'; 109' a gate oxide film of the MOS transistor; and 110 a gate electrode of the MOS transistor.

A further embodiment of this aspect of the Present invention will be described hereinafter with reference to FIG.43.

Figure 43:
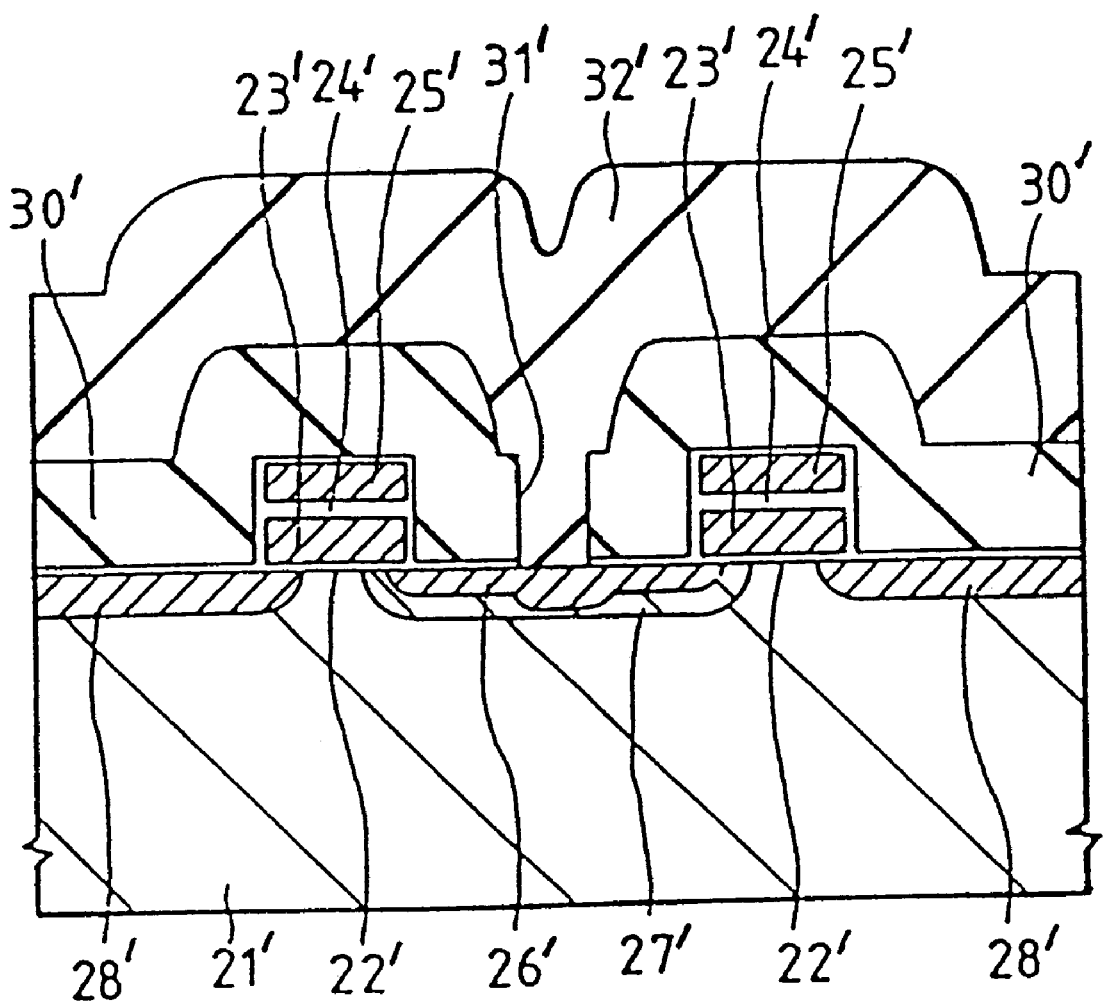
FIG. 43 is a sectional view (taken on A–A' in FIG. 34) of two bit portions of FAST type memory cell used in another embodiment.

FIG. 43 is a sectional view of two bit portions of FAST type memory cells used in a nonvolatile semiconductor memory system according to the present embodiment (taken on A–A' of FIG. 34), FIG. 43 corresponding to FIG. 35 showing the above-described embodiment.

The memory cell used herein has exactly the same construction as that of the memory cell shown in FIG.35 in the previous embodiment except that the n-type semiconductor region 29' whose impurity is P (phosphorus) is not present in the source region. By omission of the n-type semiconductor region, the electrostatic capacity between the source region and the floating gate is reduced by about 60% during erasure operation to realize further lowering of voltage or increase in speed for erasure. On the other hand, the junction pressure withstanding between the source and the substrate is lowered to approximately 12V, which however poses no problem in the present embodiment which can perform erasure by lowering a voltage to be applied to the source to Vcc.

The memory device according to the present embodiment is the same as that of the embodiment shown in FIGS. 27 to 42 and operates similarly except the difference in the source construction of the memory cell described above.

Still another embodiment of the present invention will be described hereinafter with reference to FIGS. 44 to 46.

Figure 44:
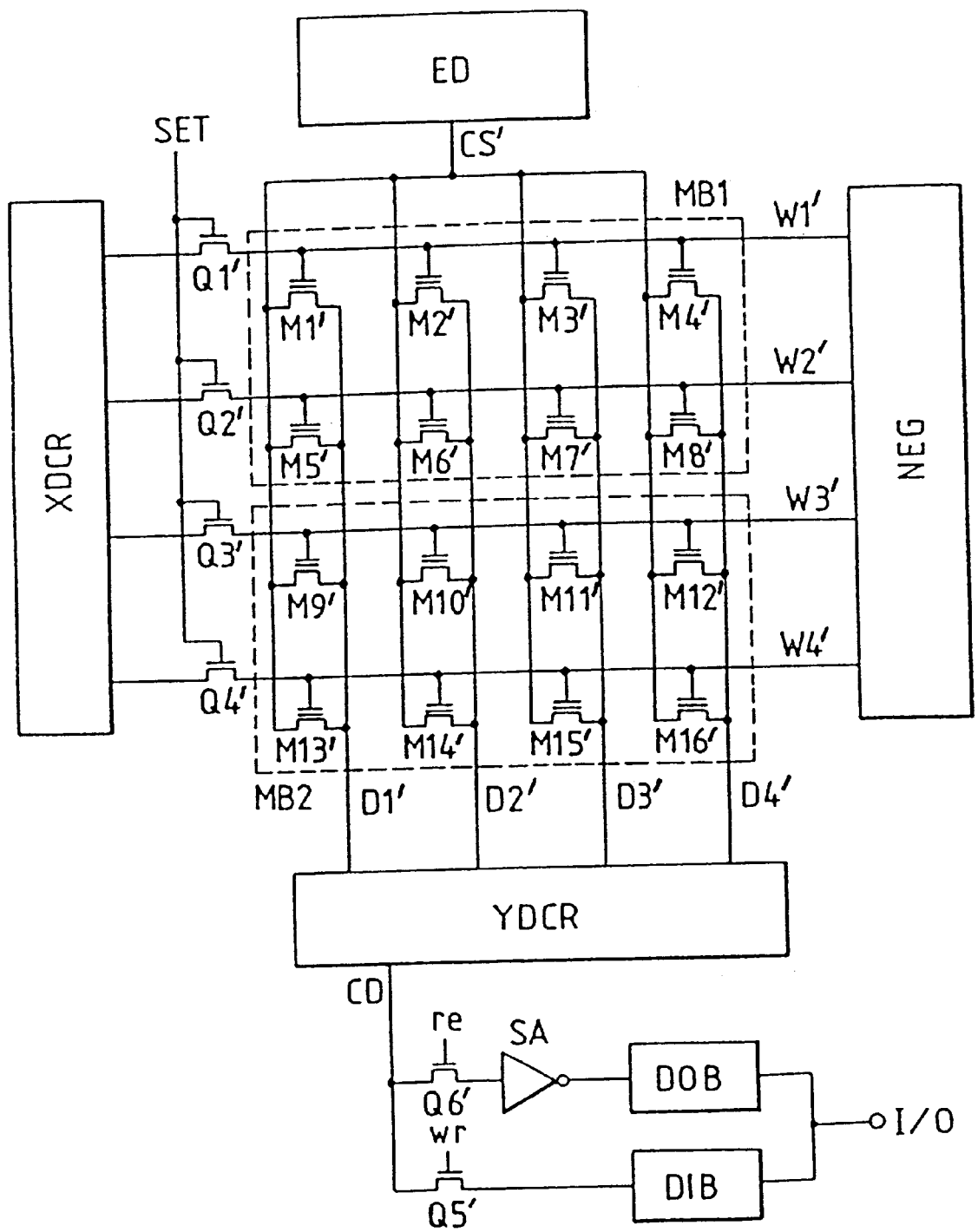
FIG. 44 is an internal block diagram of a nonvolatile semiconductor memory device according to another embodiment.

FIG. 44 is an internal block diagram of a novolatile semiconductor memory device according to the present embodiment, which corresponds to FIG. 33 of a previous embodiment. As the memory cell, the same FAST type memory cell as those of the FIG. 27 embodiment and FIG. 43 embodiment is used.

The operation of the nonvolatile semiconductor memory device according to the present embodiment is essentially the same as that of the FIG.27 embodiment or FIG. 43 embodiment but is different therefrom in that erasure operation is effected with respect to memory blocks obtained by dividing the memory M-ARRAY in a direction of the word line as a unit. In this embodiment, the memory array is divided into a memory block MB1' comprising a group of memory cells M1'–M8' connected to word lines W1' and W2', and a memory block MB' comprising a group of memory cells M9'–M16' connected to word lines W3' and W4'.

Figure 45:
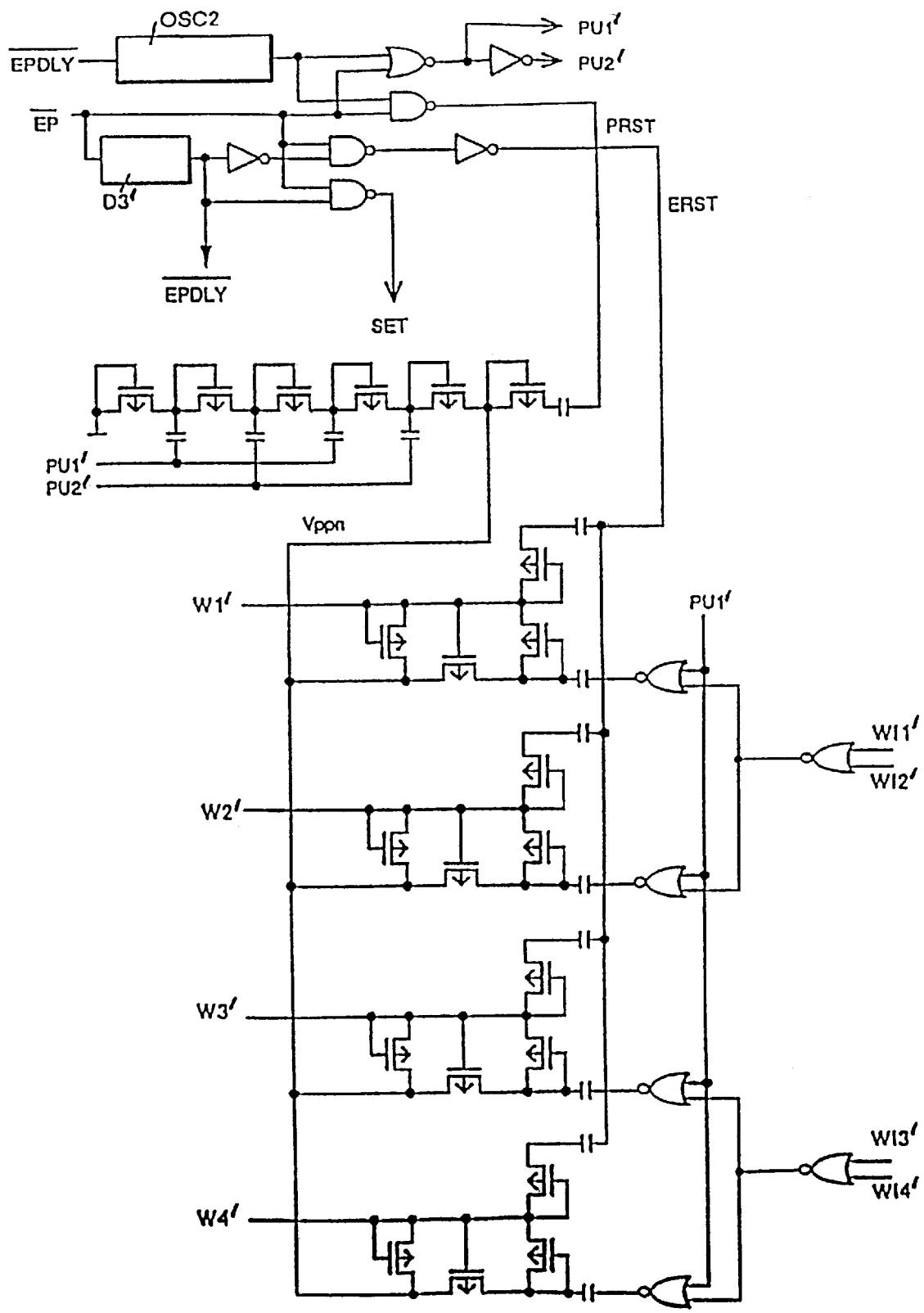
FIG. 45 is a circuit structure of a negative voltage application circuit NEG in the embodiment shown in FIG. 44.

FIG. 45 shows a circuit structure of the negative voltage application circuit NEG. This embodiment is different from the FIG. 38 embodiment in that the former encases a decoding function for selecting memory blocks. That is, in the negative voltage application circuit NEG shown in FIG. 45, a negative voltage Vppn is applied to only the word lines corresponding to the memory block for erasure operation, and a ground voltage 0V is applied to a non-selected word line.

Figure 46:
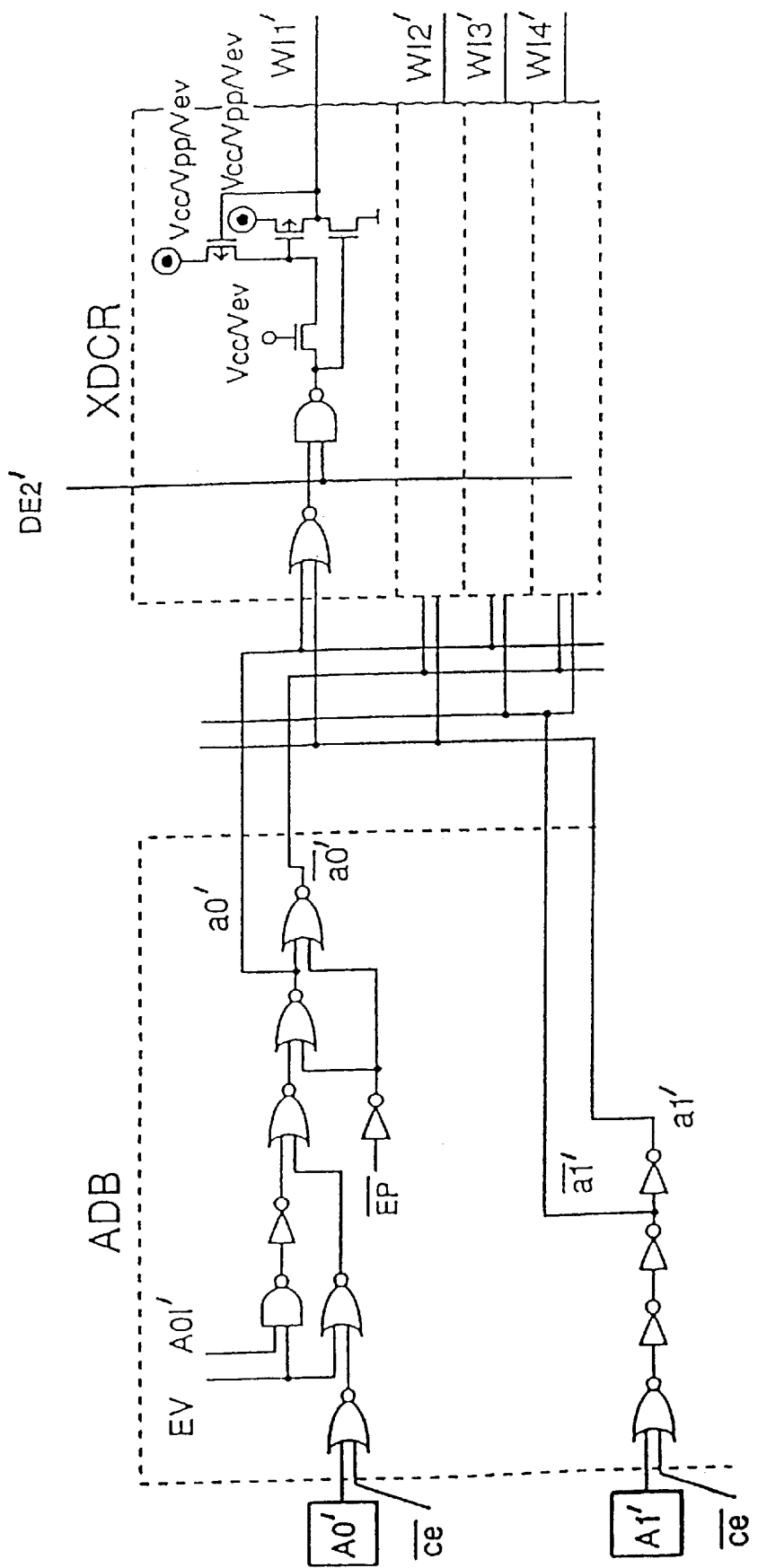
FIG. 46 is a circuit structure of an address buffer circuit ADB in the embodiment shown in FIG. 44.

For selecting the memory blocks, there is used, in the present embodiment, A1' which is one of line selecting external inputs of the address buffer circuit ADB as shown in FIG. 46. The A0' input portion of the address buffer circuit ADB and the line decoder XDCR can select the memory blocks even during application of the erasure voltage. That is, both a0' and $\overline{a0}$ will be a low level, and two word line outputs WI1' and WI2' or WI3' and WI4' determined according to the A1' address input will be a high level. The WI1' to WI4' are supplied to the negative voltage application circuit NEG. The output of the decoder circuit is not applied to the word lines W1' to W4' during erasure by the function of transistors Q1' to Q4'.

The memory cell within the non-selected memory block is in the erasure half-selected state where a positive voltage (in this embodiment, Vcc which is an external power source voltage) is applied to only the source region through the common source line, and the disturb phenomenon resulting therefrom can be avoided by suitably setting the negative voltage Vppn applied to the selected word line and the thickness of an oxide film between the gate and the layer.

Another embodiment according to this aspect of the present invention will be described hereinafter with reference to FIGS. 47 to 49.

Figure 47:
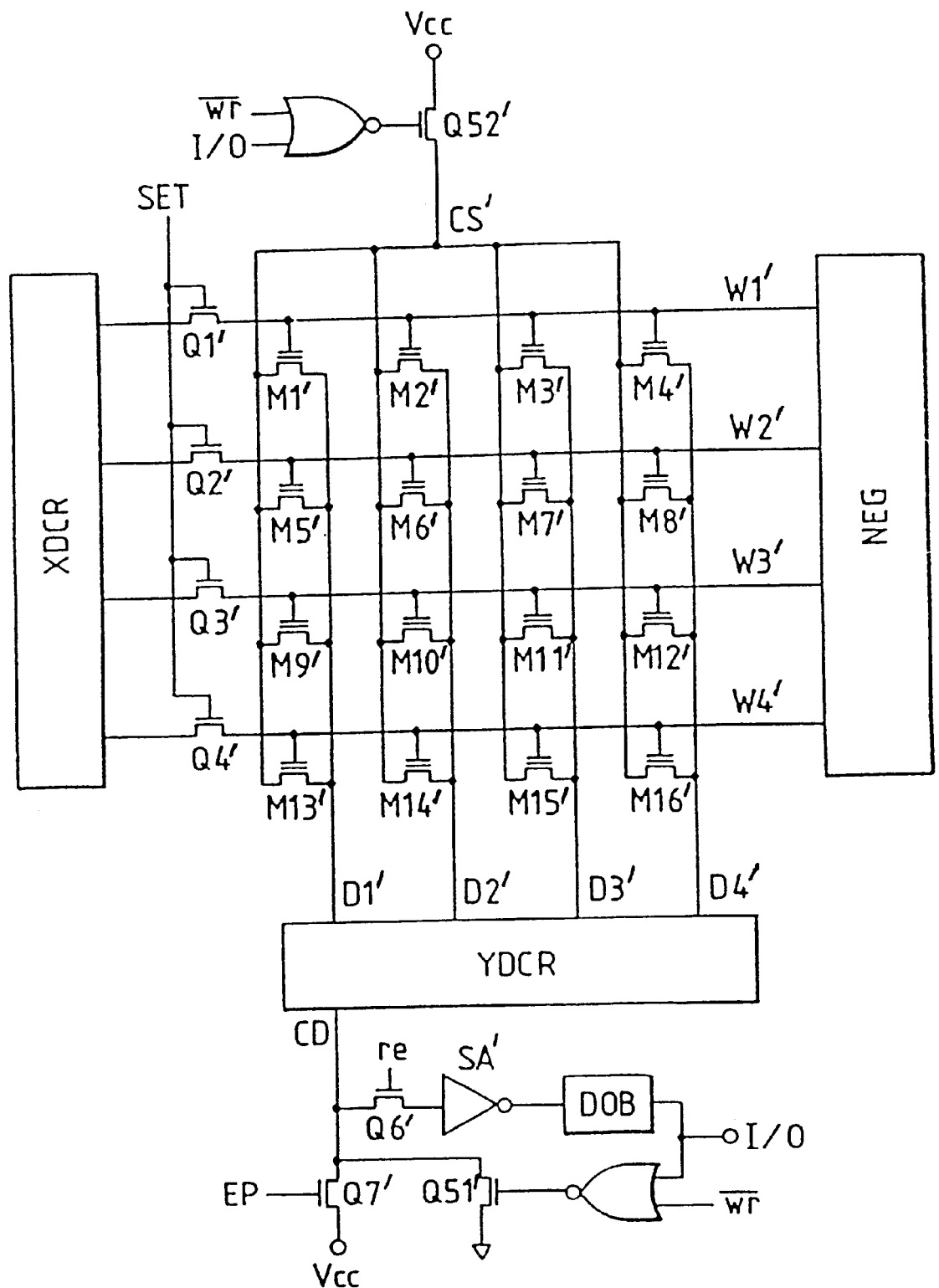
FIG. 47 is an internal block diagram of a nonvolatile semiconductor memory device according to still another embodiment.
Figure 48:
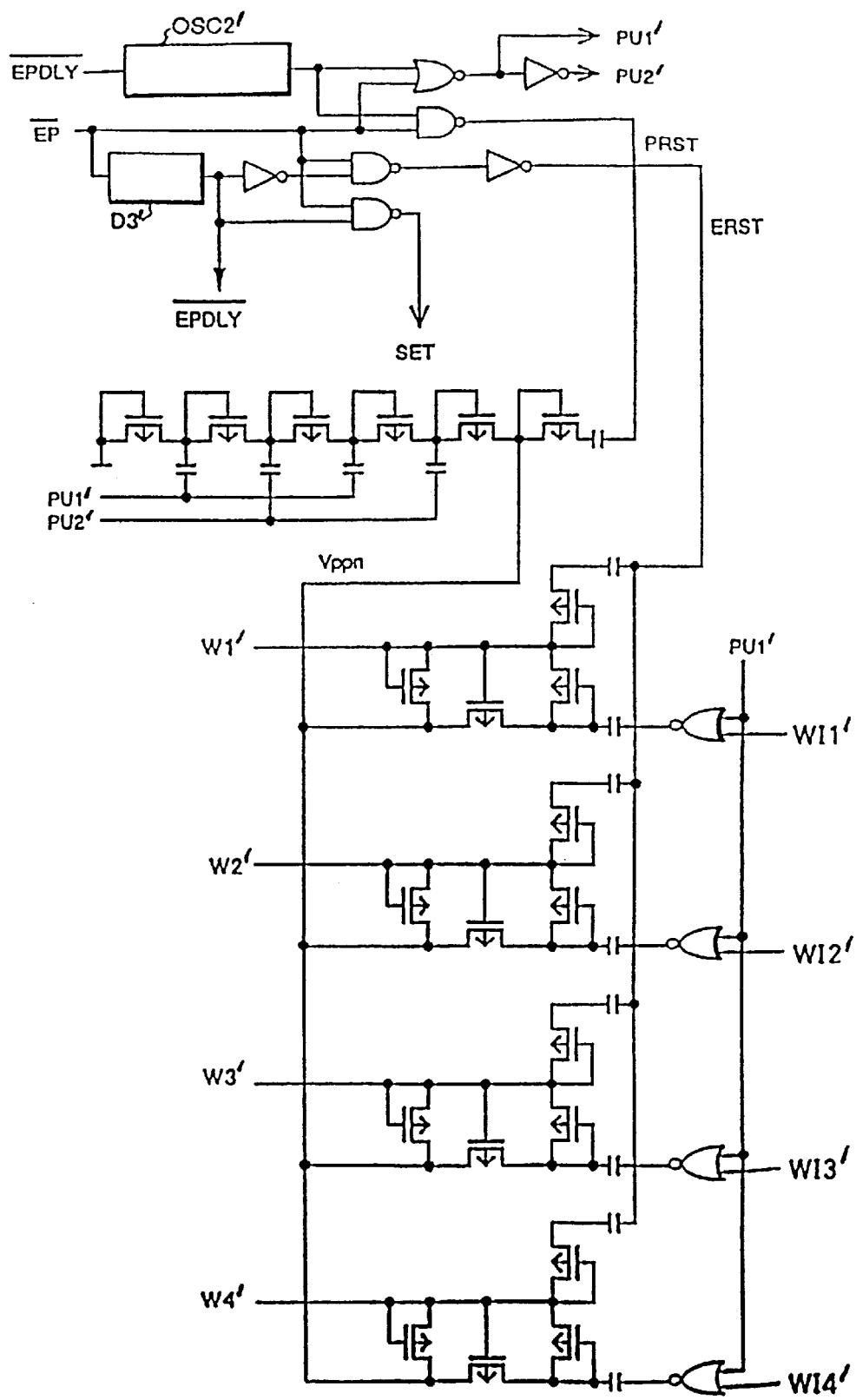
FIG. 48 is a circuit structure of a negative voltage application circuit NEG in the embodiment shown in FIG. 47.

FIG. 47 is an internal block diagram of a nonvolatile semiconductor memory device according to the present embodiment, which corresponds to the FIG.33 embodiment and FIG. 44 embodiment. FIG. 48 is a circuit structure of the negative voltage application circuit NEG, with corresponds to the FIGS. 38 and 45 embodiments. FIG. 49 is a sectional view (taken on A–A' of FIG. 34 ) of 2 bit portions of the FAST type memory cell used in the nonvolatile semiconductor memory device according to the present embodiment, which corresponds to the FIGS. 35 and 43 embodiments.

The present embodiment is not different in essential operation from the FIGS. 33–46 embodiments but is different in that in carrying out the electric erasure, the Vcc voltage is applied to the data line instead of the source line, and said data line and the word line for applying a negative erasure voltage are respectively decoded. Thereby, 1 bit of a memory cell located at an intersection between a pair of selected data line and selected word line is selectively erased. Only those differences from the FIGS. 33 to 46 embodiments will be described hereinafter.

As shown in FIG. 47, in the present embodiment, when the erasure signal EP is at a high level during erasure, the MOS transistor Q7' is turned on and a positive voltage (in this embodiment, Vcc which is an external power source voltage) is applied to the common data line CD through the Q7'. At this time, MOS transistor Q51' is turned off since write signal $\overline{wr}$ is at a high level. MOS transistor 52' is likewise turned off, and the common source line CS is opened. The erasure operation is carried out at a potential difference between the negative voltage of the control gate and the positive voltage of the drain, and electrons in the floating gate are drawn into the drain region instead of the source. A data line for applying the positive voltage is selected by the row address decoder YDCR. On the other hand, as shown in FIG. 48, the negative voltage application circuit NEG encases a decoding function which uses signals WI1' to WI4' formed from line selecting external input signals A0' and A1' to select a suitable word line. In this manner, a pair of data line and word line is selected, and a memory cell located at an intersection therebetween is selectively erased.

Conversely, the write operation using hot electron injection is carried out from the source region side. As shown in FIG. 47, the write signal $\overline{wr}$ is at a low level during writing, and therefore, MOS transistors Q51' and Q52' are turned on or off in response to the external input signal I/O. The external input signal I/O is at a low level ("0" state), so that the common source line CS is connected to the write Vcc voltage and the common data line CD is connected to the ground potential Vss. At this time, the selected data line is connected to the common data line CD (ground potential) by the row address decoder YDCR whereas the non-selected data line is opened. In connection of the word lines, the Vpp voltage is applied to the selected word line by the line address decoder XDCR, whereas the non-selected word line is maintained at a ground potential. In this manner, hot electron writing is carried out at a memory cell located at an intersection between the selected data line and the selected word line.

While in the present embodiment, the external input signal I/O and NOR output of $\overline{wr}$ are present in both switch MOS transistors Q51' and Q52', it is to be noted that an inverted signal of $\overline{wr}$ is merely inputted into either one.

Figure 49:
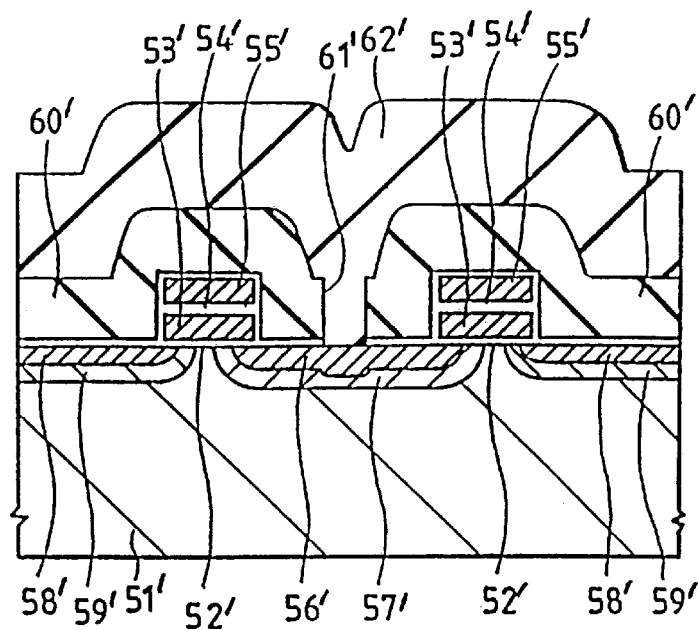
FIG. 49 is a sectional view (taken on A–A' of FIG. 34) of two bit portions of FAST type memory cell used in the embodiment shown in FIG. 23.
Figure 50:
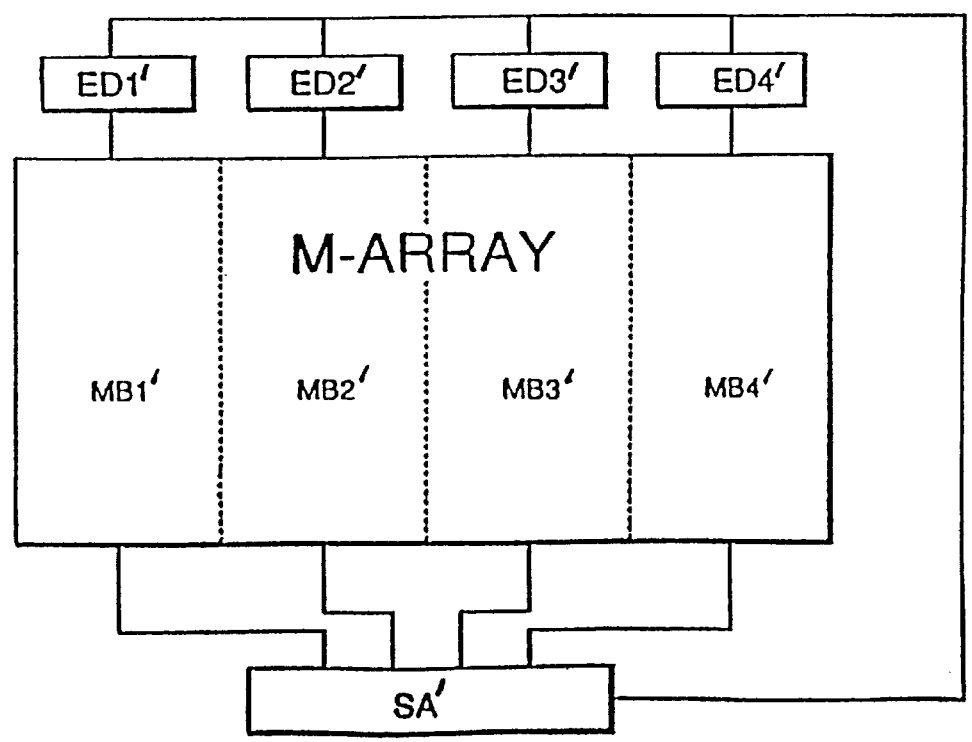
FIGS. 50 and 51 are block diagrams of a semiconductor memory device for explaining the principle of the present invention.
Figure 51:
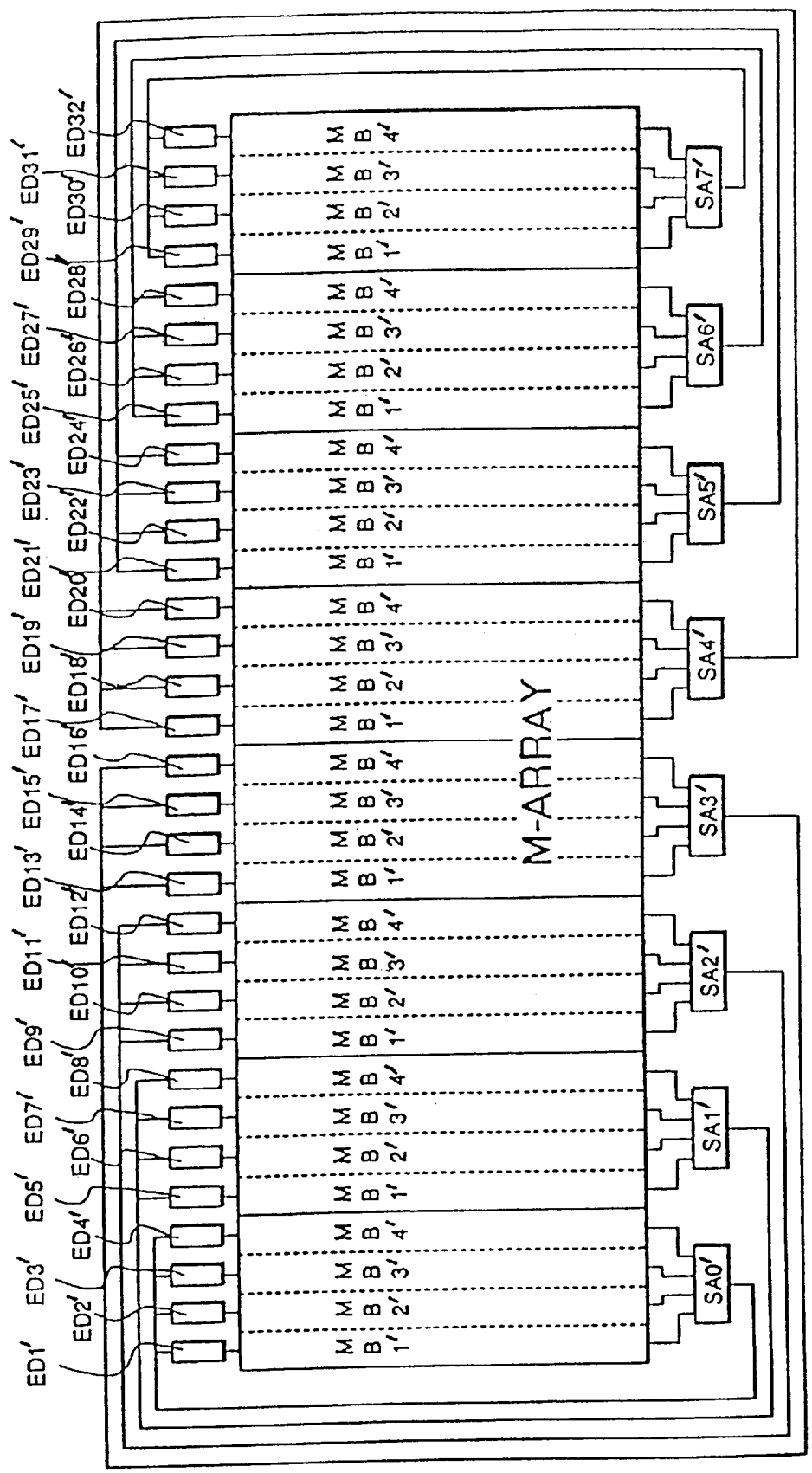

FIG. 49 is a sectional view of 2 bit portions of the FAST type memory cell used in the present embodiment.

In FIG. 49, reference numeral 51' designates a p-type semiconductor substrate; 52' a thin gate oxide film (tunnel oxide film) formed on the main surface side of the p-type semiconductor susbstrate; 53' a floating gate electrode; 54' a first interlaminar oxide film; 55' a control gate electrode, 56' an $n^+$-type semiconductor region (a part of the drain region); 57' an n-type semiconductor region (a part of the drain region); 58' an $n^+$-type semiconductor region (source region); 59' a $p^+$ type semiconductor region (source shield layer); 60' a second interlaminar oxide film; 61' a contact hole; and 62' a data line formed of aluminum.

Since in this embodiment, writing is carried out from the source side and erasure is carried out from the drain side, this embodiment is different from the case of the FIGS. 33 to 46 embodiments in that the source junction is of the electric field concentrated type of n+/p+, and the drain is of the electric field relaxed type of n+/n/p.

Figure 52:
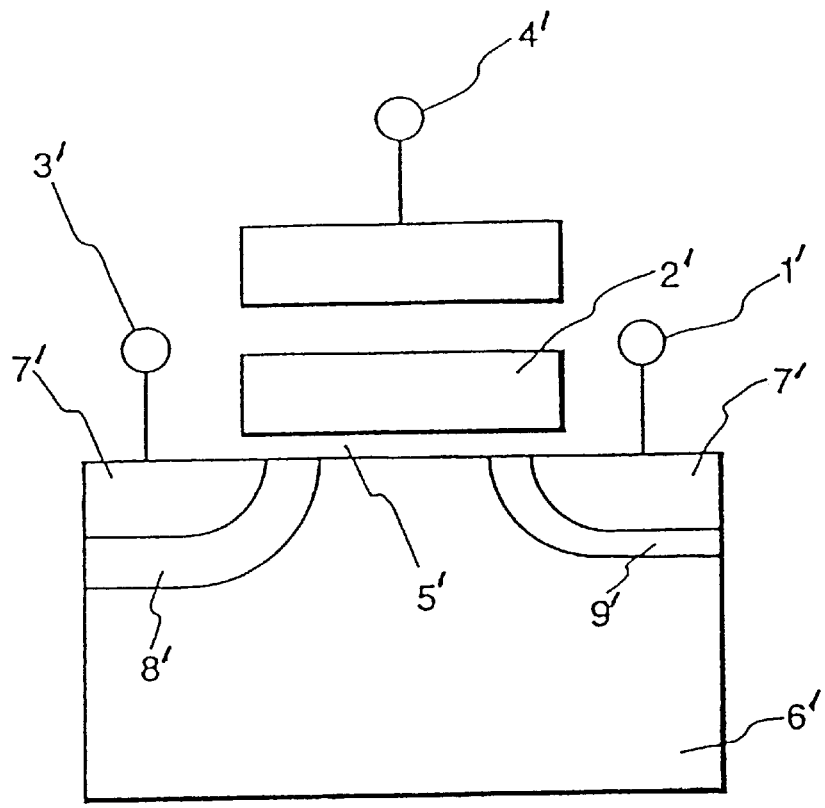
FIG. 52 is a sectional view of a semiconductor element constituting a memory cell.

Another embodiment of this aspect of the present invention will be described hereinafter with reference to FIGS. 53 to 60. It is assumed in the present embodiment that one shown in FIG. 52 is used as a memory cell. That is, erasure is carried out by grounding the gate and applying a high voltage to the source.

Circuit elements shown are not particularly limited but they are formed on a semiconductor substrate such as a single crystal silicon by the technique for producing a known CMOS (complementary type MOS).

Although not particularly limited, an integrated circuit is formed on a semiconductor substrate formed of single crystal p-type silicon. An n-channel MOSFET is composed of a source region, a drain region and a gate electrode formed of polysilicon formed through a thin gate insulating film on a semiconductor substrate between the source region and the drain region.

The p-channel MOSFET is formed on an n-type well region formed on the surface of the semiconductor substrate. Thereby, the semiconductor substrate constitutes a common substrate gate for a plurality of n-channel MOSFETs formed thereon, to which is suppled a ground potential of the circuit. The common substrate gate for the p-channel MOSFETs, that is, the n-type well region, is connected to the power source voltage Vcc. Or if it is a high voltage circuit, it is connected to the high voltage Vpp, the internal produced high voltage and the like. Or the integrated circuit may be formed on the semiconductor substrate formed of a single crystal n-type silicon. In this case, the n-channel MOSFETs are formed on the p-type well region.

Although not particularly limited, in an EEPROM according to the present embodiment, a complementary address signal formed through an address buffer ADB which receives address signals AX and AY supplied from the external terminals is supplied to address decoders XDCR and YDCR. Although not particularly limited, the address buffers ADB and YADB are activated by an internal chip selecting signal $\overline{ce}$ to receive the address signals AX and AY from the external terminals to form a complementary address signal comprising an internal address signal having the same phase as that of an address signal supplied from the external terminal and an address signal having a phase reversed thereto.

The line address decoder XDCR is activated by an address decoder activating signal DE to form a selecting signal of the word line of the memory array M-ARRAY in accordance with the complementary address signal of the address buffer XADB.

The row address decoder YDCR is activated by an address decoder activating DE to form a selecting signal for the data lines D1' to D4' of the memory array M-ARRAY in accordance with the complementary address signal of the address buffer ADB.

As the memory array M-ARRAY, two memory blocks MB1' and MB2' are typically illustrated. The memory block MB1' is composed of memory cells M1' to M8', word lines W1' to W4' and data lines D1' to D2'. The memory block MB2' is composed of memory cells M9' to M16', word lines W1' to W4' and data lines D3' to D4'.

In the memory block, gates of the memory cells arranged on the same line are connected to the corresponding word lines, and drains of the memory cells arranged on the same row are connected to the corresponding data lines. Sources of the memory cells are coupled to source lines CS1' and CS2'. In this embodiment, the source lines CS1' and CS2' are provided with erasure control circuits ED1' and ED2', respectively.

Although not particularly limited, 8 sets or 16 sets of the memory arrays are provided for carrying out the write/read in 8 bit or 16 bit unit.

The data lines D1' to D4' constituting one memory array M-ARRAY are connected to a common data line CD through row selecting switch MOSFETs Q1' to Q4', which receive a selecting signal formed by the address decoder YDCR. An output terminal of a writing data input buffer DIB which receives a write signal inputted from an external terminal I/O is connected to the common data line CD through MOSFET Q5' which is turned on during writing. Similarly, the other memory array is also provided with a row selecting switch MOSFET similar to the former, and a selecting signal is formed by an address decoder corresponding thereto.

A sense amplifier SA is coupled through a switch MOSFET Q6' to the common data line CD provided corresponding to the memory array M-ARRAY.

Figure 54:
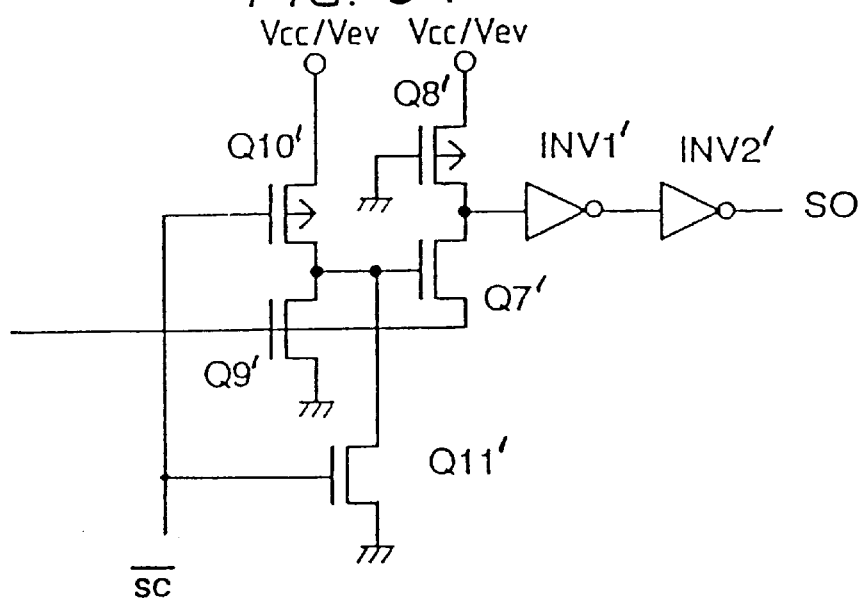
FIGS. 54, 56(a)–(i), 57(a)–(c), 58, 59, 62, 63, 65 and 66 are partial circuit views of a semiconductor memory device according to the embodiment of the present invention.

FIG. 54 shows the circuit of the sense amplifier SA. The common data line CD is connected to a source of an n-channel type MOSFET Q7' through the MOSFET Q6' which is turned on by a read control signal re. Between the drain of the n-channel type MOSFET Q7' and the power source voltage terminal Vcc is provided a load MOSFET Q8' of the p-channel type, to which gate is applied a ground potential of the circuit. The load MOSFET Q8' is operative to flow a precharge current to the common data line CD for the read-out operation.

In order to increase the sensitivity of the MOSFET Q7' and to maintain a potential of the data line at a constant low voltage to prevent a weak write during the read-out, a potential of the common data line CD through the switch MOSFET Q6' is supplied to a gate of a drive MOSFET Q9' which is an input of an inverted amplification circuit comprising a drive MOSFET Q9' of the n-channel type and a load MOSFET Q10' of the p-channel type.

An output voltage of the inverted amplification circuit is supplied to a gate of the MOSFET Q7'. An n-channel type MOSFET Q11' is provided between the gate of the MOSFET Q7' and a ground potential point of the circuit in order to prevent a useless current consumption during non-operation of the sense amplifier. An operation timing signal $\overline{sc}$ of the sense amplifier is supplied to the MOSFET Q11' and the gate of the p-type MOSFET Q10'.

A timing control circuit CNTR is not particularly limited, but it produces a chip enable signal supplied to external terminals $\overline{CE}$, $\overline{OE}$, $\overline{WE}$, $\overline{EE}$ and Vp, an output enable signal, a write enable signal, an erase enable signal and a timing signal such as internal control signals $\overline{ce}$, $\overline{sc}$, etc. in accordance with the write/erase high voltage, and a read-out low voltage Vcc/write high voltage Vpp selectively supplied to the address decoder and the like. For example, assuming the relationship between the modes as in FIG. 55 and external signals, as the timing control circuit CNTR for realizing this, ones shown in FIGS. 56(a)–56(i) are contemplated as examples.

In the read-out mode, the internal signal $\overline{ce}$ is set to be a low level, DE and re a high level, and $\overline{sc}$ a low level. The address decoder circuits XDCR and YDCR are activated to select one word line and one data line. To the address decoder circuits XDCR and YDCR and the data input circuit DIB is supplied the low voltage Vcc as the working voltage thereof. The MOSFET Q10' is turned on and the MOSFET Q11' is turned off.

The memory cell is to have a high threshold value or a low threshold value with respect to a selected level of the word line in accordance with data written in advance. In the case of the off-state despite that the threshold value of the memory selected by each of the address decoders XDCR and YDCR is high and the word line is at the selected level, the common data line CD is set to be at a relatively high level by a supply of current from the MOSFET Q8' and Q7'. On the other hand, in the case where the selected memory cell is turned on by the word line selected level, the common data line CD is set to be at a relatively low level.

In this case, the high level of the common data line CD is limited to a relatively low potential because an output voltage at a relatively low level formed by the inverted amplification circuit is supplied to the gate of the MOSFET Q7'. On the other hand, the low level of the common data line CD is limited to a relatively high potential because an output voltage at a relatively high level formed by the inverted amplification circuit is supplied to the MOSFET Q7'.

The MOSFET Q7' for amplification is operative to amplify a gate ground type source input, and an output signal thereof is transmitted to a CMOS inverter circuit INV1'. This output signal is shaped in waveform by an inverter INV2'. A signal S0 will be a high level when the threshold value of the memory is high whereas it will be a low level when the threshold value thereof is low. The signal is amplified by the corresponding data output buffer DOB, though not particularly limited, and delivered from the external terminal I/O. This data output buffer DOB is controlled by data output buffer control signals D0, $\overline{D0}$. The signal D0 is at a high level in the read-out mode and the verify mode after writing to activate the data output buffer DOB to deliver data to the I/O terminal. A read-out circuit comprising a sense amplifier and a data output buffer similar to those mentioned above is also provided between the common data line corresponding to the other memory block and the external terminal.

In the write mode, the internal signal $\overline{ce}$ is set to be a low level, DE, wr and $\overline{sc}$ a high level and re and D0 a low level. The address decoder circuits XDCR and YDCR are activated to select one word line and one data line. To the address decoder circuits XDCR and YDCR and the data input circuit DIB is supplied the high voltage Vpp as the working voltage thereof. The MOSFET Q6' is turned off, and the data output buffer DOB and the sense amplifier are deactivated. The voltage of the word line to which writing takes place will be the high voltage Vpp. The data line to which is connected a memory cell so that electrons are injected into a floating gate is connected to the high voltage Vpp through the MOSFET Q5' and DIB. Thereby, writing is effected with respect to the memory cells. In the memory cells in the written state, electrons are accumulted on the floating gate thereof. The threshold voltage increases, and even if the word line is selected, a drain current does not flow. In the case where electrons are not injected, the voltage is low and when the word line is selected, a current flows. An input stage circuit similar to that shown above, and a write circuit comprising a data input buffer, are also provided between the common data line corresponding to the other memory block and the external terminal.

In the verify mode after writing, the same mode as the read-out mode assumes except that a high voltage is applied to the Vpp terminal. The working voltage which is switched from high voltage Vpp to Vcc is supplied to the address decoder circuits XDCR and YDCR and the data input circuit DIB. A user confirms if write is made or not.

In the write/erasure inhibit mode, each of the decoders is activated but a write/erasure high voltage is not supplied to each decoder.

Figure 53:
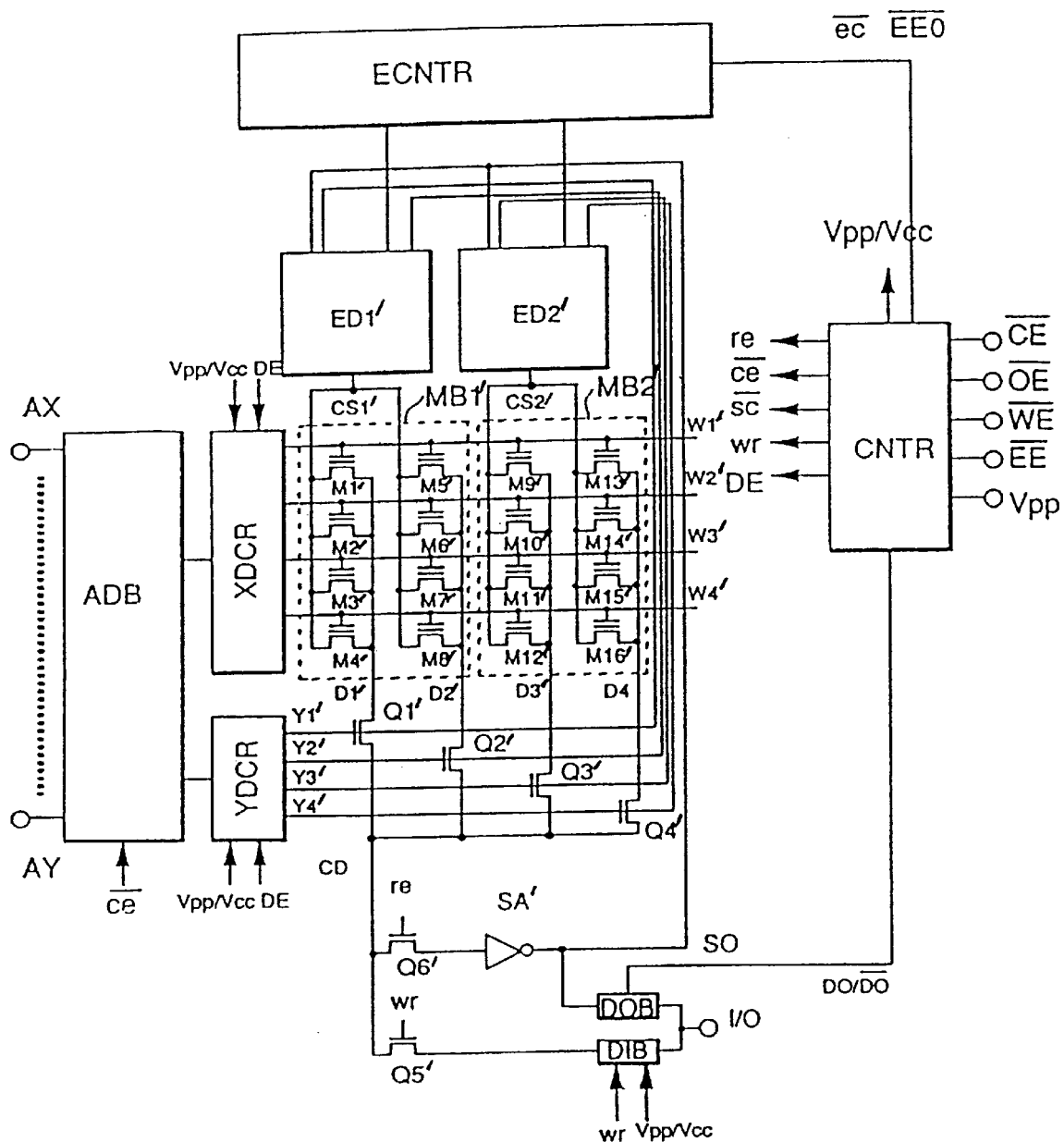
FIGS. 53, 61 and 64 are schematic circuit views of a semiconductor memory device according to an embodiment of the present invention.
Figure 56A:
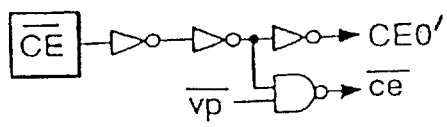
Figure 56B:
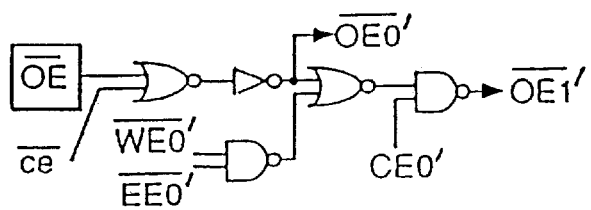
Figure 56C:
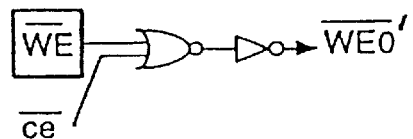
Figure 56D:
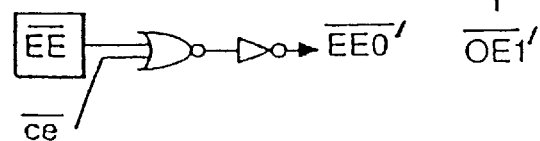
Figure 56E:
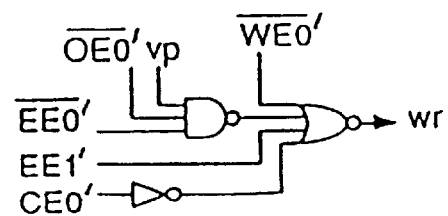
Figure 56F:
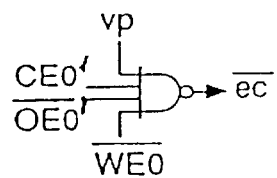
Figure 56G:
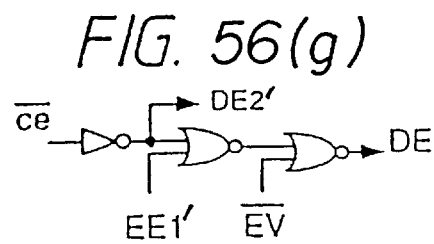
Figure 56H:
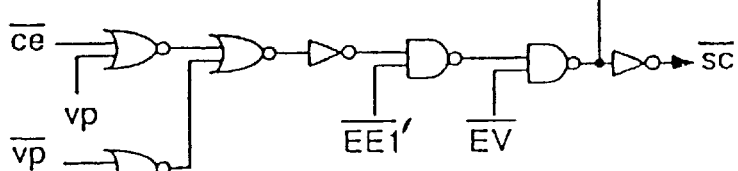
Figure 56I:
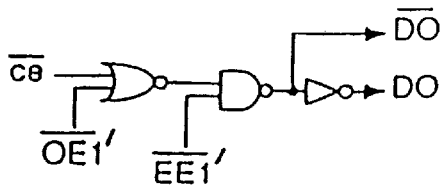
Figure 57A:
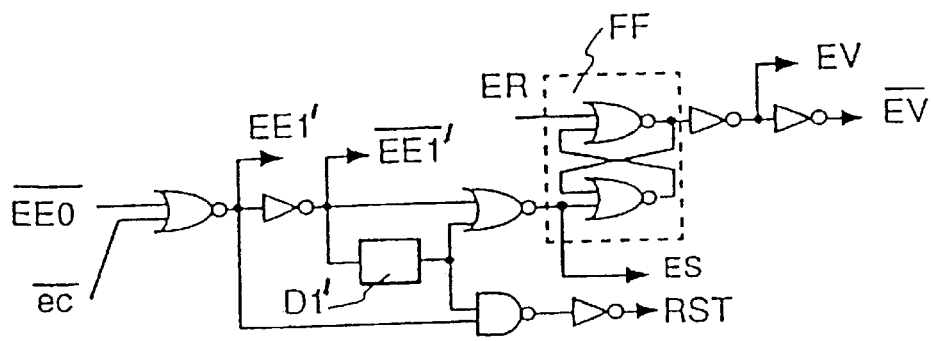
Figure 57B:
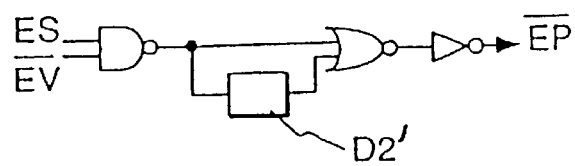
Figure 57C:
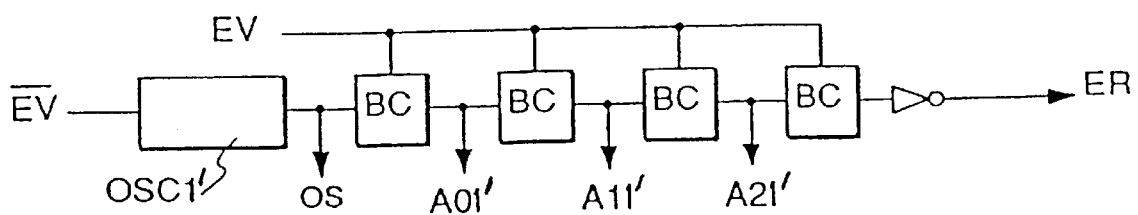
Figure 58:
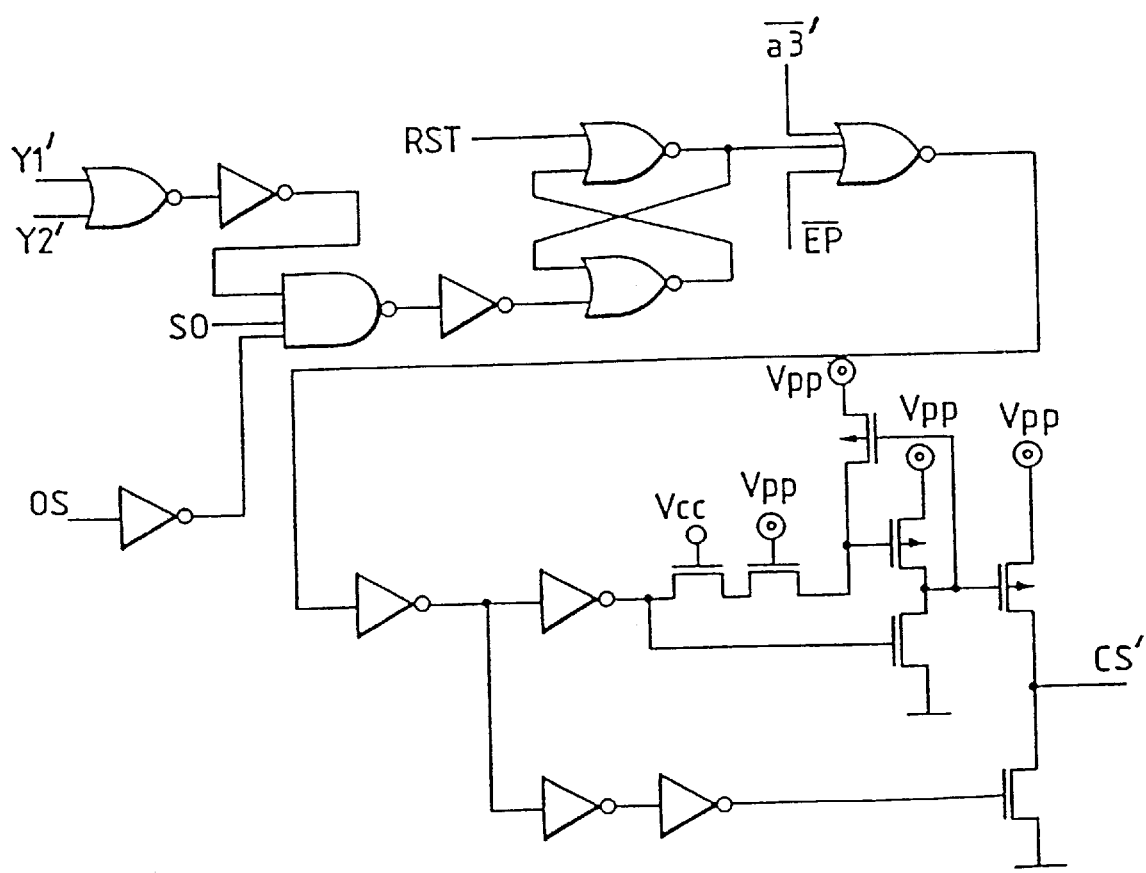
Figure 59:
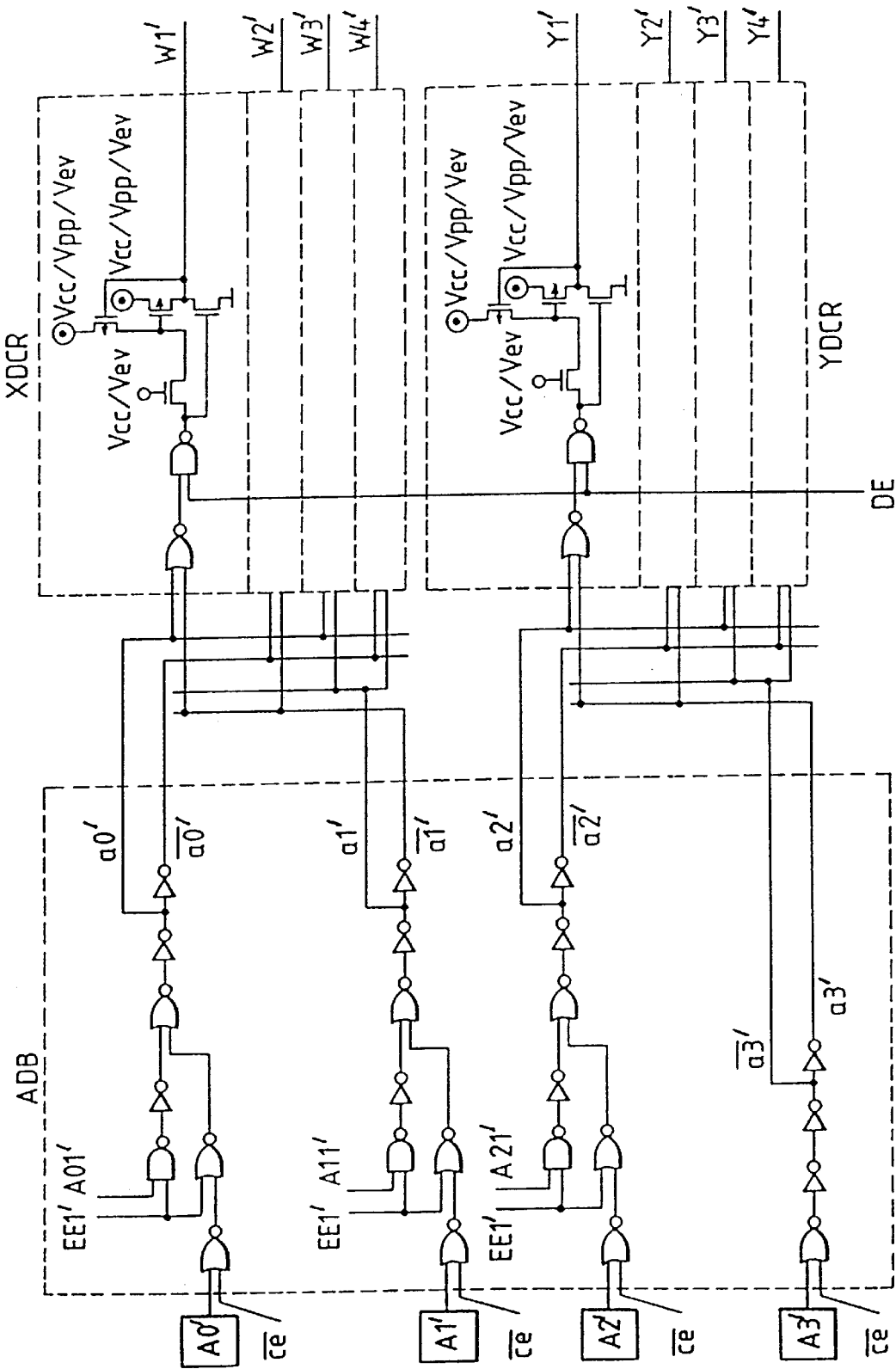
Figure 60:
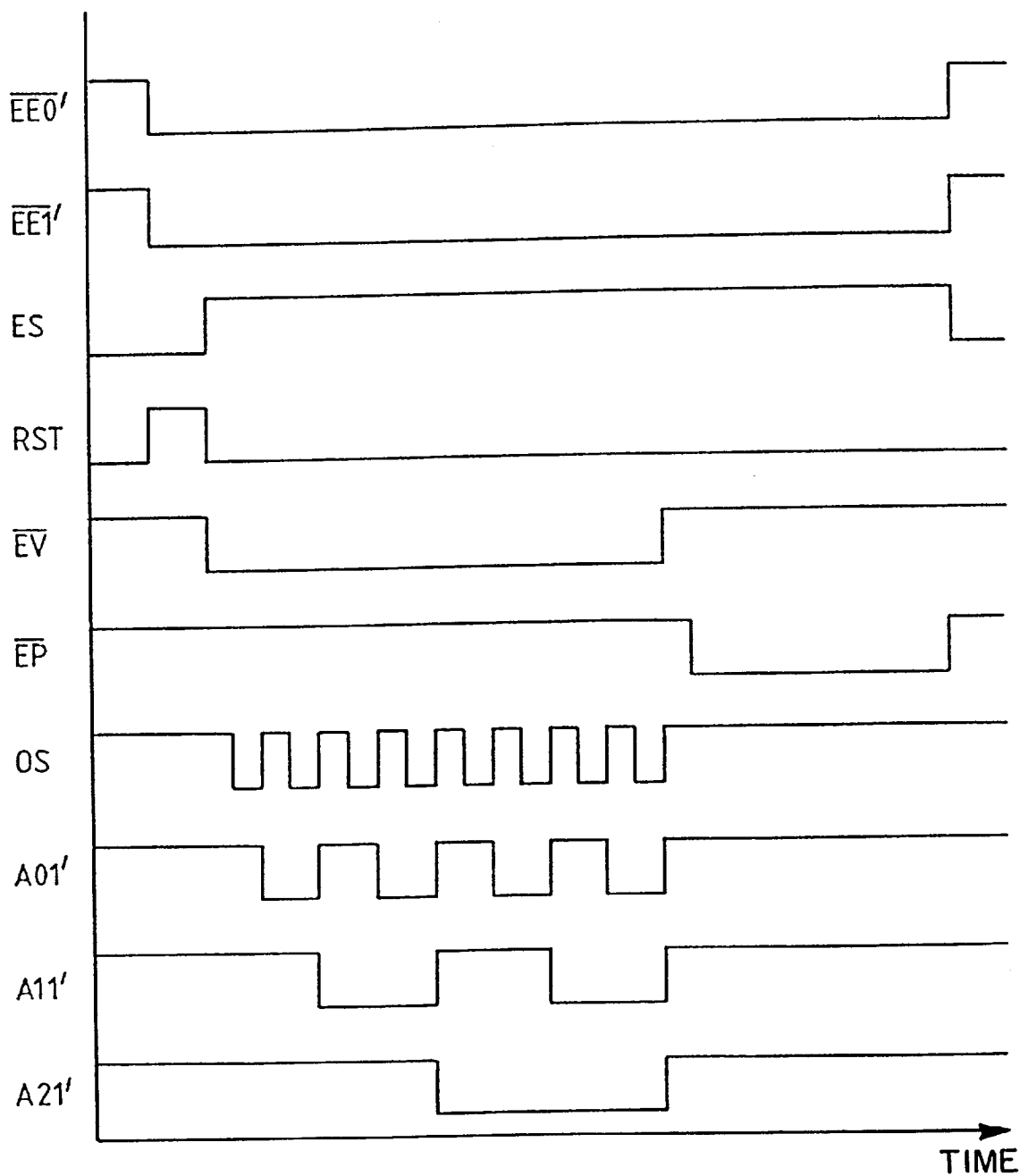
FIG. 60 is a working timing chart of a semiconductor memory device in an embodiment of the present invention.

The erasure mode will be described hereinafter with reference to FIGS. 57(a)–(c) and 58–60. FIGS. 57(a)–(c) show the erasure control circuit shown in FIG. 53 FIG. 58 shows the erasure voltage application circuit ED shown in FIG. 53, FIG. 59 shows an address buffer circuit ADB and decoder circuits XDCR and YDCR, and FIG. 60 is a timing chart for the erasure mode.

In the erasure mode, control signals DE, wr, re and D0 are set to be a low level, and sc a high level.

When EE0 is changed from a high level to a low level, the erasure mode starts. First, a reset pulse RST is at a high level for a period of time determined by a delay circuit D1' and an erasure voltage application circuit ED is reset. Next, a flip-flop circuit FF is set to read a block to be erased. During that period, a read mode signal EV prior to erasure is set to be a low level, and an oscillator OSC1' starts its oscillation to produce an internal address. Signals A0I, A1I and A2I sequentially divided by a binary counter BC are supplied to an address buffer ADB to select one word line and one row selecting switch. Since at that time, EE1' is at a high level, the address buffer ADB will not accept any input from the outside except an address signal A3'. The address signal A3' is applied from the outside and is used to select an internal block MB' or MB'.

When read-out takes place for the memory selected by the internal address, the result thereof is fed to the erasure voltage application circuit ED. As shown in FIG. 58, if judgement is made so that with respect to the memory block MB1', either of row selecting signals Y1' and Y2' is in a period of high level and when an oscillation pulse OS is at a high level, an output SO of the sense amplifier SA is at a high level, that is, the threshold voltage of the memory cell is high, then the flip-flop is set and even if an erasure pulse EP assumes a low level during a period of erasure which will be described later, a high voltage is not applied to a common source line CS1'. Upon completion of read-out with respect to all memory cells within the memory block, a read-out completion signal ER becomes a high level to reset the flip-flop FF and to set EV to a low level. Then, in the erasure period, after the passage of a period of time determined by the delay circuit D2', the erasure pulse EP will be a low level to render all the word lines at a low level. A high voltage is applied to sources of the memory which is not sufficiently erased.

In the case shown in FIG. 53, since the memory block is provided with only one erasure voltage application circuit ED, optimization is executed every I/O (memory array) wherein 8 sets or 16 sets are present. In the erasure of the whole chip, optimization is further executed for every memory block MB1' and MB2'.

In the above-described read-out, a voltage Vev, for example, 3.5V, lower than a normal read-out voltage (for example, 5V) is supplied to the sense amplifier SA and the decoder circuits XDCR and YDCR in order to secure a working power source voltage margin. This voltage is preferably generated interiorly of the memory system but may be applied from an external source.

Figure 67:
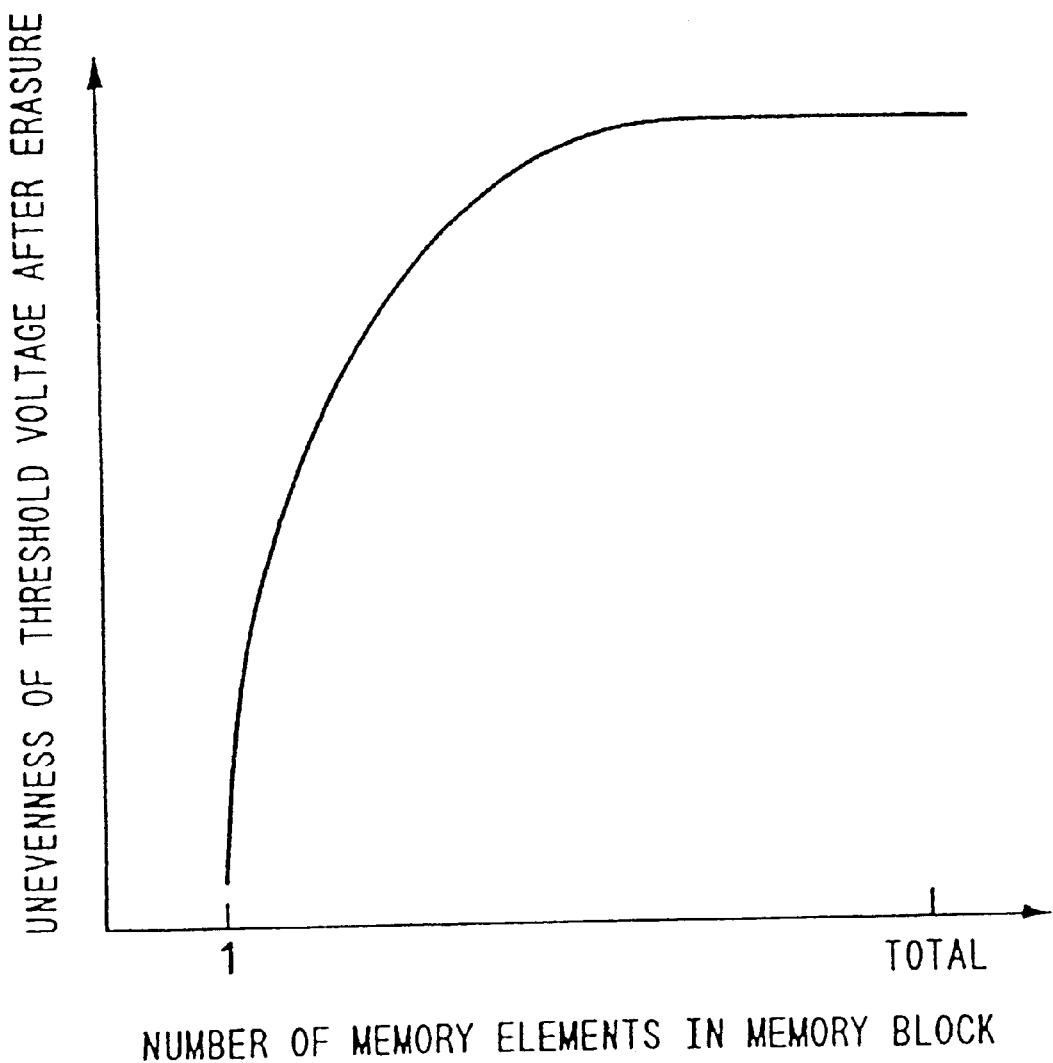
FIG. 67 is a graph showing the relationship between the number of memory elements within a memory block in the semiconductor memory device according to the embodiment of the present invention and unevenness of threshold values after erasure.

The effects of this aspect of the present invention are shown in FIG. 67. The axis of ordinate indicates the unevenness of threshold voltages within the system after erasure, and the axis of abscissa indicates the number of memory elements within one memory block. Here, 8 sets of memory arrays H-ARRAY are present within the system, and write/read in 8-bit unit are carried out. Needless to say, the smaller the memory elements within the memory block, the greater effect is obtained. However, peripheral circuits become complicated. The size of the memory block may be determined in consideration of balance between the restraining effect of unevenness of threshold voltages and the complication of peripheral circuits.

While in the present embodiment, the case has been shown where the read-out prior to erasure is carried out with respect to all memory cells in the memory block, it is to be noted that the present invention is not limited thereto. It is to be noted that in the case of the structure composed of 8 sets of read/write units, the read-out may be discontinued when a memory cell whose threshold voltage is high within all the read/write units is detected and the erasure operation is initiated. Thereby, read-out time prior to erasure can be shortened.

While in the present embodiment, the write/erasure is carried out using the high voltage Vpp from an external source, it is to be noted that the present invention is limited thereto. If a current flowing at the time of write erasure is low, the desired high voltage may be generated from Vcc within the system to use it for write/erasure. This internal step-up power source may be combined with the external high voltage Vpp.

The present invention is not limited to the above-described embodiment. Any structure of circuit portions for controlling normal write/read and circuit portions for controlling erasure may be employed as long as they can realize the above-described principle.

Another embodiment of the present invention will be described hereinafter with reference to FIGS. 61 to 63.

Figure 61:
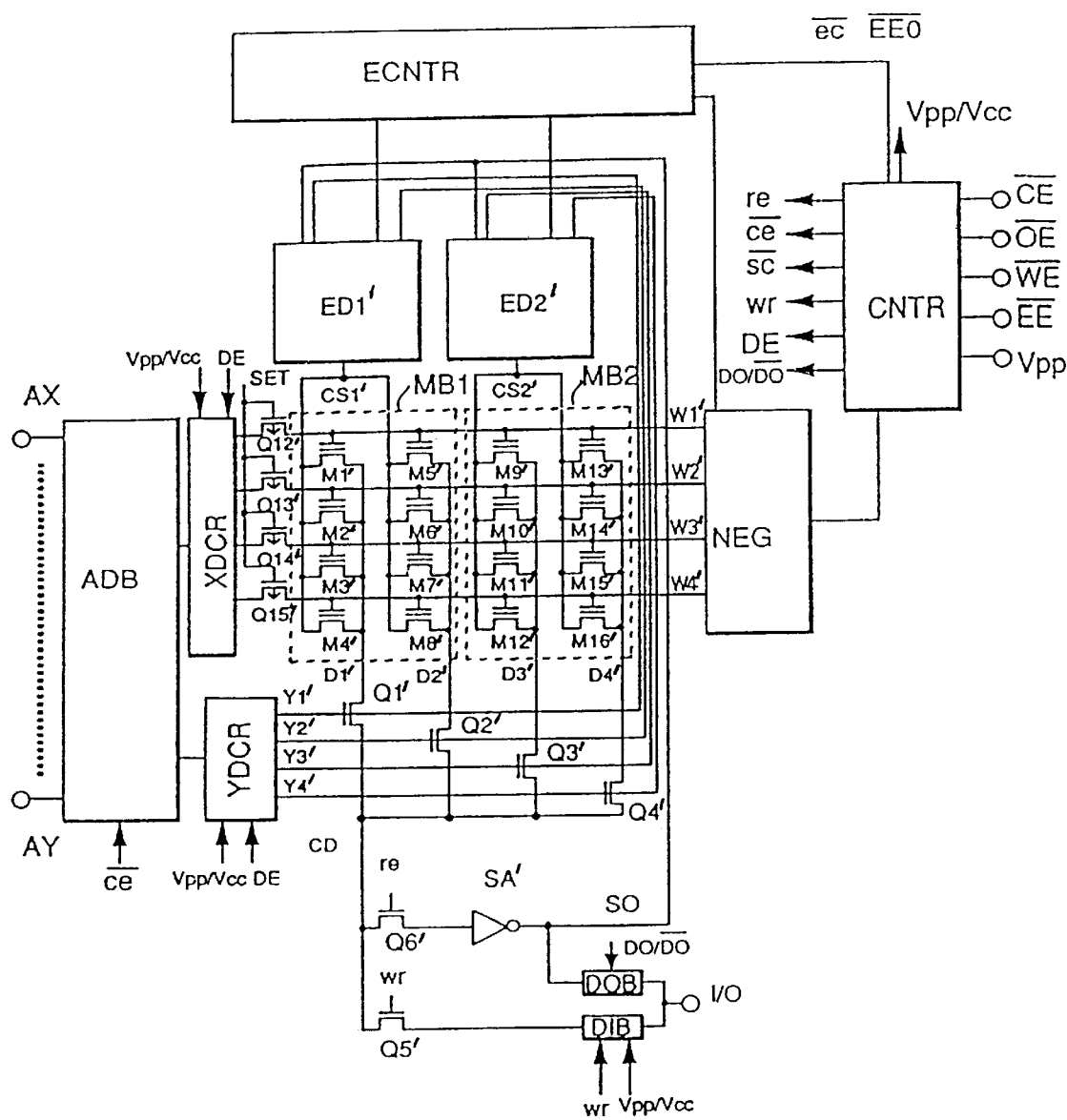

FIG. 61 is an internal block diagram of an nonvolatile memory device according to the present embodiment, which corresponds to FIG. 53 of the aforementioned embodiment. For memory cells, a memory is used which is of the device wherein a negative voltage is applied to a gate during erasure, a positive voltage (in this instance, Vcc as an external power source) is applied to a source, and electrons in a floating gate are drawn into the source by a high electric field between the gate and the source.

The present embodiment is not different in essential operation from that of the embodiment shown in FIG. 53, and only the difference from the aforementioned embodiment will be described.

Transistors Q12' to Q15' are depletion type pMOSFETs which function to prevent a negative voltage applied to a word line during erasure from being applied to a decoder circuit. At the same time, these pMOSFETs are of the depletion type for preventing a voltage drop and a lowering of speed in said transistors during read/write operation.

Figure 62:
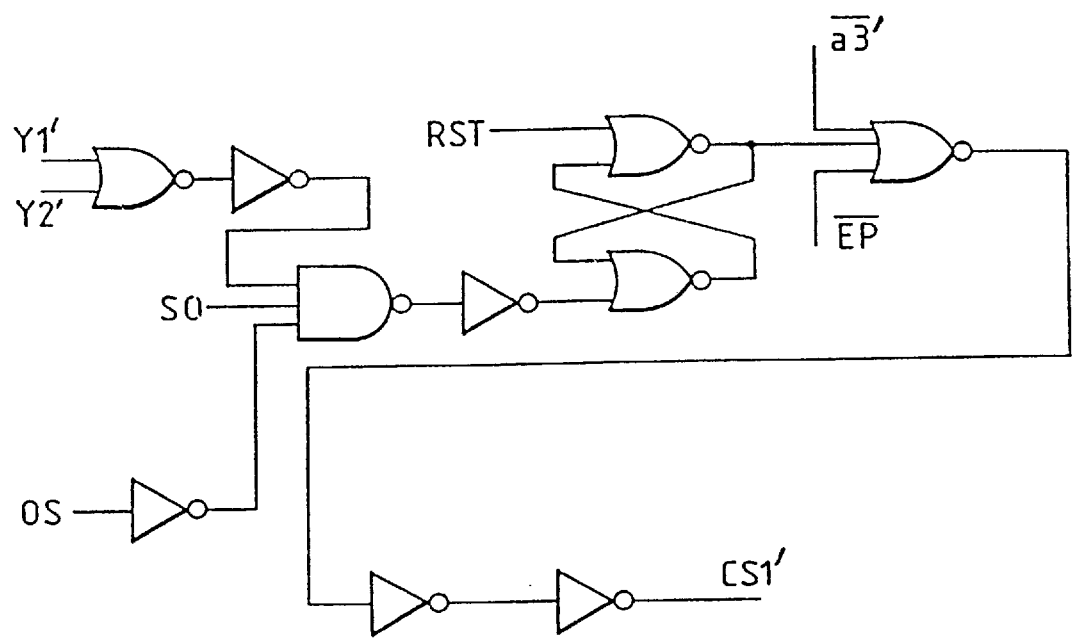

Erasure voltage application circuits ED1' and ED2' are the same as those of FIG. 58 except the final stage as shown in FIG. 62. While in FIG. 58, Vpp is applied to the common source line CS1, Vcc is applied in this embodiment.

Figure 63:
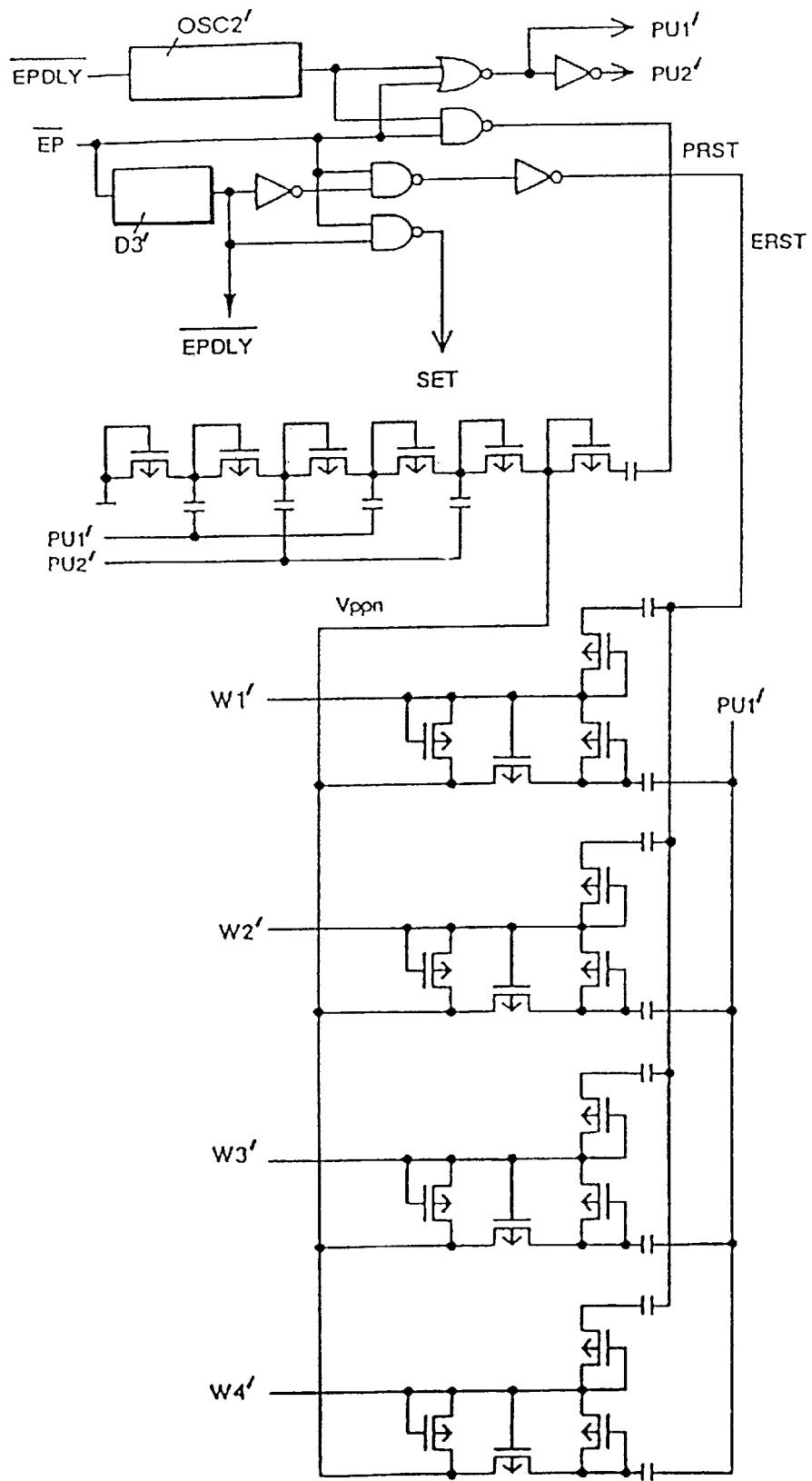

FIG. 63 shows a negative voltage application circuit NEG, which is a so-called charge pump circuit. When an erasure signal $\overline{EP}$ is set to be a low level, a signal $\overline{EPDLY}$ will be a low level, after the passage of time determined by a delay circuit D3', and a decoder disconnecting signal SET will be a low level. Thereby, a line decoder circuit XDCR is electrically disconnected from the word line. Next, an oscillator OSC2' starts its oscillation so that complementary pulse signals PU1' and PU2' are generated whereby a negative voltage Vppn is generated according to the principle of a charge pump. A negative voltage is applied to the word line in accordance with the principle of the charge pump using a pulse PU1'. When the erasure signal $\overline{EP}$ is set to be a high level, the pulses PU1' and PU2' stop. Negative voltage reset signals PRST and ERST cause a node of a negative potential to be 0 V or :positive voltage for a period till the signal $\overline{EPDLY}$ assumes a high level to stop the erasure.

The operation during the erasure mode in the present embodiment is executed in a manner similar to the case of the embodiment shown in FIG. 63. In the FIG. 63 embodiment, a high voltage is applied to the source for erasure. The FIG. 63 embodiment is different in that Vcc is applied to the source and the negative voltage applied to the gate.

Still another embodiment of the present invention will be described with reference to FIGS. 64 to 66.

Figure 64:
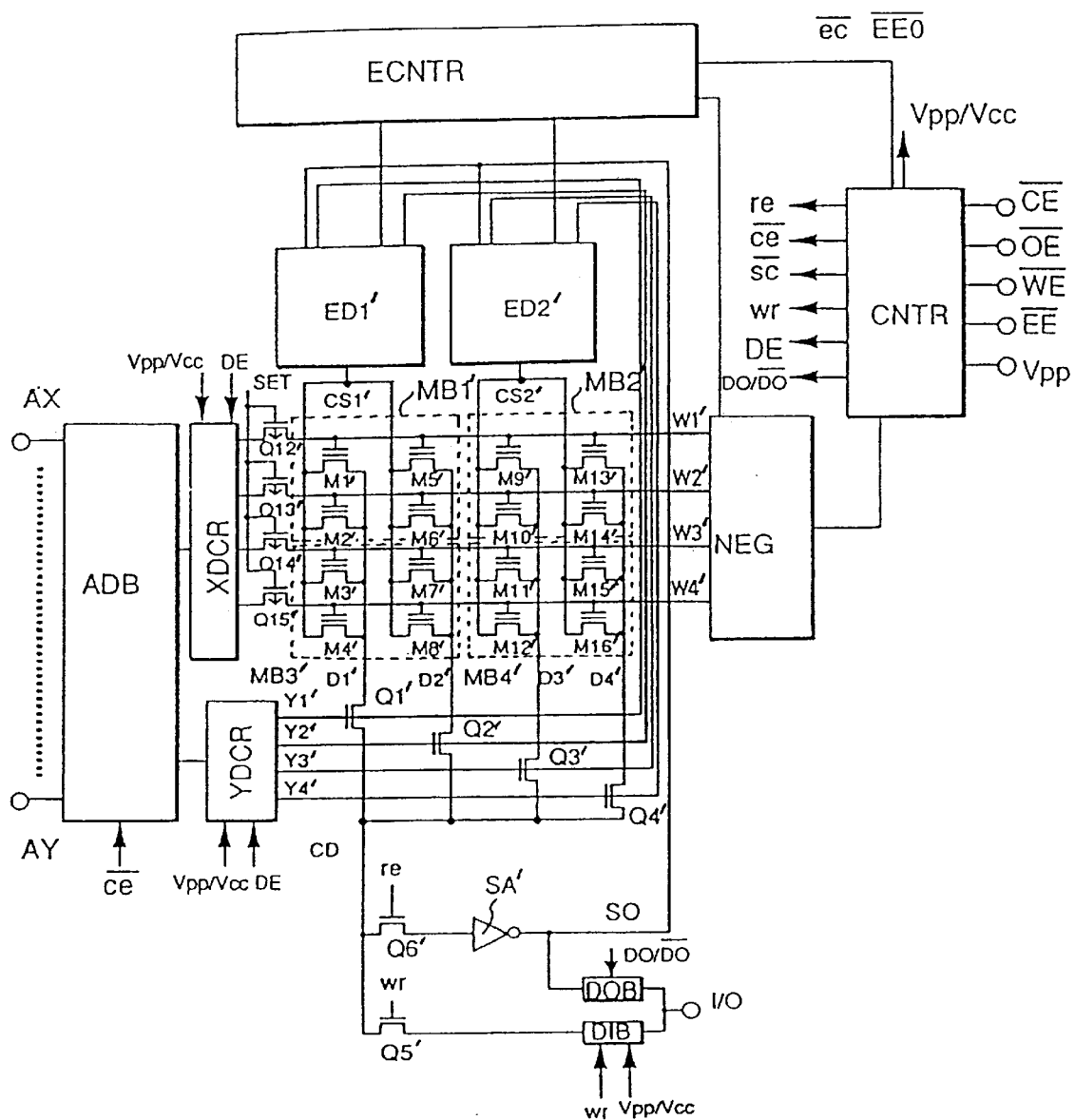

FIG. 64 is an internal block diagram of a nonvolatile memory device according to the present embodiment, which corresponds to FIGS. 53 and 61 showing the above-described embodiment. Similarly to the FIGS. 61 to 63 embodiments, for memory cells, a memory is used which is of the device wherein a negative voltage is applied to a gate during erasure, a positive voltage (in this instance, Vcc as an external power source) is applied to a source, and electrons in a floating gate are drawn into the source by a high electric field between the gate and the source.

The present embodiment is not different in essential operation from the FIGS. 61 to 63 embodiments but is different in that a memory block is determined by not only the source but the word line. Only the difference from the FIGS. 53 to 63 embodiments will be described hereinafter.

Figure 65:
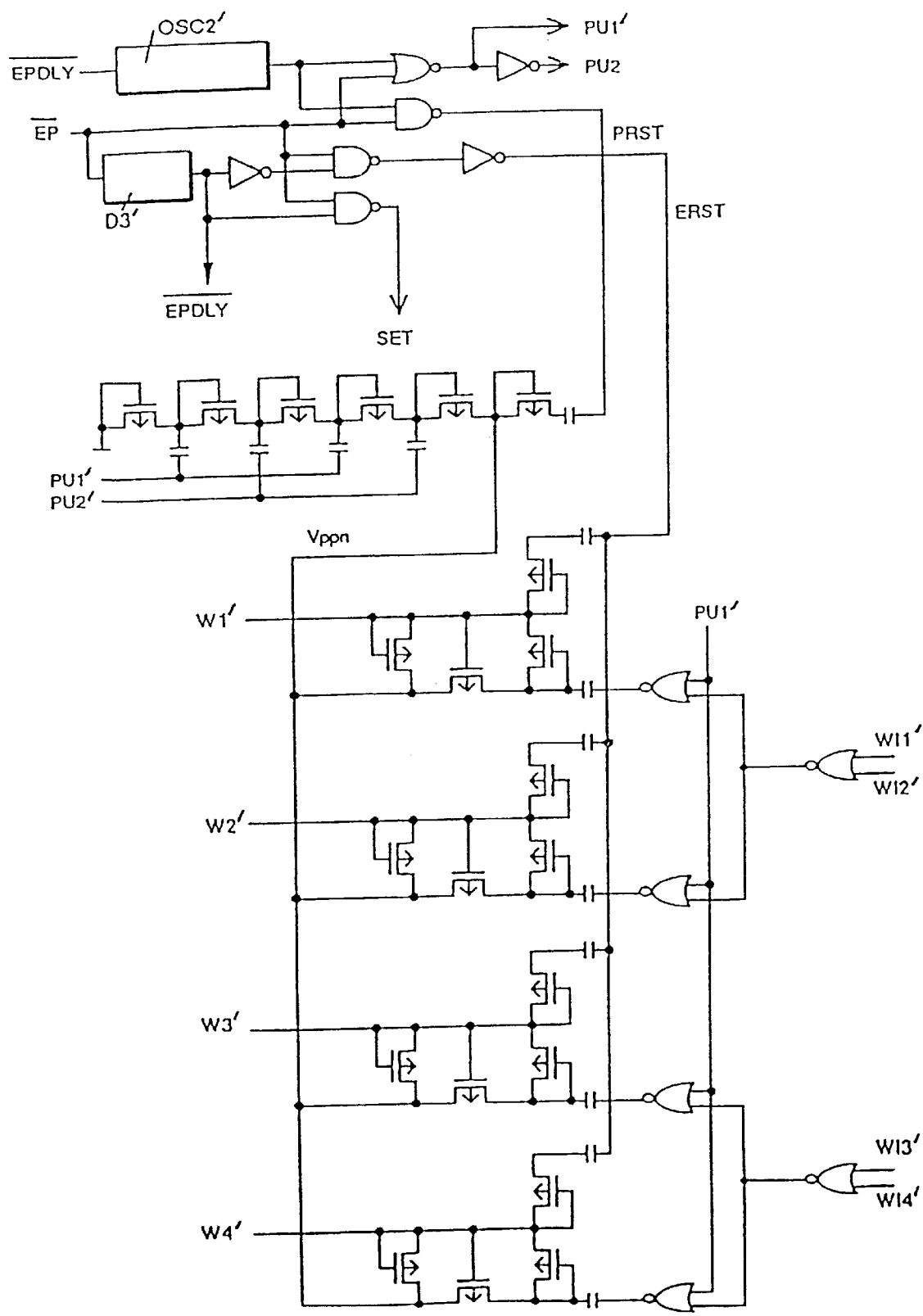

FIG. 65 shows a negative voltage application circuit NEG and is different from FIG. 63 in that a decoding function for selecting a memory block is encased.

Figure 66:
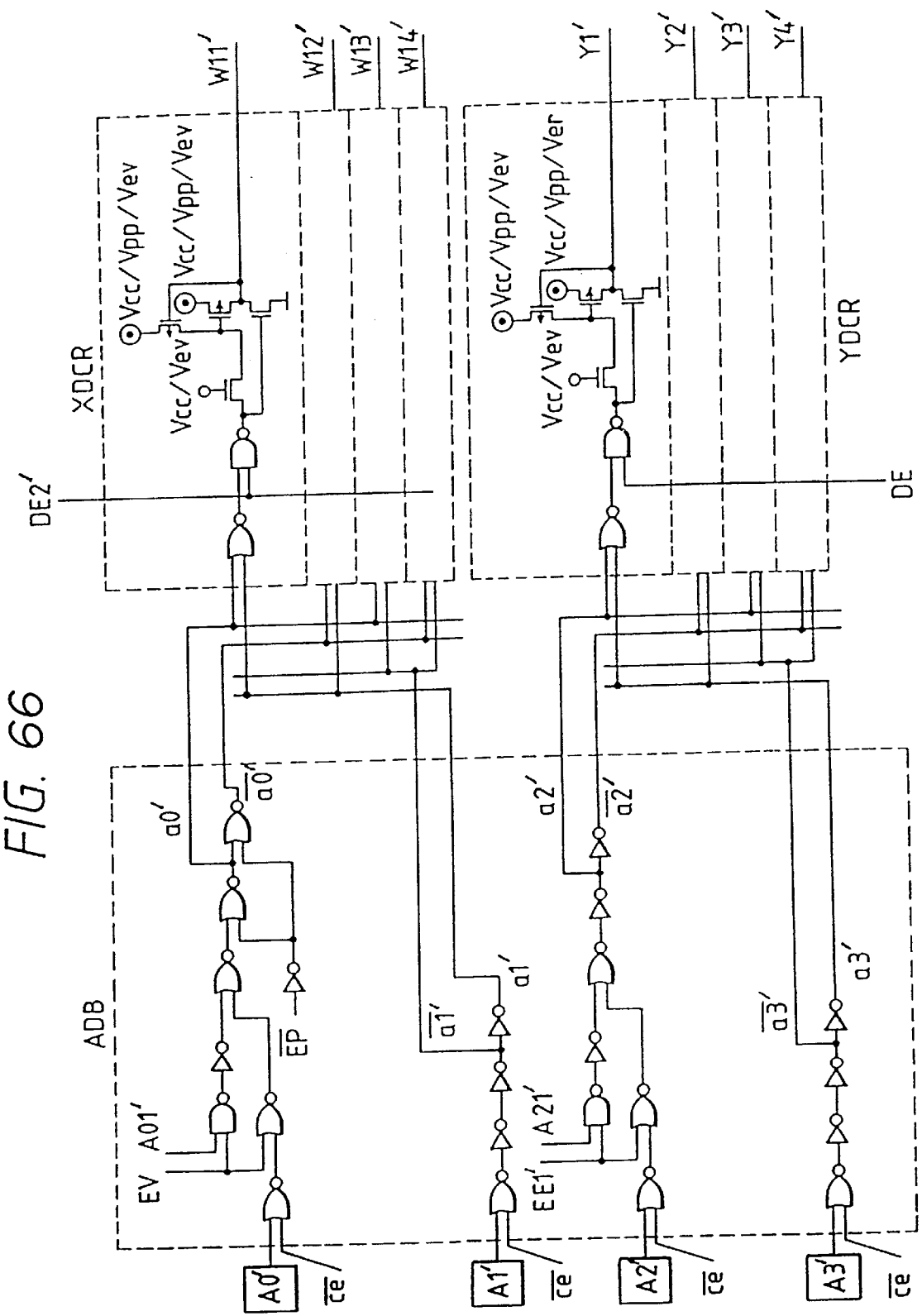

The address buffer circuit is different in that external inputs A1' and A3' are used to select blocks as shown in FIG. 66. Furthermore, an A0' input portion and a line decoder XDCR in the address buffer circuit ADB can select memory blocks even during application of erasure voltage in order to select a memory block in a word direction, that is, to select memory blocks MB1', MB3' and MB2', MB4'. That is, both a0' and $\overline{a0}$ will be a low level, and two word outputs WI1' and WI2' or WI3' and WI4' determined by an A1' address input will be a high level. These outputs WI1' to WI4' are supplied to the negative voltage application circuit NEG. Output of the decoder circuit is not applied to the word lines W1' to W4' during erasure by the function of transistors Q12' to Q15'.

The operation during erasure in the present embodiment is executed in a manner similar to the case of the FIGS. 61 to 63 embodiments. However, the binary counters BC in FIG. 57 may be eliminated by one stage with respect to the FIG. 61 embodiment.

Some of the main featured aspects of the disclosed invention, namely, a nonvolatile semiconductor memory device which device can be employed in an information processing system such as a microcomputer system, described in detail earlier in this specification in conjunction with the related figures shown in the drawings, are enumerated hereinbelow.

I. A nonvolatile semiconductor memory device provided with an electrically erasable nonvolatile memory cell constituted by a MOSFET having a two-layer construction comprising a floating gate and a control gate, characterized in that the control gate of said MOSFET is provided with a negative voltage generation circuit for applying a negative voltage to the control gate and a low voltage generation circuit for applying a low voltage to the drain electrode of said MOSFET.

II. A nonvolatile semiconductor memory device including, as a memory cell, one element of a MISFET comprising a gate insulating film whose thickness is substantially constant provided on the surface of a semiconductor substrate, a floating gate electrode provided on said gate insulating film, a control gate electrode formed on said floating gate electrode through an interlaminar insulating film, a source region and a drain region separated from each other within the semiconductor substrate and having a portion superposed on said floating gate electrode with said gate insulating film sandwiched therebetween, and a channel region between said source region and said drain region, said memory device comprising a memory array in which a plurality of said memory elements are arranged in a matrix fashion, and being characterized by comprising, also, means wherein in carrying out electric erasure operation for removing charges held on said floating gate electrode outside, a first voltage having a polarity by which said region is back-biased to the semiconductor substrate is applied to either of the source region or drain region, means for applying a second voltage having a polarity different from that of said first voltage to a control gate electrode of said memory cell, and a voltage conversion circuit for supplying said second voltage.

III. A nonvolatile semiconductor memory device including, as a memory cell, one element of a MISFET comprising a gate insulating film whose thickness is substantially constant provided on the surface of a semiconductor substrate, a floating gate electrode provided on said gate insulating film, a control gate electrode formed on said floating gate electrode through an interlaminar insulating film, a source region and a drain region separated from each other within the semiconductor substrate and having a portion superposed on said floating gate electrode with said gate insulating film sandwiched therebetween, and a channel region between said source region and said drain region, said memory device comprising a memory array in which a plurality of said memory elements are arranged in a matrix fashion, and being characterized by comprising, also, means where in carrying out electric erasure operation for removing charges held on said floating gate electrode outside, a first voltage having a polarity by which said region is back-biased to the semiconductor substrate is applied to either of the source region or drain region, and means for applying a second voltage having a polarity different from that of said first voltage to a control gate electrode of said memory cell, wherein memory cells to which is electrically commonly connected the control gate electrode within said memory array simultaneously perform electric erasure operation.

IV. A nonvolatile semiconductor memory device according to the above-mentioned item (III), wherein in carrying Out said electric erasure operation, said memory array is divided, the control gate electrodes of the group of memory cells are made to be common within the individual division unit, and said second voltage applying means is provided.

V. A nonvolatile semiconductor memory device including, as a memory cell, one element of a MISFET comprising a gate insulating film whose thickness is substantially constant provided on the surface of a semiconductor substrate, a floating gate electrode provided on said gate insulating film, a control gate electrode formed on said floating gate electrode through an interlaminar insulating film, a source region and a drain region separated from each other within the semiconductor substrate and having a portion superposed on said floating gate electrode with said gate insulating film sandwiched therebetween, and a channel region between said source region and said drain region, said memory device comprising a memory array in which a plurality of said memory elements are arranged in a matrix fashion, and being characterized by comprising, also, means where in carrying out electric erasure operation for removing charges held on said floating gate electrode outside, a first voltage having a polarity by which said region is back-biased to the semiconductor substrate is applied to either of the source region or drain region, and means for applying a second voltage having a polarity different from that of said first voltage to a control gate electrode of said memory, wherein at least one data line and word line are selected out of a group of data lines for electrically making common either of the source region or drain region of the group of memory cells arranged on the same row of said memory array and a group of word lines for electrically making common the control gate electrodes of the group of memory cells arranged on the same line, and said first and second voltage applying means are provided.

VI. A nonvolatile semiconductor memory device according to the above-mentioned item (III), (IV) or (V), wherein a voltage conversion circuit for supplying said second voltage is provided.

VII. A nonvolatile semiconductor memory device according to the above-mentioned item (II), (III), (IV), (V) or (VI), wherein junction pressure withstanding between the region for applying said first voltage, among said source region and said drain region, and the semiconductor substrate is higher than that between the other region and the semiconductor substrate.

VIII. A nonvolatile semiconductor memory device according to the above-mentioned item (II), (III), (IV), (V) or (VI), wherein said region for applying the first voltage is formed from a diffusion layer comprising one kind of impurity.

IX. A nonvolatile semiconductor memory device according to the above-mentioned item (VIII), wherein said one kind of impurity comprises arsenic.

X. A nonvolatile semiconductor memory device comprising a memory array having a plurality of memory blocks arranged in a matrix fashion, said memory block having memory cells comprising one or more electrically erasable nonvolatile memory elements; means for carrying out electric erasure for every memory block; and an erasure control circuit for carrying out read-out operation of memory cells within each memory block prior to simultaneous erasure operation of one or more memory blocks in accordance with instruction of erasure operation from outside, and controlling continuation and stoppage of the erasure operation with respect to said memory block according to read-out information.

XI. A nonvolatile semiconductor memory device according to the above-mentioned item (X), wherein said memory cell comprises a MOSFET having a two-layer gate construction comprising a floating gate and a control gate, and information charges accumulated on the floating gate are drawn into a source, a drain or a well by utilizing a tunnel phenomenon whereby electric erasure is carried out.

XII. A nonvolatile semiconductor memory device according to the above-mentioned item (X), wherein said memory cell comprises a MOSFET having a two-layer gate construction comprising a floating gate and a control gate, and wherein a source or a drain is made in common within the memory block, a voltage is applied to the source or drain in the common form with the gate set to a ground potential, and information charges accumulated on the floating gate are drawn into a source, a drain or a well by utilizing a tunnel phenomenon whereby electric erasure is carried out.

XIII. A nonvolatile semiconductor memory device according to the above-mentioned item (X), wherein said memory cell comprises a MOSFET having a two-layer gate construction comprising a floating gate and a control gate, and wherein a source or a drain is made in common within the memory block, a negative voltage is applied to the gate, a voltage is applied to the source or drain in the common form, and information charges accumulated on the floating gate are drawn into a source, a drain or a well by utilizing a tunnel phenomenon whereby electric erasure is carried out.

XIV. A nonvolatile semiconductor memory device according to the above-mentioned item (X), wherein said memory cell comprises a MOSFET having a two-layer gate construction comprising a floating gate and a control gate, and wherein a source or a drain is made in common within the memory block, means is provided to apply a negative voltage to only the word line connected to the gate of the memory cell belonging to said memory block, a negative voltage is applied to said word line, a voltage is applied to a source or a drain in the common form, and information charges accumulated on the floating gate are drawn into a source, a drain or a well by utilizing a tunnel phenomenon whereby electric erasure is carried out.

XV. A nonvolatile semiconductor memory device according to the above-mentioned item (X), (XI), (XII), (XIII) or (XIV), wherein said erasure control circuit includes an address generation circuit for selecting memory cells.

XVI. A nonvolatile semiconductor memory device according to the above-mentioned item (X), (XI), (XII), (XIII), (XIV) or (XV), wherein the read-out operation of memory cells for controlling continuation and stoppage of erasure is carried out by setting a selected potential of the word line transmitted to the control gate and a feed voltage of the sense amplifier to a relatively low potential.

Effects obtained from typical ones among the inventions disclosed in the present application will be briefly explained below.

There is provided a semiconductor integrated circuit device having a semiconductor substrate provided with memory cells composed of a MOSFET of a two-layer gate construction comprising a floating gate and a control gate, wherein said semiconductor substrate is formed with a negative voltage generation circuit for applying a negative voltage to said control gate in emitting charges from said floating gate and formed with a low voltage generation circuit for applying a low voltage to a drain electrode of said MOSFET in emitting charges from said floating gate, whereby in emitting electrons from the floating gate, a potential of the voltage applied to the control gate is lower than a conventional GND potential. Accordingly, even if a potential of the voltage applied to the drain electrode is lower than that of the prior art by a lowered amount of the potential of the voltage applied to the drain electrode, a potential difference required for emission of electrons can be secured between the floating gate and the drain electrode. That is, in emitting electrons from the floating gate, the voltage applied to the drain electrode can be stepped down from that of the prior art, to improve reliability of the semiconductor integrated circuit device.

Furthermore, since the voltage applied to the drain electrode can be stepped down to a lower level than that of the prior art, the memory cell need not have a high pressure withstanding construction. Therefore, the memory cell can be decreased in size and the semiconductor integrated circuit device can be miniaturized.

Moreover, electric erasure by way of the Vcc single power source can be made, and there can be obtained the effect that a nonvolatile semiconductor memory device excellent in rewrite reliability and integration degree can be realized.

In addition, it is possible to realize an electrically rewritable nonvolatile memory cell which is small in consumption current during erasure operation and excellent in reliability.

The invention accomplished by the present inventors has been described in detail in connection with the various disclosed embodiments. However, the present invention should not be construed as being limited to the above-mentioned embodiments. Rather, the present invention can be realized by various obvious modifications thereof as well as by other embodiments which are within the scope of the appended claims.

address and to said data bus and formed on a semiconductor chip separate from said processor, said memory device comprising:

memory cells having threshold voltages which are changed from a first range toward a second range after receiving a predetermined voltage;

a control circuit which verifies whether or not the threshold voltages of said memory cells are in said second range after applying said predetermined voltage to said memory cells; and an output circuit which outputs an internal state to said processor according to a result of a verification of said control circuit, wherein said control circuit carries out both the changing of threshold voltages and said verification of threshold voltage changes independently of said processor.

2. A system according to claim 1, wherein said predetermined voltage is applied, under the control of said control circuit, to that one or more of said memory cells whose threshold voltages are determined to be outside of said second range.

3. A system according to claim 1, wherein said predetermined voltage is an erase voltage.

4. A system comprising a bus; a processor coupled to said bus; and a semiconductor nonvolatile memory device coupled to said bus and formed on a semiconductor chip separate from said processor said memory device comprising:

memory cells having threshold voltages which are changed from a first range toward a second range after receiving a predetermined voltage in a threshold voltage change operation;

a control circuit which includes a verify circuit verifying whether or not threshold voltages of memory cells are in said second range after applying said predetermined voltage to the memory cells, and which repeats said threshold voltage change operation when said threshold

TABLE

| | External | | | | | | Internal | | | | | | | | | | | |
|---|---|---|---|---|---|---|---|---|---|---|---|---|---|---|---|---|---|---|
| Mode | $\overline{CE}$ | $\overline{OE}$ | $\overline{WE}$ | $\overline{EE}$ | Vpp | I/O | VP | EV | SC | re | DE | WP | Wr | AED | DC | ES | POLM | PP |
| Non-select | H | * | * | * | Vcc | Hz | L | L | L | L | H | L | L | L | L | L | L | L |
| Read | L | L | H | H | Vcc | Output | L | L | H | H | H | L | L | L | L | L | L | L |
| Output disable | L | L | L | H | Vcc | Hz | L | L | H | H | H | L | L | L | L | L | L | L |
| | L | L | H | L | Vcc | Hz | L | L | H | H | H | L | L | L | L | L | L | L |
| | L | H | * | * | Vcc | Hz | L | L | H | H | H | L | L | L | L | L | L | L |
| Write | L | H | L | H | Vpp | Input | H | L | L | L | H | H | H | L | L | L | L | L |
| Write verify | L | L | H | H | Vpp | Output | H | L | H | H | H | L | L | L | L | L | L | L |
| Erase | L | H | H | L | Vpp | Hz | H | O | O | O | O | L | O | O | L | H | L | O |
| Data polling | L | L | H | L | Vpp | Output (I/O 7) | H | L | H | H | H | L | H | H | L | H | O | L |
| Write/erase inhibit | H | * | * | * | Vpp | Hz | H | L | L | L | H | L | L | L | L | L | L | L |
| | L | L | L | L | Vpp | Hz | H | L | L | L | H | L | L | L | L | L | L | L |
| | L | L | L | H | Vpp | Hz | H | L | L | L | H | L | L | L | L | L | L | L |
| | L | H | L | L | Vpp | Hz | H | L | L | L | H | L | L | L | L | L | L | L |
| | L | H | H | H | Vpp | Hz | H | L | L | L | H | L | L | L | L | L | L | L |

H = high level   L = low level   * = don't care   Hz = high impedance   Output = data output   Input = data input
O = variable level

We claim:

1. A system comprising an address bus; a data bus; a processor coupled to said address and to said data bus; and a semiconductor nonvolatile memory device coupled to said voltages of said memory cells are not in said second range until said threshold voltage change operation is performed a predetermined number of times; and an output circuit which outputs an internal state to said processor according to a result of a verification of said control circuit, wherein said control circuit carries out both the changing of threshold voltages and said verification of threshold voltage changes independently of said processor.

5. The system according to claim 4, wherein said internal state is outputted in response to a signal from said processor.

6. The system according to claim 4, wherein said threshold voltage change operation is forcibly terminated by said control circuit when said threshold voltages of the memory cells are not in said second range even after said threshold voltage change operation is performed a predetermined number of times.

7. The system according to claim 4, wherein said internal state is inclusive of a failure indication in said threshold voltage change operation.

8. A system comprising a bus; a microprocessor coupled to said bus; and a nonvolatile memory device coupled to said bus, said memory device being formed on a semiconductor chip which is separate from said microprocessor and comprising:

a plurality of storage elements each of which has a threshold voltage corresponding to data, wherein the threshold voltage of each of said plurality of memory cells is changed from a first range toward a second range by a threshold voltage change operation;

a control unit which performs a first control operation to execute said threshold voltage change operation and to execute a verify operation for verifying whether or not threshold voltages of a plurality of storage elements are in said second range after said threshold voltage change operation, and which performs a second control operation to execute said threshold voltage change operation again to said storage elements if it is detected, in said verify operation, that the threshold voltages of said storage elements are not in said second range; and an output circuit which outputs data relating to a result of said verify operations in response to a signal from said microprocessor, wherein said first and second control operations are carried out by said control circuit independently of said microprocessor.

9. The system according to claim 8, further comprising, terminals, coupled to said bus, and receiving an address signal from said microprocessor.

10. The system according to claim 8, wherein said signal from said microprocessor is a combination of control signals from said microprocessor.

11. The system according to claim 8, wherein said memory device is decoupled from said bus while executing said threshold voltage change operation and said verify operation.

12. The system according to claim 9, wherein said internal state is inclusive of a failure indication in said threshold voltage change operation.

* * * * *